United States Patent
Sugimachi et al.

(10) Patent No.: US 9,287,277 B2
(45) Date of Patent: Mar. 15, 2016

(54) SEMICONDUCTOR DEVICE AND FABRICATING METHOD THEREOF

(75) Inventors: Tatsuya Sugimachi, Tokyo (JP); Satoshi Torii, Tokyo (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 288 days.

(21) Appl. No.: 13/542,759

(22) Filed: Jul. 6, 2012

(65) Prior Publication Data

US 2012/0270373 A1 Oct. 25, 2012

Related U.S. Application Data

(62) Division of application No. 12/537,913, filed on Aug. 7, 2009, now Pat. No. 8,604,533.

(30) Foreign Application Priority Data

Aug. 8, 2008 (JP) .................................. 2008-205534

(51) Int. Cl.
| | |
|---|---|
| H01L 29/788 | (2006.01) |
| H01L 27/115 | (2006.01) |
| H01L 21/8234 | (2006.01) |
| G11C 16/04 | (2006.01) |
| H01L 29/66 | (2006.01) |

(52) U.S. Cl.
CPC ...... H01L 27/11521 (2013.01); G11C 16/0433 (2013.01); H01L 21/823468 (2013.01); H01L 27/11524 (2013.01); H01L 29/6656 (2013.01)

(58) Field of Classification Search
CPC .................. H01L 21/823468; H01L 29/6656; H01L 27/11524
See application file for complete search history.

(56) References Cited

U.S. PATENT DOCUMENTS

| 4,835,740 A | 5/1989 | Sato |
| 5,189,497 A | 2/1993 | Komori et al. |

(Continued)

FOREIGN PATENT DOCUMENTS

| JP | 61-127179 | 6/1986 |
| JP | H2-002162 | 1/1990 |

(Continued)

OTHER PUBLICATIONS

USPTO, Notice of Allowance and Fees Due, Aug. 30, 2013, in parent U.S. Appl. No. 12/537,913 [allowed].

(Continued)

*Primary Examiner* — Benjamin Sandvik
(74) *Attorney, Agent, or Firm* — Fujitsu Patent Center

(57) ABSTRACT

A semiconductor device includes: a memory cell transistor which has a floating gate, a control gate, and a source and a drain formed in a semiconductor substrate on both sides of the floating gate via a channel area; and a selecting transistor which has a select gate and a source and a drain formed in the semiconductor substrate on both sides of the select gate, wherein the source of the selecting transistor is connected to the drain of the memory cell transistor, the source of the memory cell transistor has an N-type first impurity diffusion layer, an N-type second impurity diffusion layer deeper than the first impurity diffusion layer, and an N-type third impurity diffusion layer which is shallower than the second impurity diffusion layer, and an impurity density of the second impurity diffusion layer is lower than that of the third impurity diffusion layer.

4 Claims, 57 Drawing Sheets

(56) References Cited

U.S. PATENT DOCUMENTS

| | | | |
|---|---|---|---|
| 5,366,915 A | 11/1994 | Kodama | |
| 6,169,307 B1 | 1/2001 | Takahashi et al. | |
| 6,377,490 B1 | 4/2002 | Takahashi et al. | |
| 6,432,762 B1 | 8/2002 | Libera et al. | |
| 6,445,617 B1 | 9/2002 | Sakakibara | |
| 6,617,632 B2 | 9/2003 | Taniguchi et al. | |
| 6,657,893 B2 | 12/2003 | Takahashi et al. | |
| 6,711,060 B2 | 3/2004 | Sakakibara | |
| 6,806,155 B1 * | 10/2004 | Ko et al. | 438/303 |
| 7,057,230 B2 | 6/2006 | Tanaka et al. | |
| 7,082,057 B2 | 7/2006 | Shibata et al. | |
| 7,433,232 B2 | 10/2008 | Geissler et al. | |
| 8,014,198 B2 | 9/2011 | Torii et al. | |
| 2005/0117443 A1 | 6/2005 | Park et al. | |
| 2007/0080390 A1 | 4/2007 | Geissler et al. | |
| 2008/0099852 A1 * | 5/2008 | Faul | 257/382 |

FOREIGN PATENT DOCUMENTS

| | | |
|---|---|---|
| JP | H7-094609 | 4/1995 |
| JP | H7-193148 | 7/1995 |
| JP | 9-237846 A | 9/1997 |
| JP | 11-177068 | 7/1999 |
| JP | 2000-306390 | 11/2000 |
| JP | 2004-349311 A | 12/2004 |
| JP | 2007-511084 | 4/2007 |
| WO | WO-2008/041613 A1 | 4/2008 |

OTHER PUBLICATIONS

Japanese Office Action mailed Jul. 16, 2013 for corresponding Japanese Application No. 2008-205534, with Partial English-language Translation.

USPTO, Notice of Allowance and Notice of Allowability, Apr. 10, 2012, in parent U.S. Appl. No. 12/537,913 [allowed].

USPTO, Non-Final Action, Oct. 7, 2011, in parent U.S. Appl. No. 12/537,913 [allowed].

USPTO, Restriction Requirement, May 2, 2011, in parent U.S. Appl. No. 12/537,913 [allowed].

* cited by examiner

FIG. 7

| | BIT LINE | SOURCE LINE | FIRST WORD LINE | SECOND WORD LINE | WELL |
|---|---|---|---|---|---|
| READ | Vcc (0V) | 0V (0V) | ALWAYS Vcc | Vcc (0V) | 0V |
| WRITE | 0V (F) | 5V (0V or F) | 9V (0V or F) | Vcc (F) | 0V |
| ERASE | FLOATING | FLOATING | −9V | FLOATING | +9V |

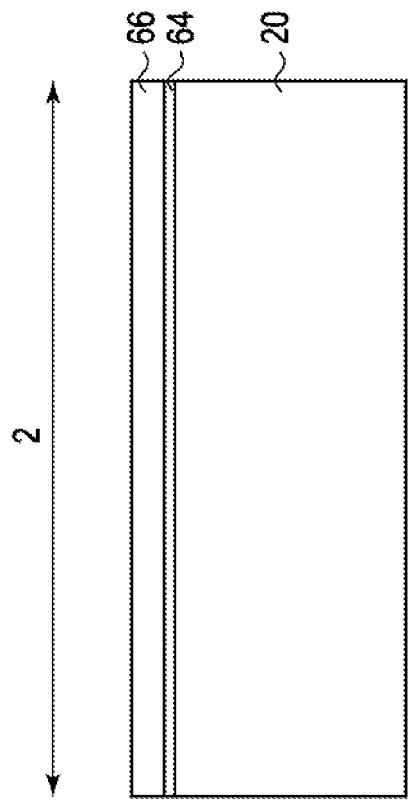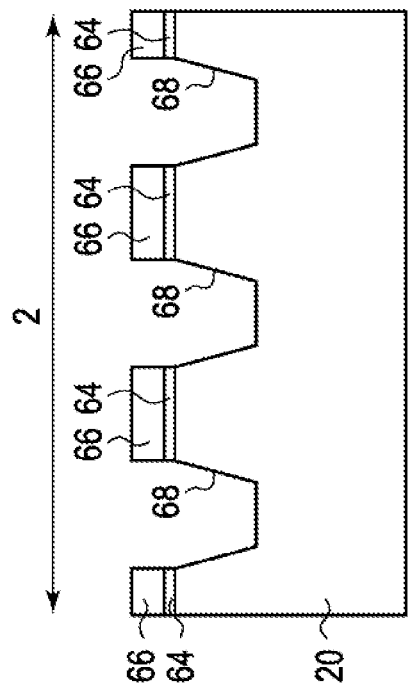

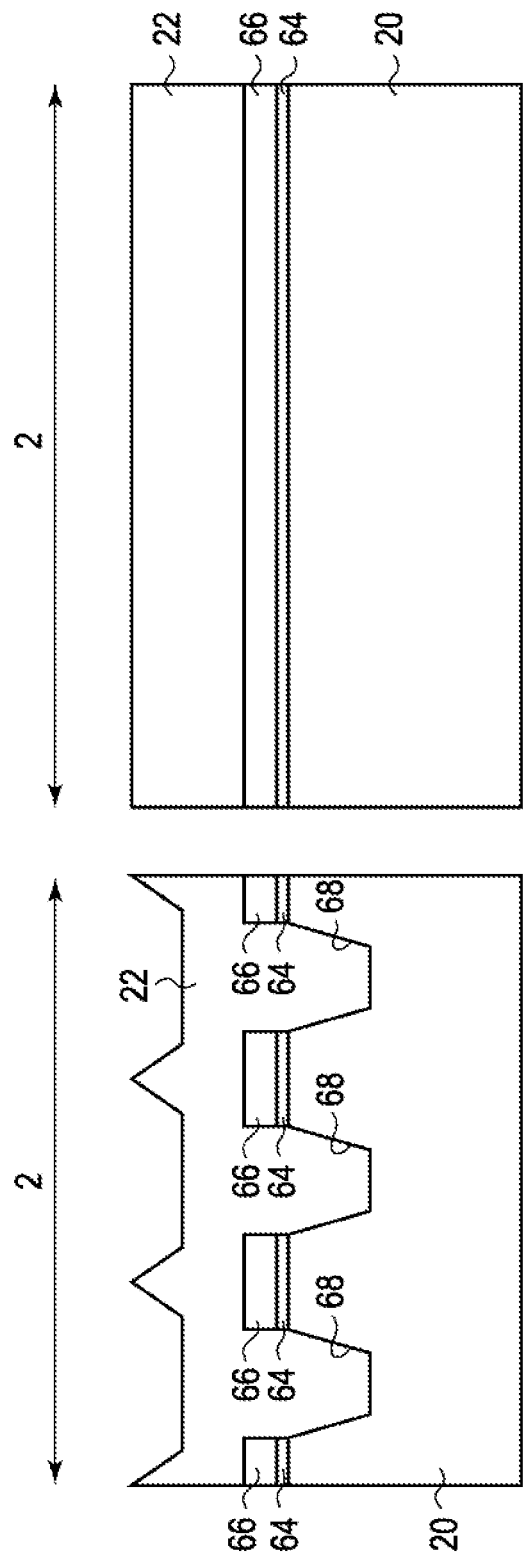

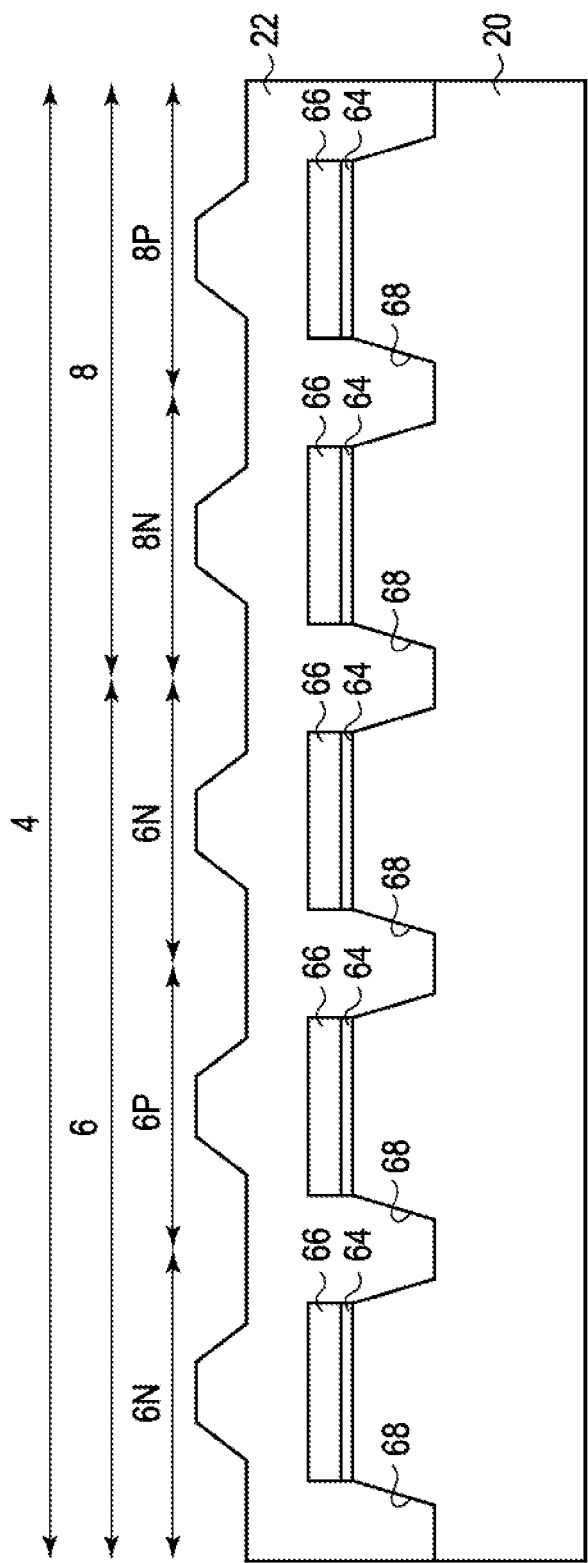

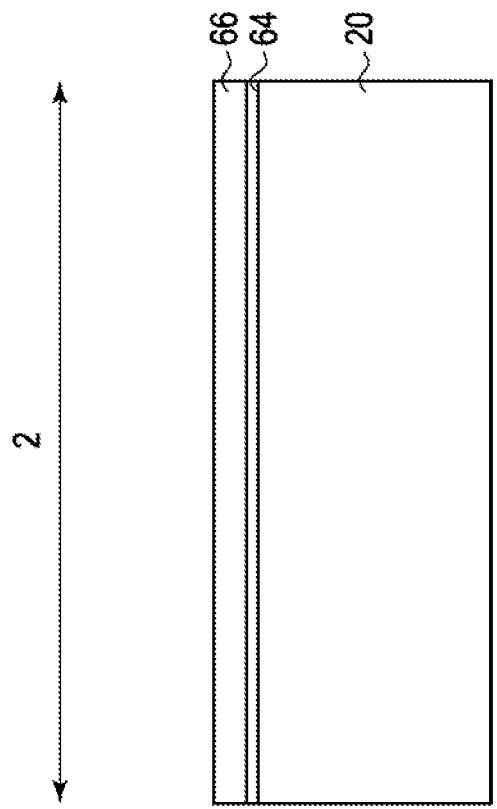
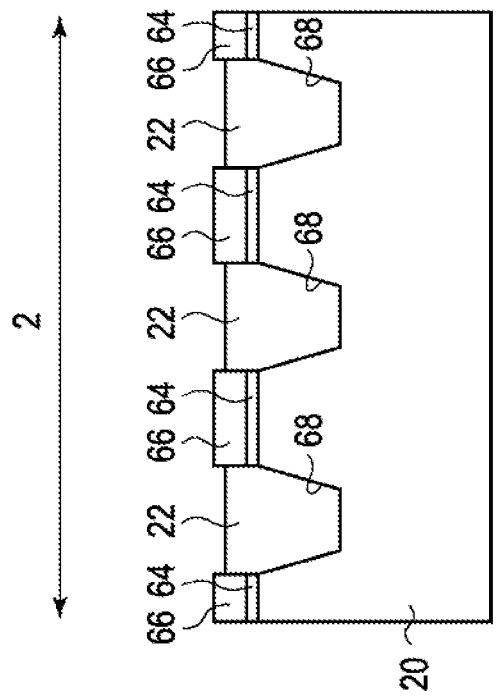

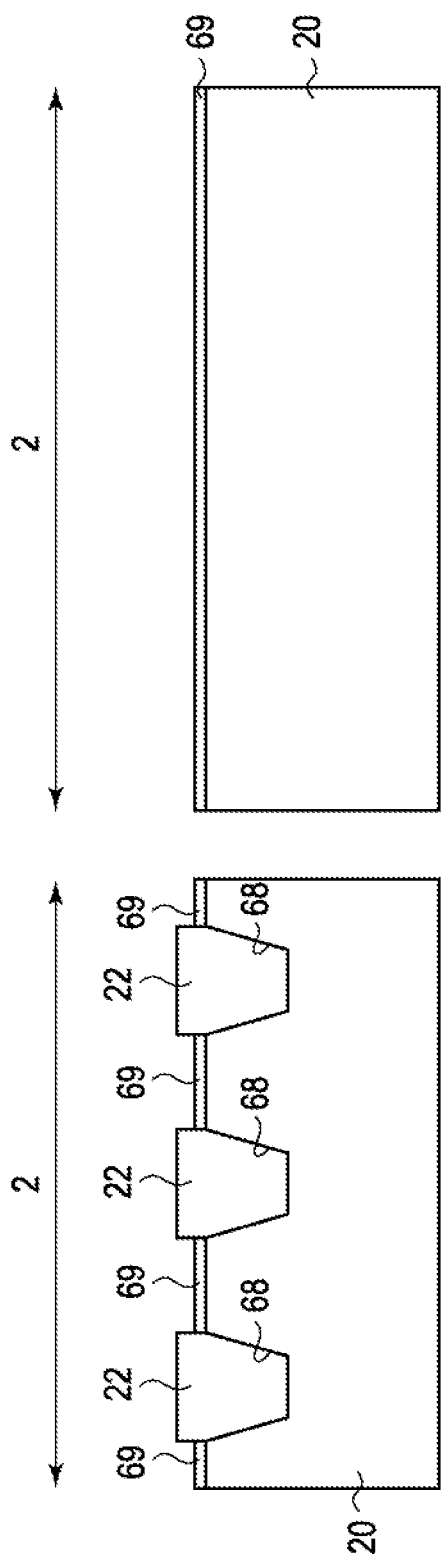

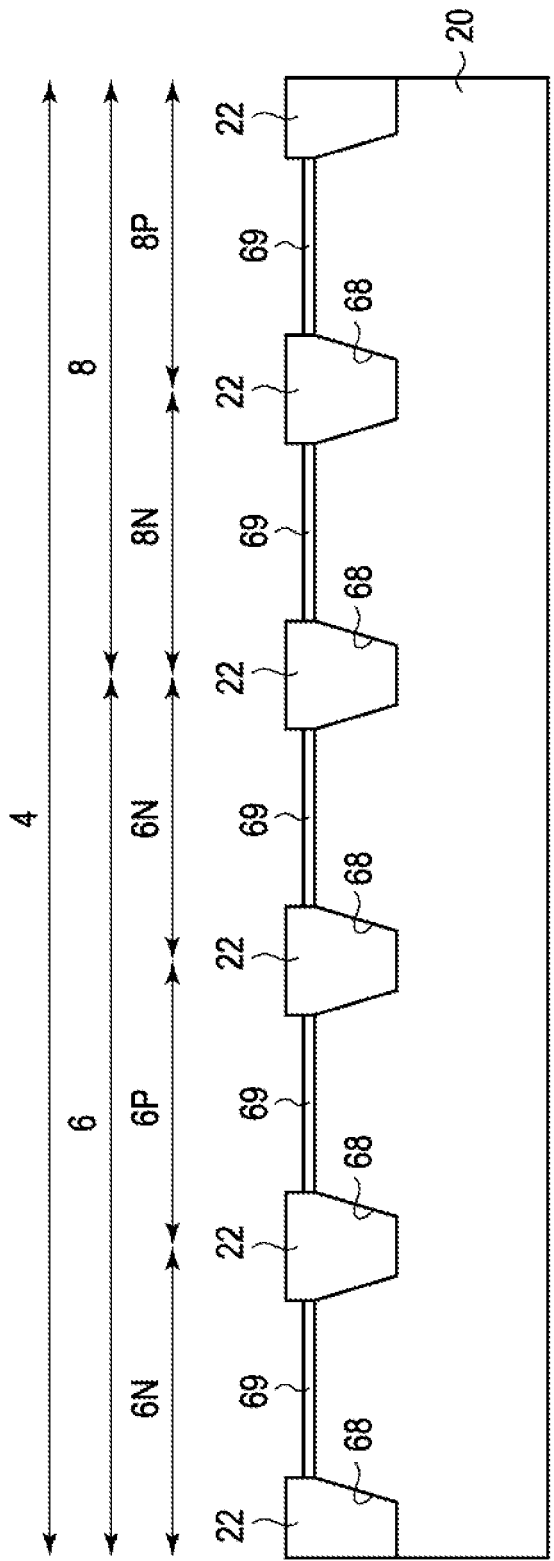

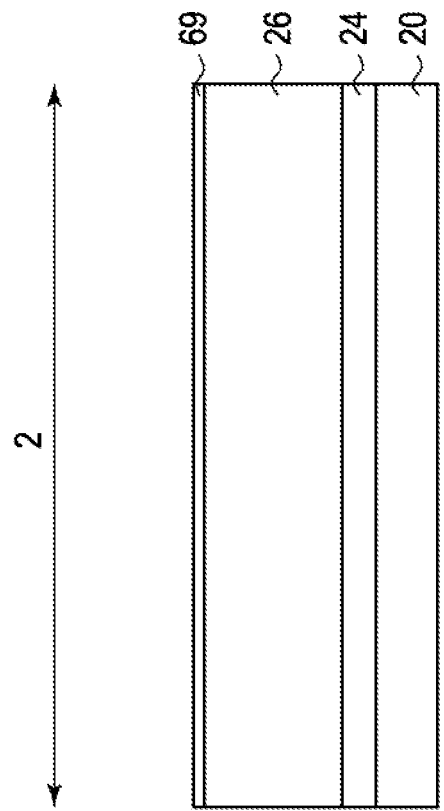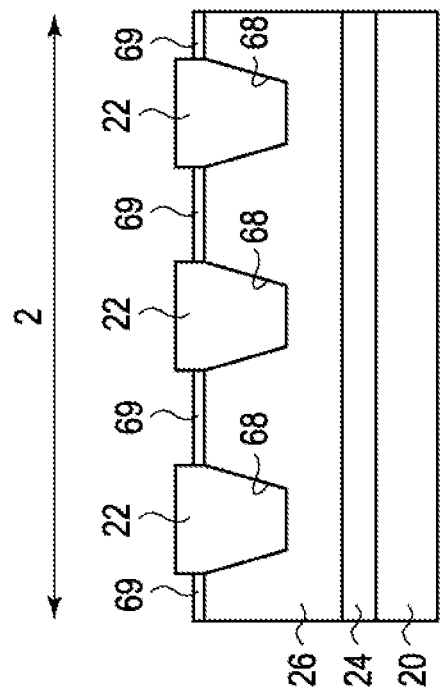

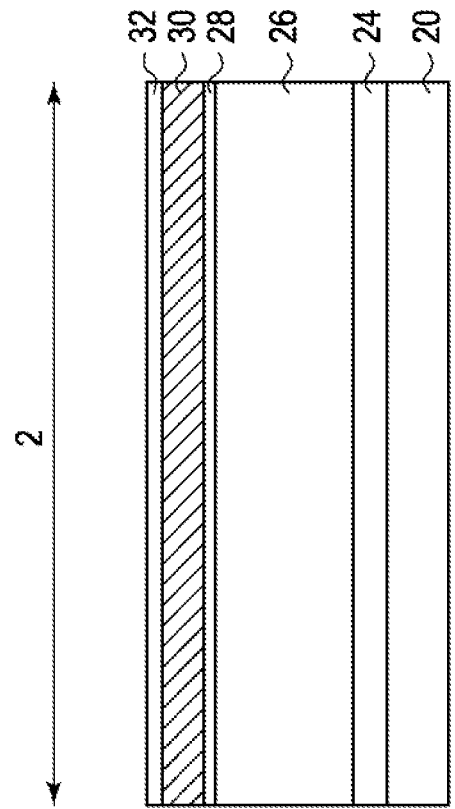
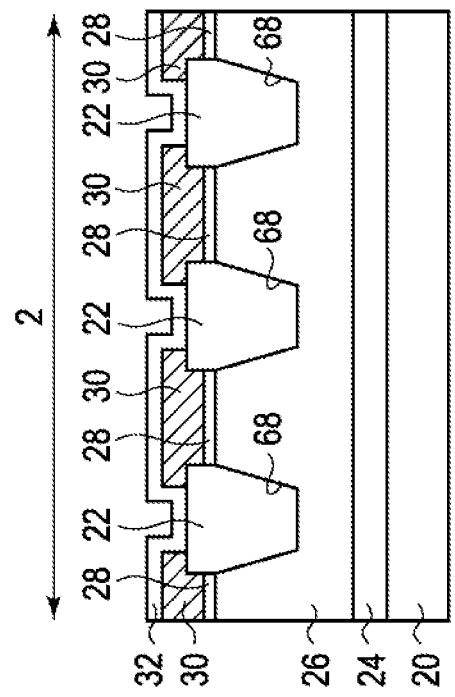

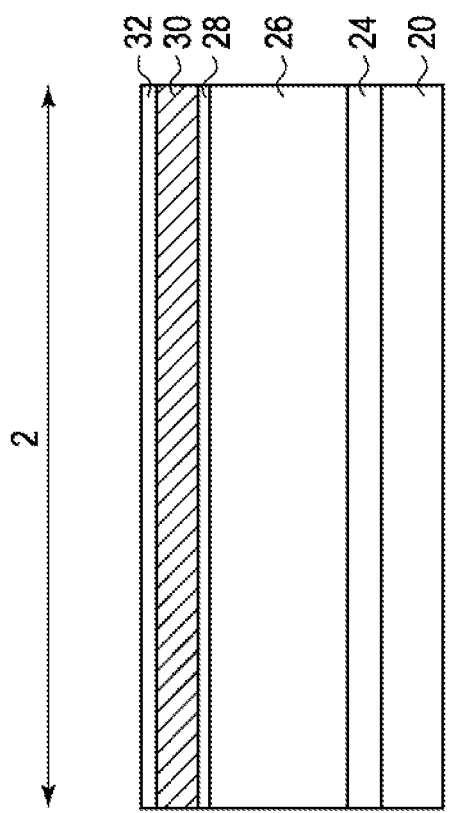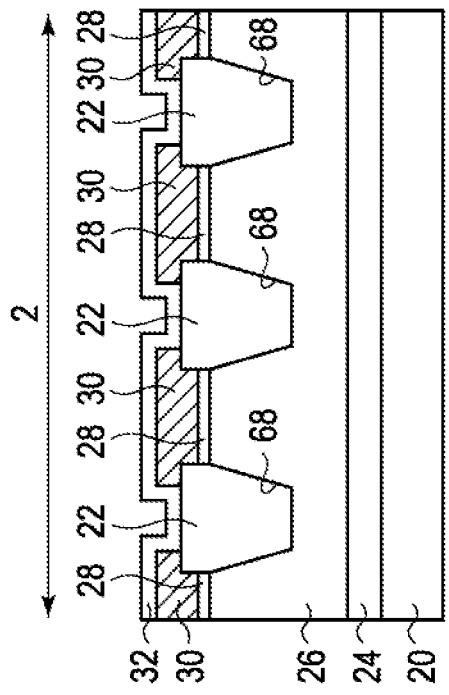

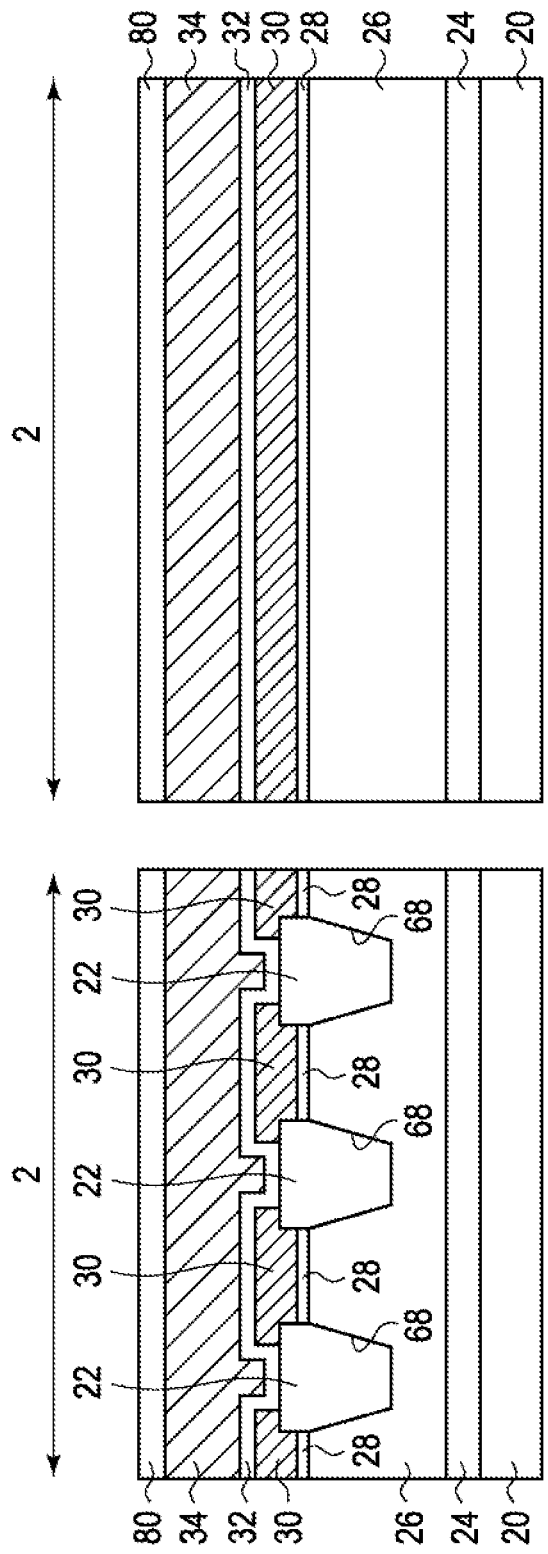

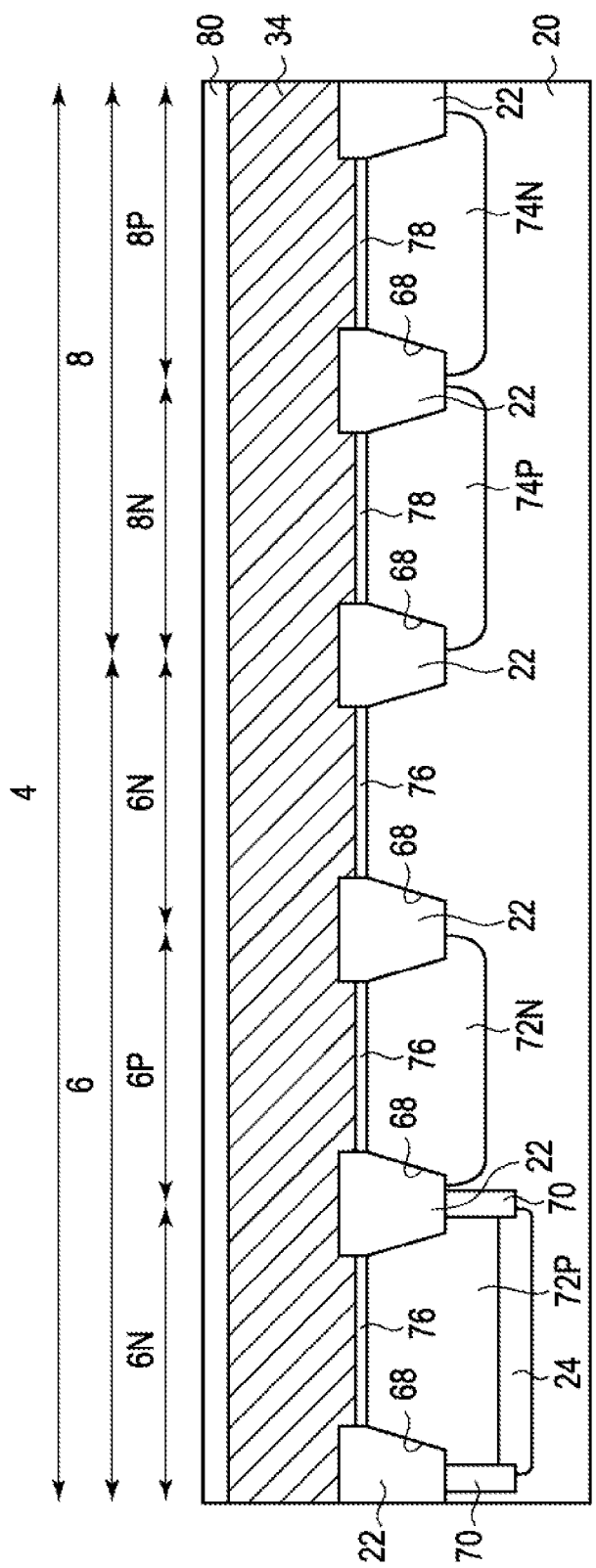

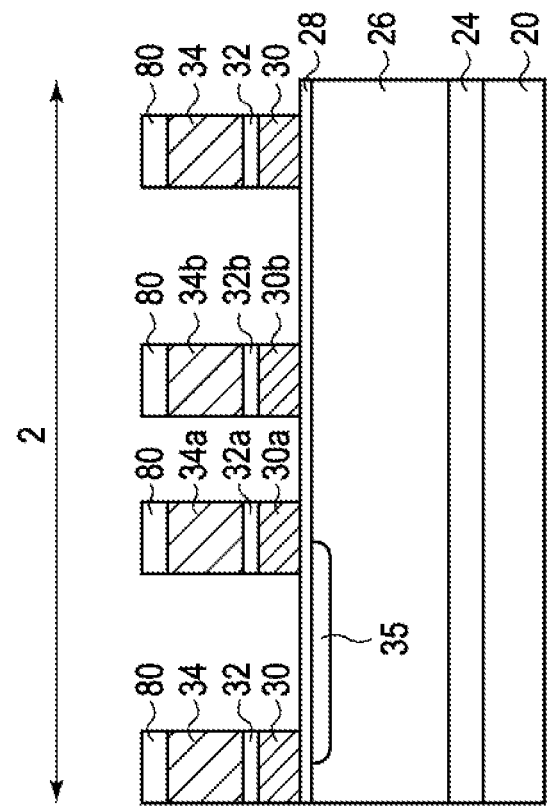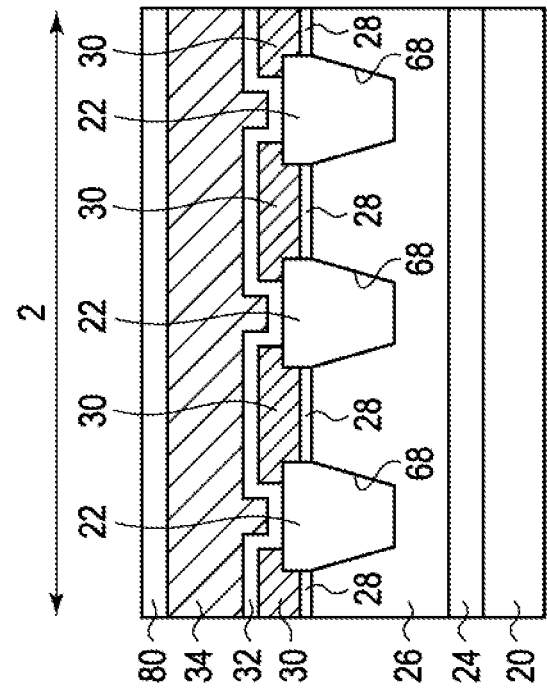

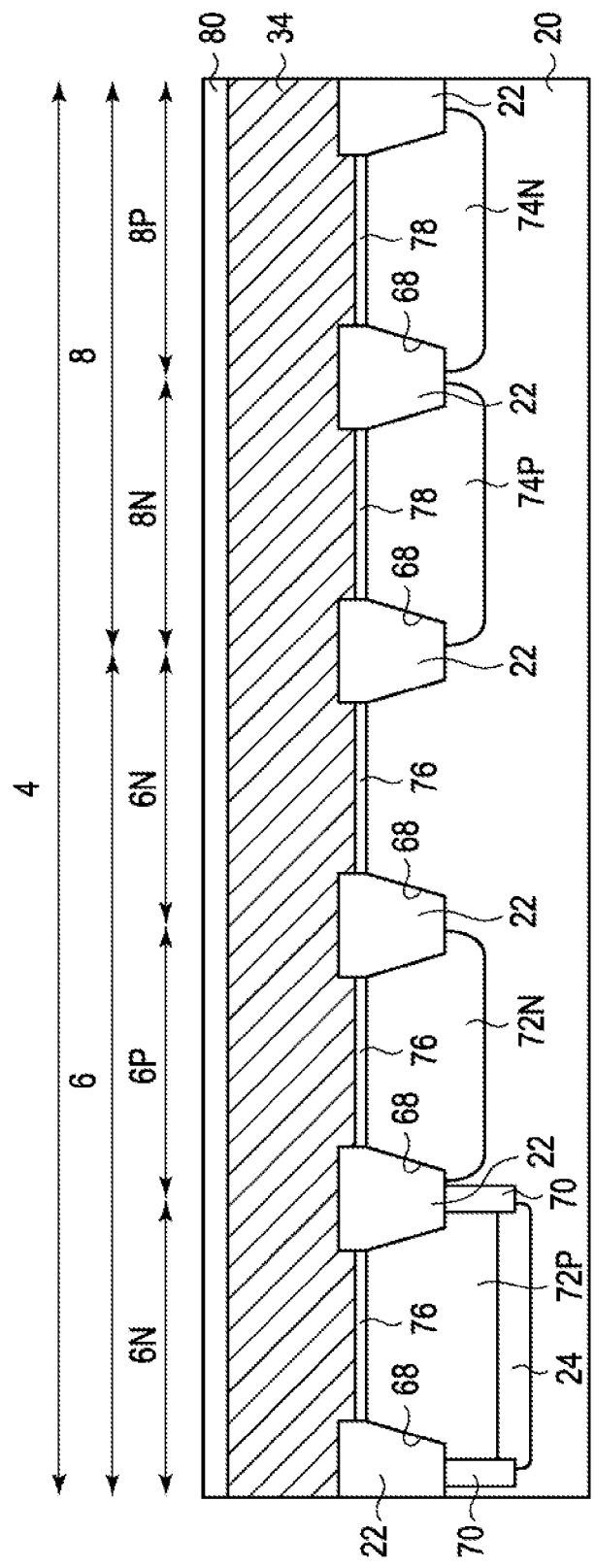

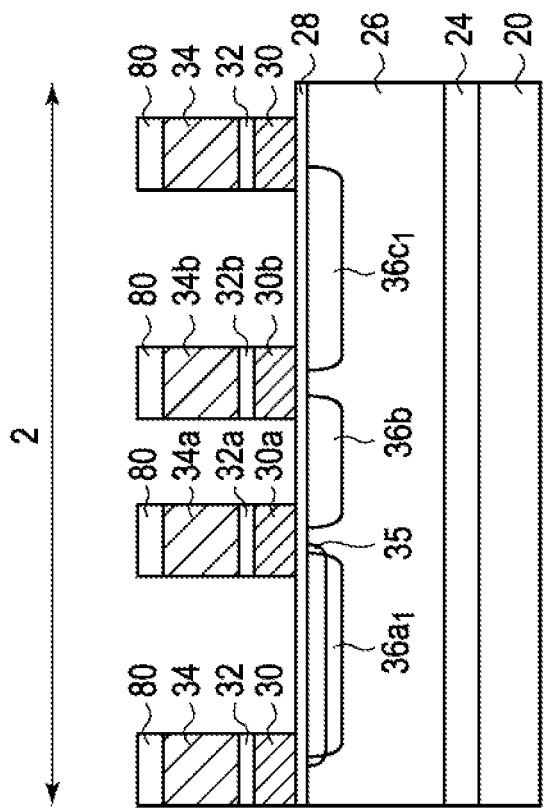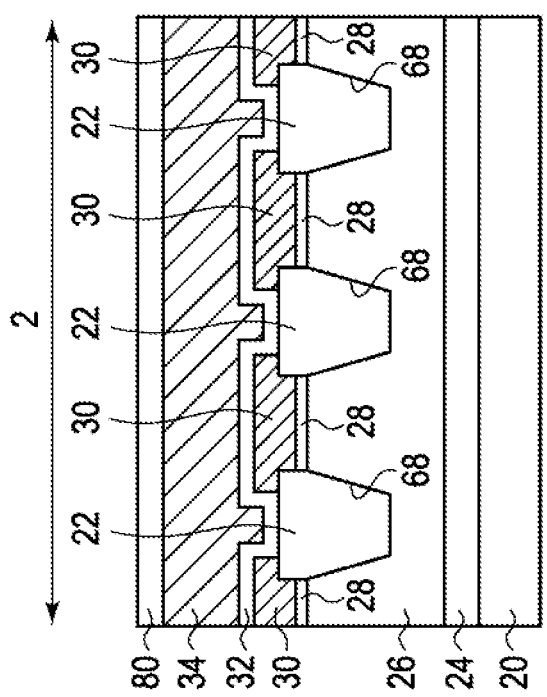

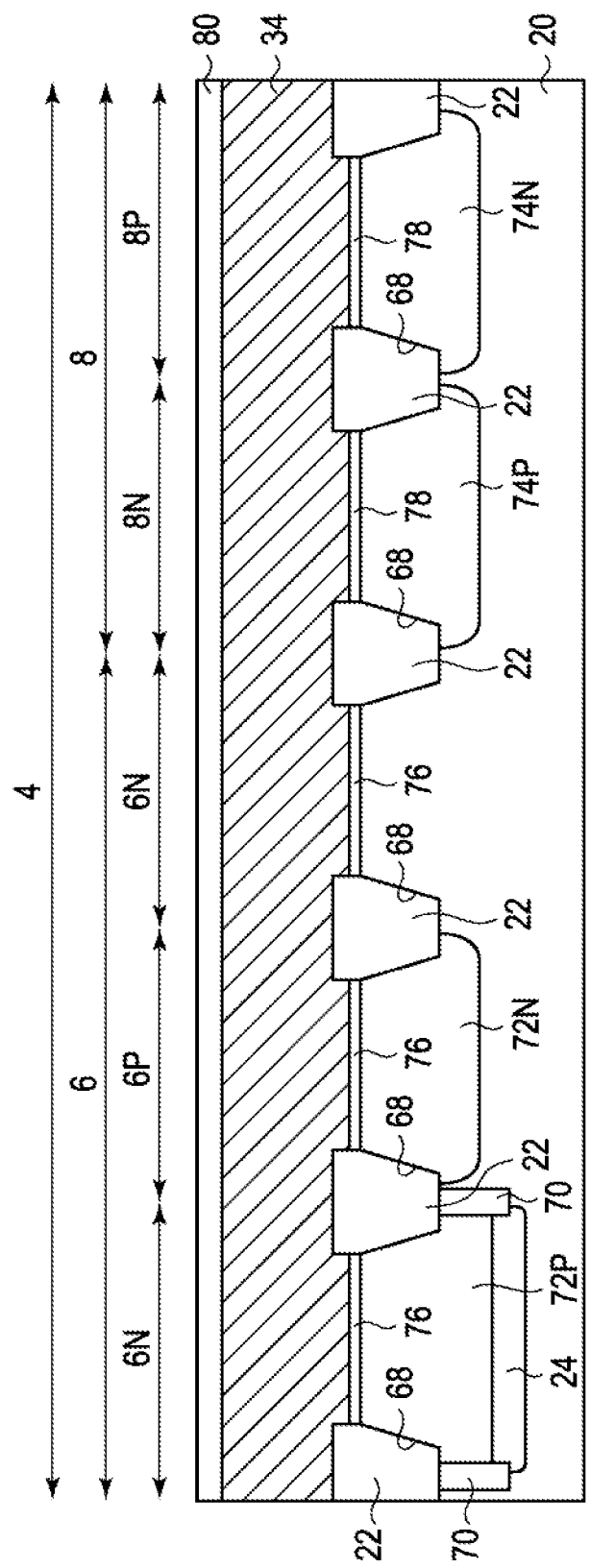

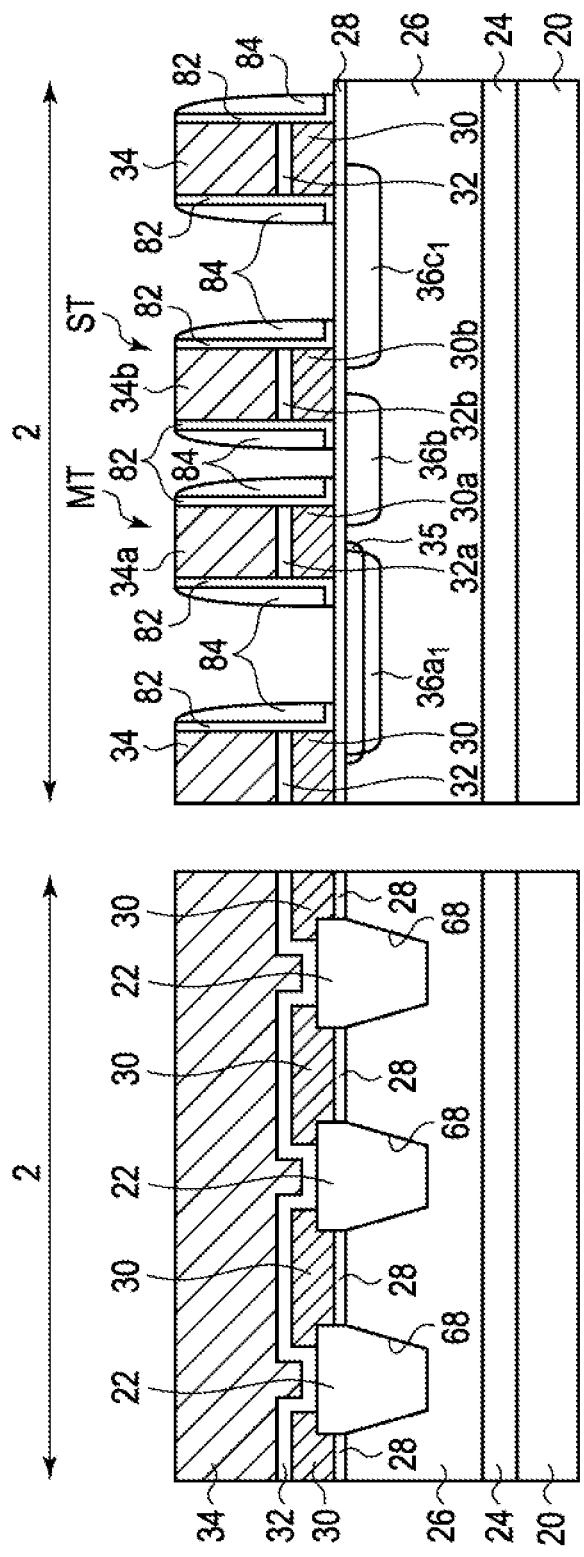

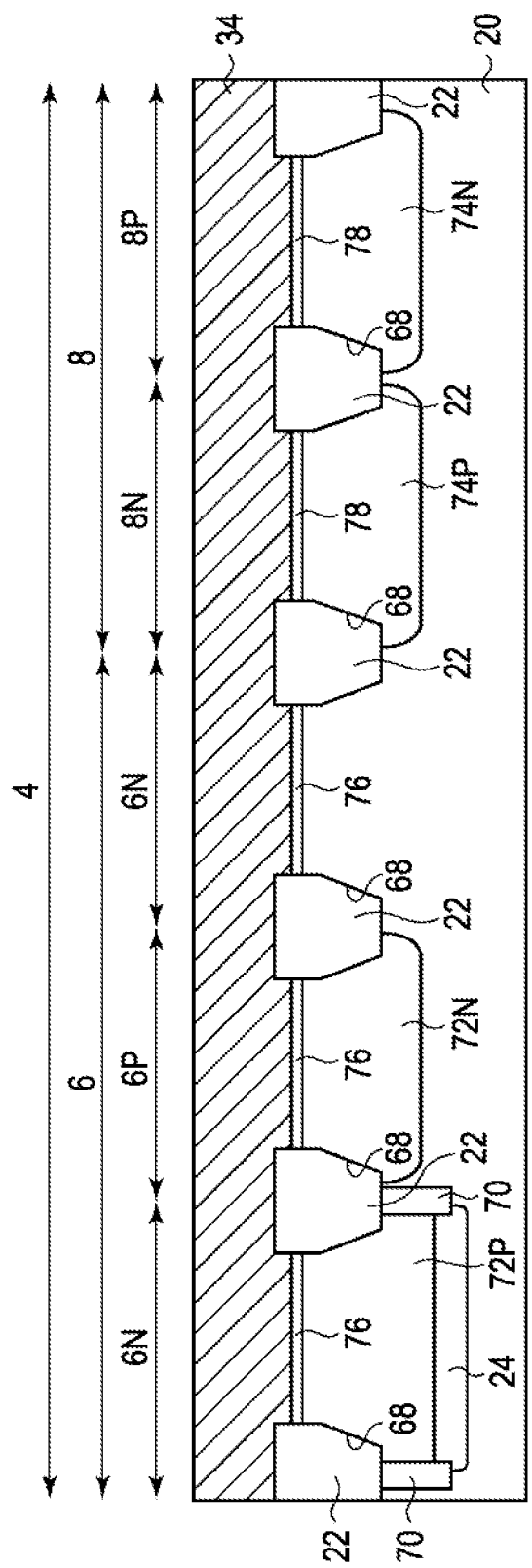

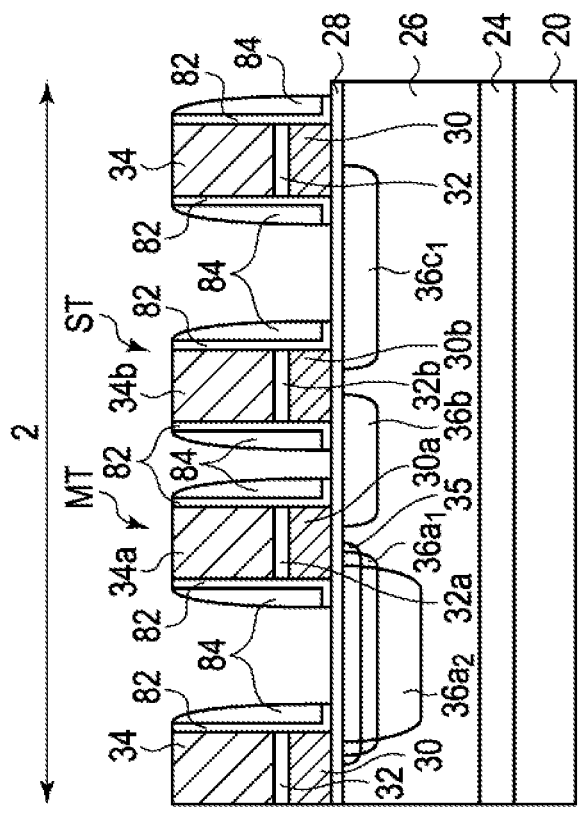
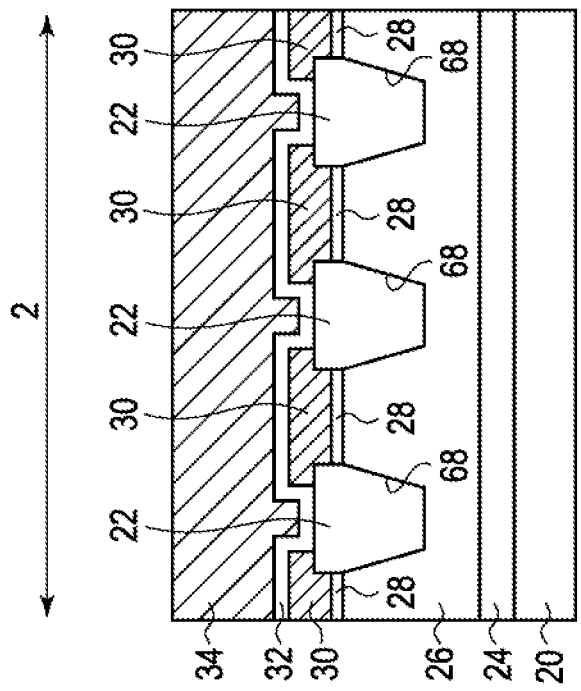

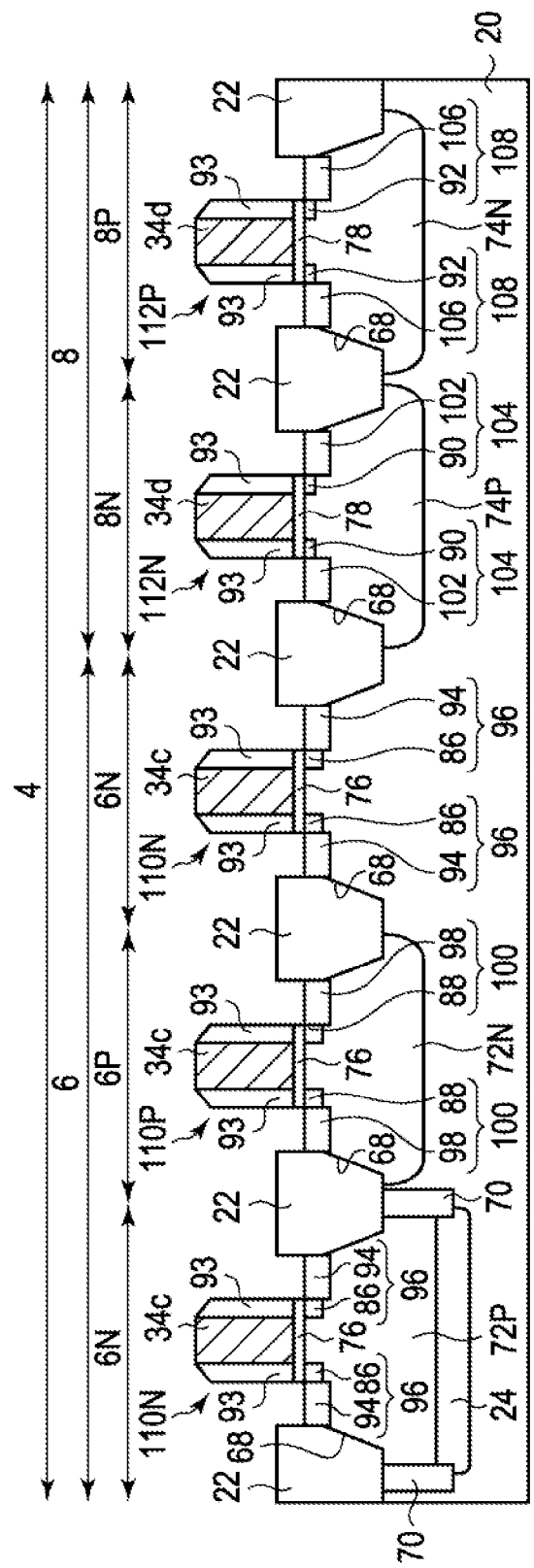

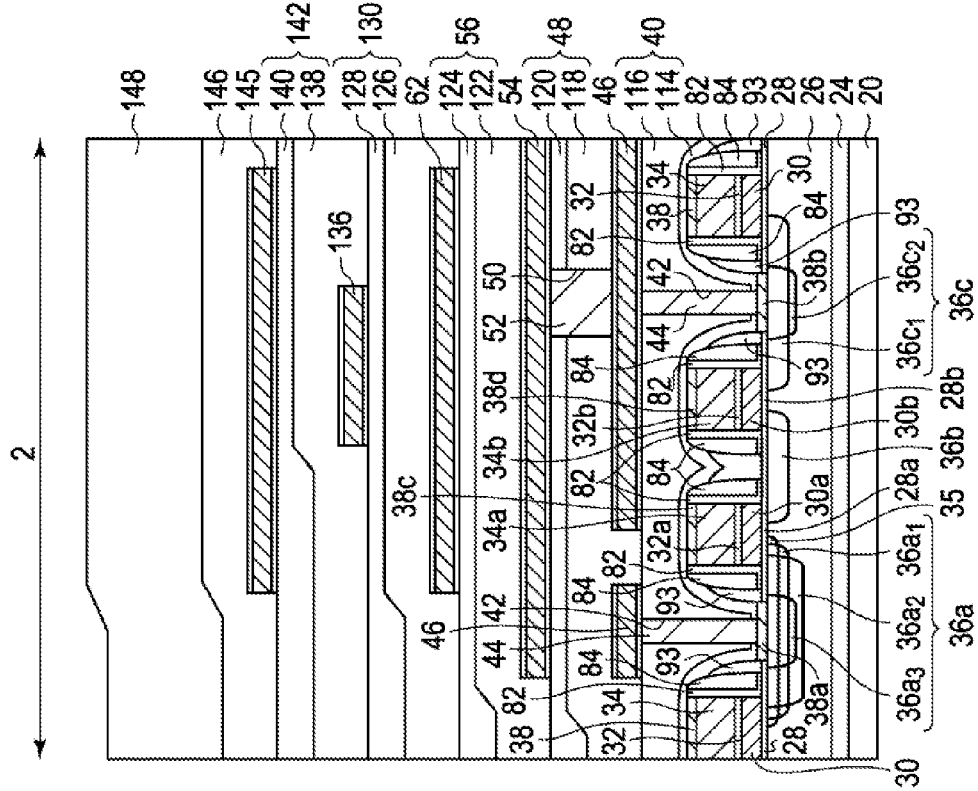
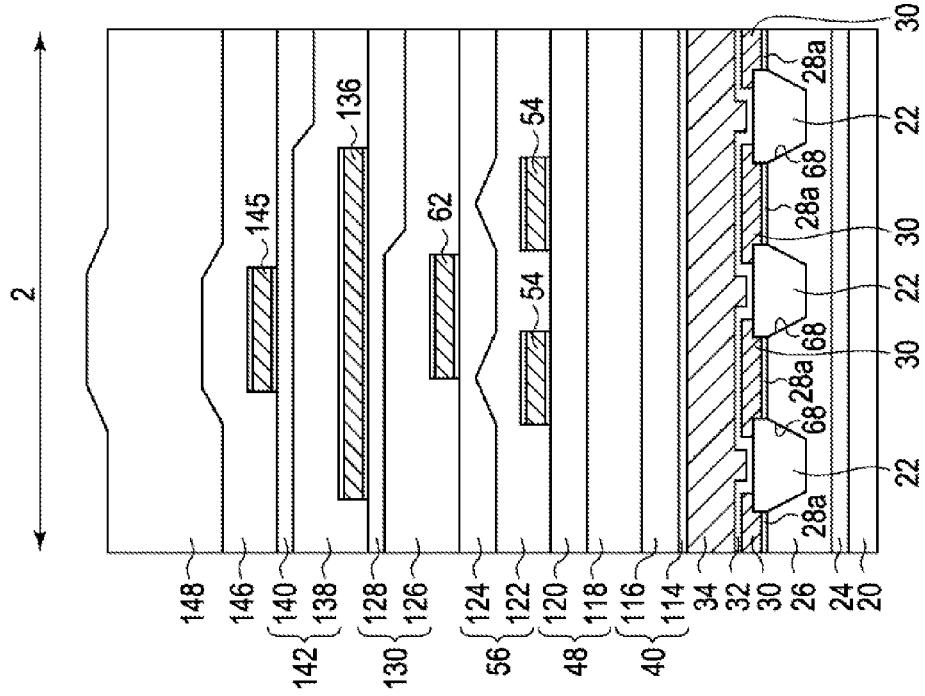

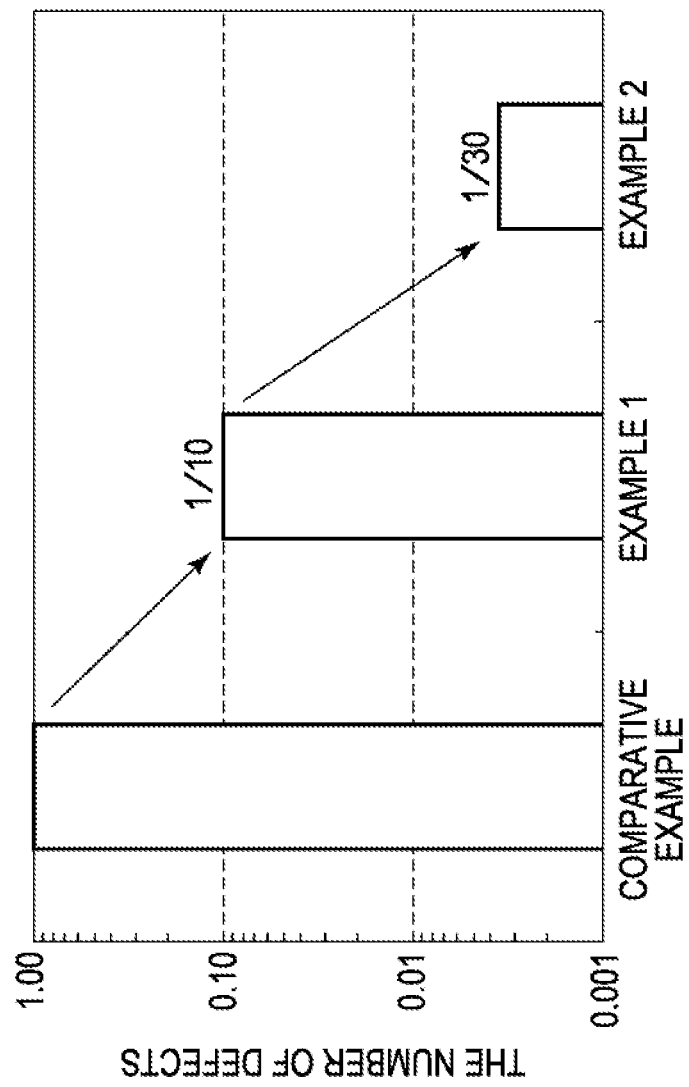

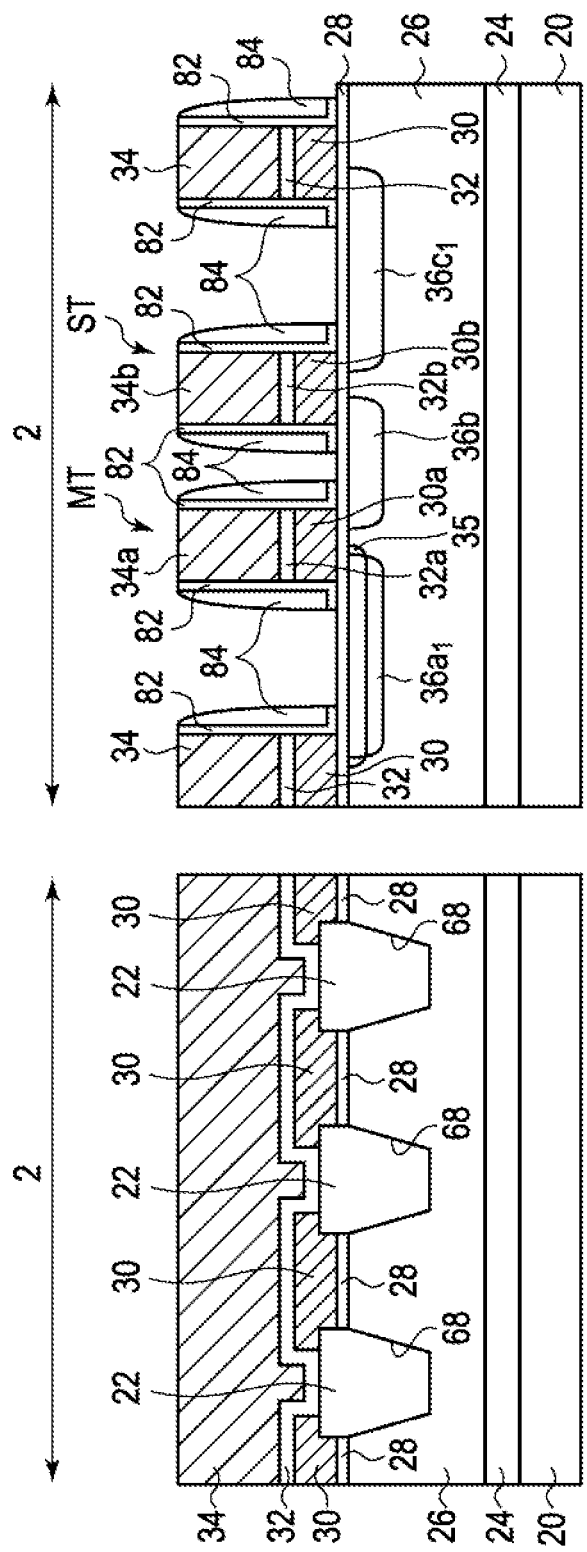

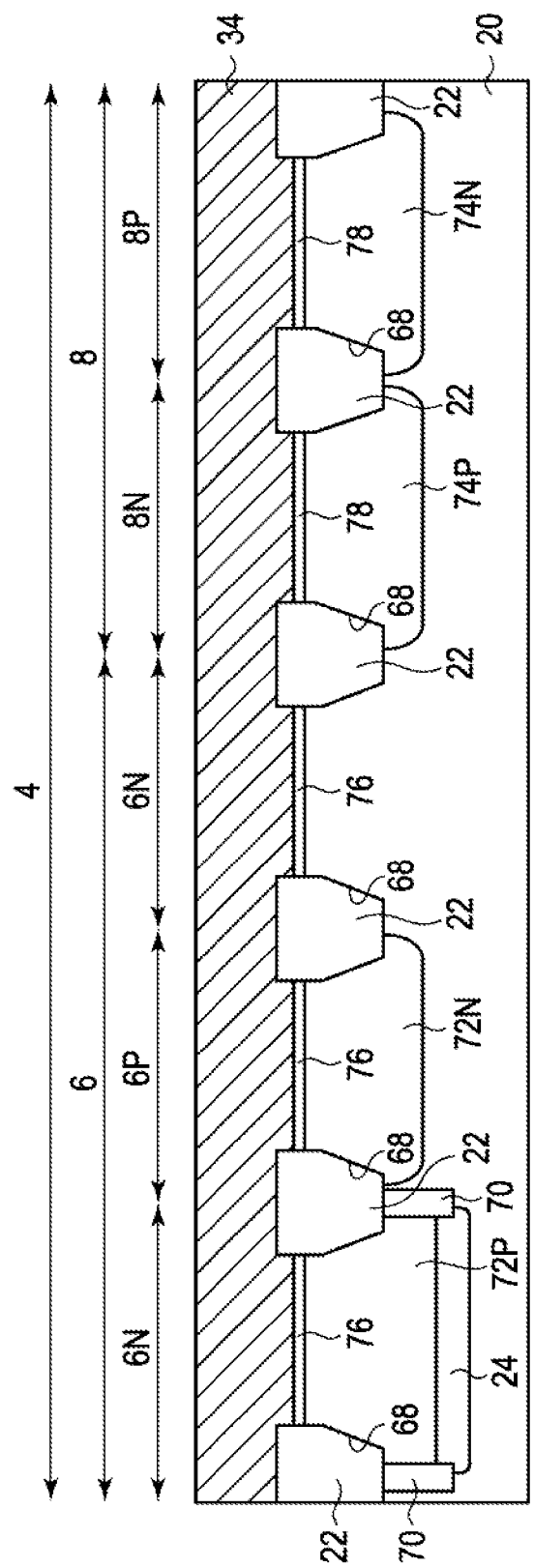

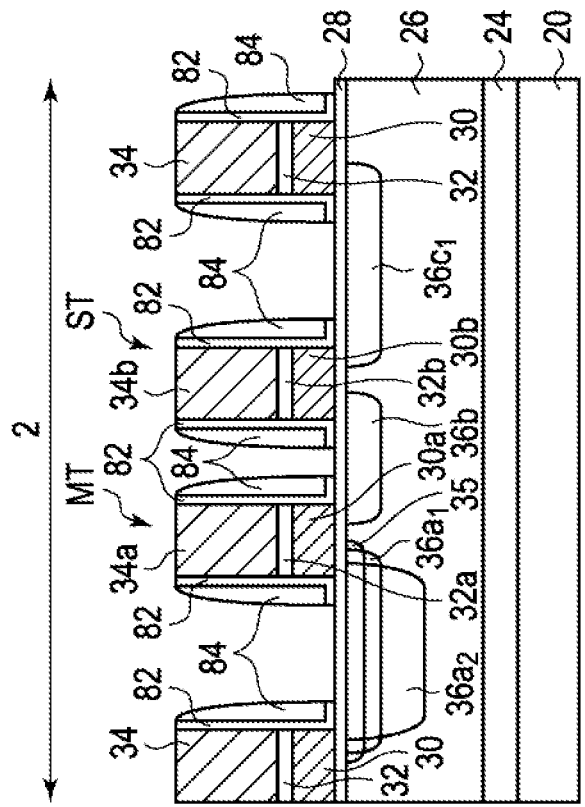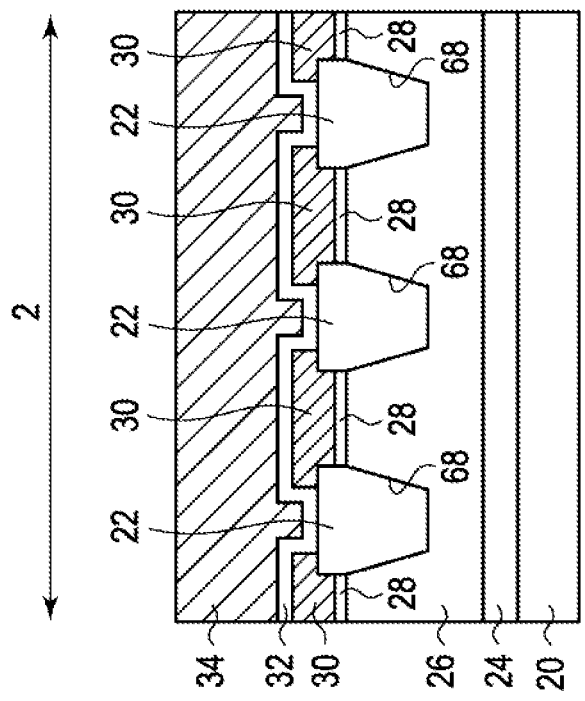

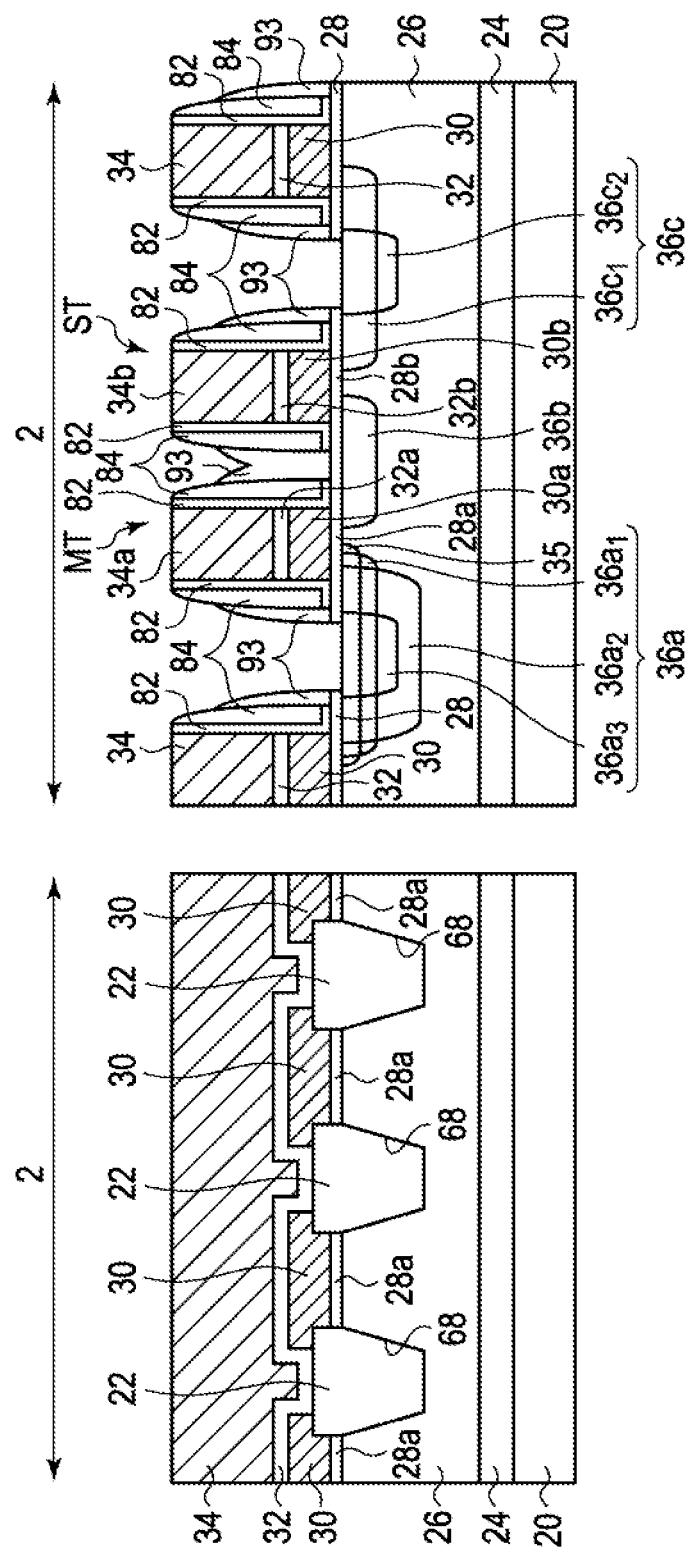

US 9,287,277 B2

SEMICONDUCTOR DEVICE AND FABRICATING METHOD THEREOF

CROSS-REFERENCE TO RELATED APPLICATIONS

This application is a divisional of application Ser. No. 12/537,913, filed Aug. 7, 2009, is based upon and claims the benefit of priority of the prior Japanese Patent Application No. 2008-205534, filed on Aug. 8, 2008, the entire contents of which are incorporated herein by reference.

FIELD

The present invention relates to a semiconductor device and a fabricating method thereof, and particularly to a semiconductor device having a memory cell and a fabricating method thereof.

BACKGROUND

In recent years, semiconductor devices, which include a memory cell having a selecting transistor and a memory cell transistor, have been proposed.

In such semiconductor devices, a bit line, a word line, a source line and the like are suitably selected by a column decoder or a row decoder, so that a memory cell is selected, and information is read from, written into, or erased from the selected memory cell.

In the proposed semiconductor devices, when information is written into a memory cell, a high voltage is applied to a source line connected to a source of a memory cell transistor and a control gate of the memory cell transistor. As a result, hot electrons are generated and some of them are implanted into a floating gate of the memory cell transistor, so that information is written into the memory cell transistor.

In the proposed semiconductor devices, however, the source line is connected commonly to sources of a plurality of memory cell transistors. For this reason, when information is written, a high voltage is applied also to the sources of the memory cell transistors other than the memory cell transistor selected as an object into which the information is written. For this reason, erroneous writing such as writing into the non-selected memory cell transistors, which are not selected as objects into which information is not written, cannot be sufficiently prevented.

SUMMARY

According to aspects of embodiments, a semiconductor device, includes: a memory cell transistor which has a floating gate formed on a semiconductor substrate via a tunnel insulating film, a control gate formed on the floating gate via an insulating film, and a source and a drain formed in the semiconductor substrate on both sides of the floating gate via a channel area; and a selecting transistor which has a select gate formed on the semiconductor substrate via a gate insulating film, and a source and a drain formed in the semiconductor substrate on both sides of the select gate, wherein the source of the selecting transistor is connected to the drain of the memory cell transistor, the source of the memory cell transistor has an N-type first impurity diffusion layer, an N-type second impurity diffusion layer deeper than the first impurity diffusion layer, and an N-type third impurity diffusion layer which is formed in the second impurity diffusion layer and is shallower than the second impurity diffusion layer, and an impurity density of the second impurity diffusion layer is lower than the impurity density of the third impurity diffusion layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 is a diagram illustrating a reading method, a writing method, and an erasing method in the semiconductor device according to the first embodiment;

FIGS. 8A to 8C, FIGS. 9A to 9C, FIGS. 10A to 10C, FIGS. 11A to 11C, FIGS. 12A to 12C, FIGS. 13A to 13C, FIGS. 14A to 14C, FIGS. 15A to 15C, FIGS. 16A to 16C, FIGS. 17A to 17C, FIGS. 18A to 18C, FIGS. 19A to 19C, FIGS. 20A to 20C, FIGS. 21A to 21C, FIGS. 22A to 22C, FIGS. 23A to 23C, FIGS. 24A to 24C, FIGS. 25A to 25C, and FIGS. 26A to 26C are cross-sectional views illustrating processes of a method for fabricating the semiconductor device according to the first embodiment.

FIG. 27 is a graph illustrating evaluation results of the semiconductor device according to the embodiment;

FIGS. 28A to 28C, FIGS. 29A to 29C, FIGS. 30A to 30C and FIGS. 31A to 31C are cross-sectional views illustrating processes of the method for fabricating a semiconductor device according to a second embodiment;

DESCRIPTION OF EMBODIMENTS

Figure 32:
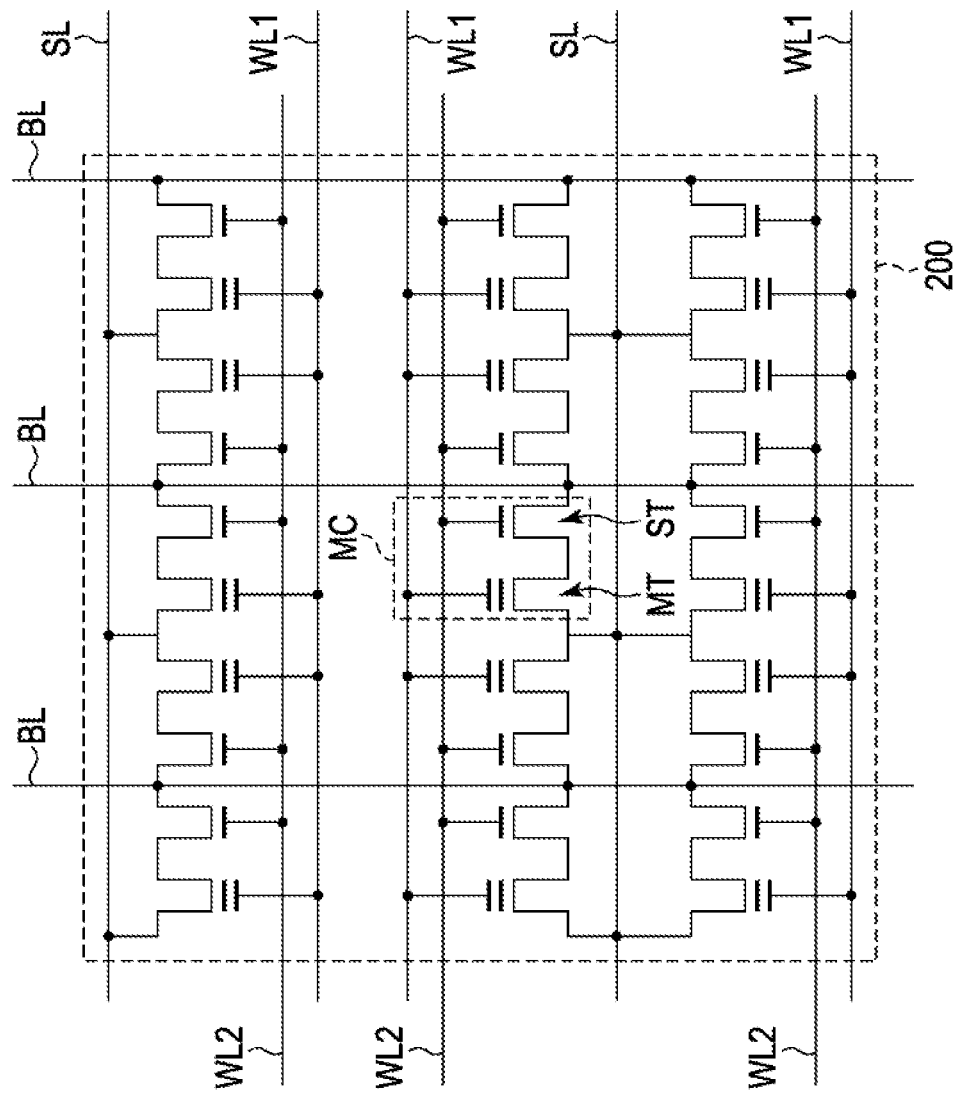
FIG. 32 is a plan view illustrating a memory cell array of a proposed semiconductor device.

FIG. 32 is a circuit diagram illustrating a memory cell array of a proposed semiconductor device.

As illustrated in FIG. 32, in the proposed semiconductor device, a memory cell MC has a selecting transistor ST, and a memory cell transistor MT which is connected in series to the selecting transistor ST. A source of the selecting transistor ST is connected to a drain of the memory cell transistor MT.

The plurality of memory cells MC are arranged into a matrix pattern. The plurality of memory cells MC arranged into the matrix pattern form a memory cell array 200.

A drain of the selecting transistor ST of the memory cell MC is connected to the drain of the selecting transistor ST of one adjacent memory cell MC in the same row. A source of the memory cell transistor MT of the memory cell MC is connected to the source of the memory cell transistor MT of the other adjacent memory cell MC in the same row.

The drains of the plurality of selecting transistors ST present in the same row are connected commonly by a bit line BL. Each bit line BL is provided to each group composed of adjacent two columns so as to commonly connect the drains of the selecting transistors ST connected in each row.

Control gates of the plurality of memory cell transistors MT present in the same row are connected commonly by a first word line WL1.

Select gates of the plurality of selecting transistors ST present in the same row are connected commonly by a second word line WL2.

The sources of the plurality of memory cell transistors MT present in the same row are connected commonly by a source line SL.

The plurality of bit lines BL which commonly connect the drains of the selecting transistors ST are connected to a column decoder (not depicted) which controls electric potentials of the plurality of bit lines BL.

The plurality of first word lines WL1 which commonly connect the control gates of the memory cell transistors MT are connected to a first row decoder (not depicted) which controls electric potentials of the plurality of first word lines WL1.

The plurality of second word lines WL2 which commonly connect the select gates of the selecting transistors ST are commonly connected to a second row decoder (not depicted) which controls electric potentials of the plurality of second word lines WL2.

The plurality of source lines SL which commonly connect the sources of the memory cell transistors MT are connected to a third row decoder (not depicted) which controls electric potentials of the plurality of source lines SL.

Figure 33:
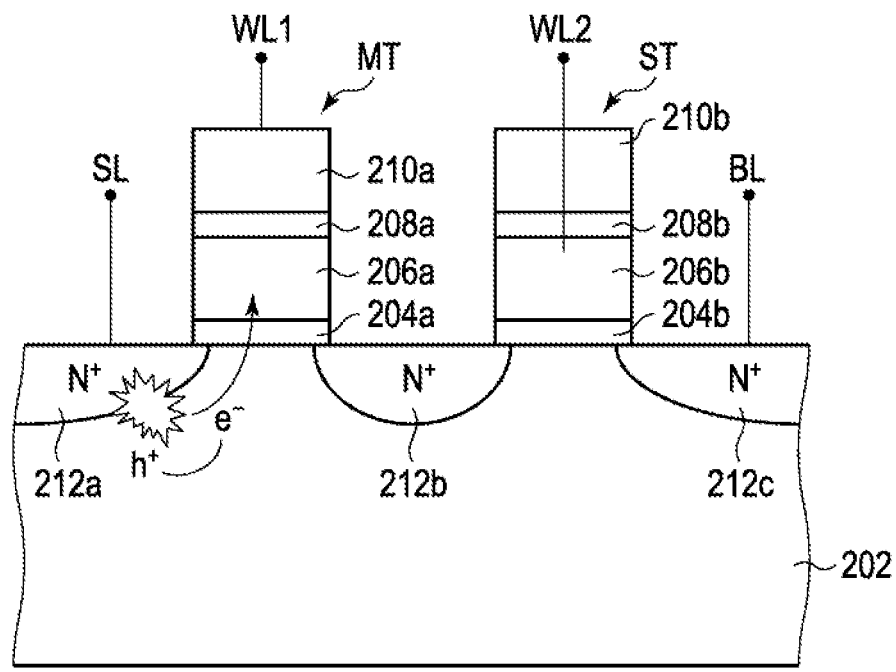
FIG. 33 is a cross-sectional view illustrating a memory cell of the proposed semiconductor device.

FIG. 33 is a cross-sectional view illustrating the memory cell MC of the proposed semiconductor device.

As illustrated in FIG. 33, a floating gate 206a is formed on a semiconductor substrate 202 via a tunnel insulating film 204a.

A control gate 210a is formed on the floating gate 206a via an insulating film 208a. The control gates 210a of the memory cell transistors MT present on the same row are commonly connected. In other words, the first word line WL1 which commonly connects the control gates 210a is formed on the floating gates 206a via the insulating films 208a.

A select gate 206b of the selecting transistor ST is formed on the semiconductor substrate 202 via a gate insulating film 204b so as to be parallel with the floating gate 206a. The select gates 206b of the selecting transistors ST present on the same row are commonly connected. In other words, the second word line WL2 which commonly connects the select gates 206b is formed on the semiconductor substrate 202 via the gate insulating films 204b.

A polysilicon layer 210b is formed on the select gate 206b via an insulating film 208b.

N-type impurity diffusion layers 212a, 212b, and 212c are formed inside the semiconductor substrate 202 on both sides of the floating gate 206a and inside the semiconductor substrate 202 on both sides of the select gate 206b. The source of the memory cell transistor MT is formed by the impurity diffusion layer 212a. The drain of the memory cell transistor MT and the source of the selecting transistor ST are formed by the same impurity diffusion layer 212b. The drain of the selecting transistor ST is formed by the impurity diffusion layer 212c.

The N-type memory cell transistor MT having the floating gate 206a, the control gate 210a, and the source/drain diffusion layers 212a and 212b is formed on the semiconductor substrate 202. The source diffusion layers 212a of the plurality of memory cell transistors MT present on the same row are connected commonly by the source line SL.

The N-type selecting transistor ST having the select gate 206a and the source/drain diffusion layers 212b and 212c is formed on the semiconductor substrate 202. The drain diffusion layers 212c of the plurality of selecting transistors ST present on the same column are connected commonly by the bit line BL.

Figure 34:
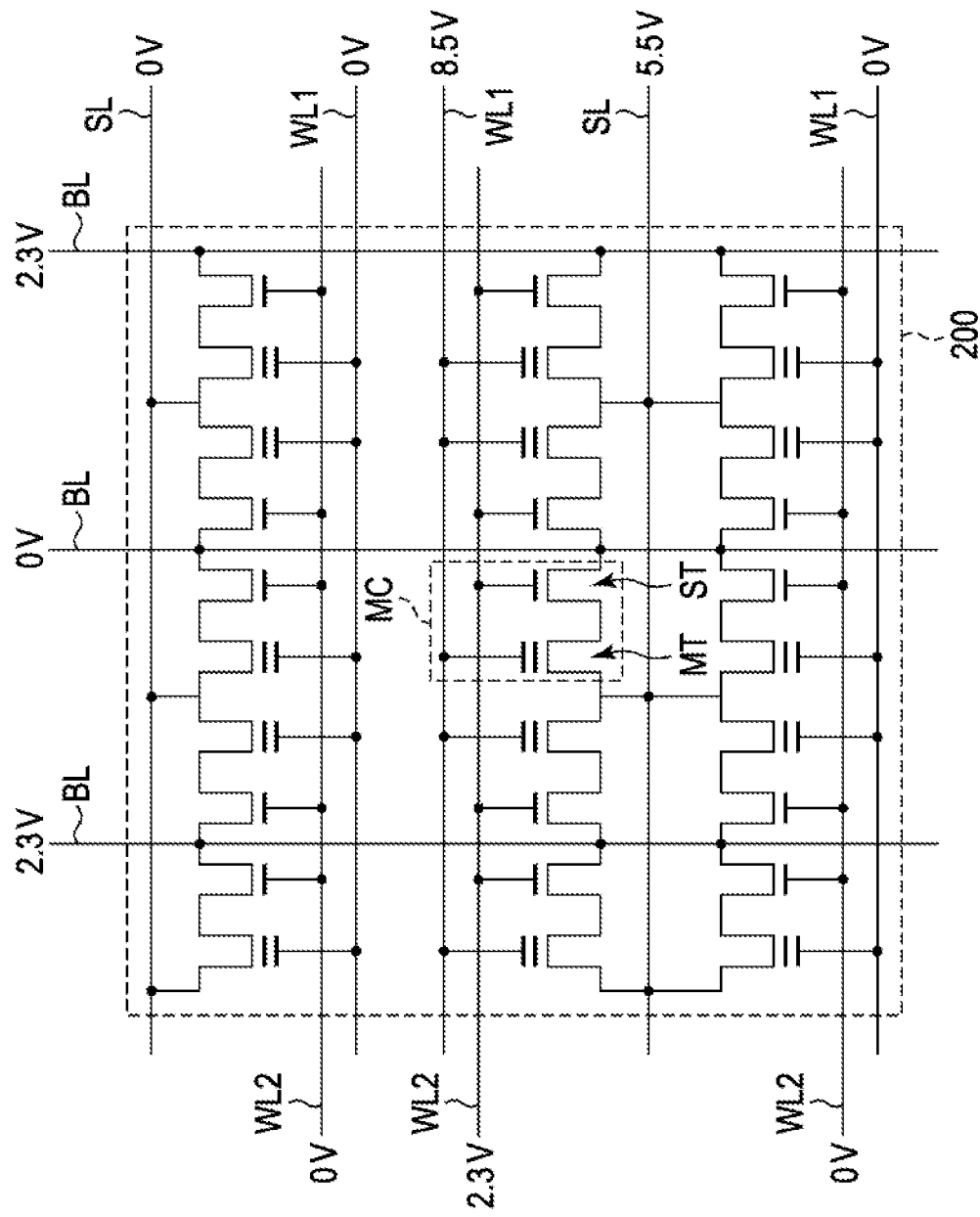
FIG. 34 is a plan view illustrating voltages of respective sections at the time of writing information in the proposed semiconductor device.

When information is written into such a memory cell MC, the electric potentials of the respective sections are set as illustrated in FIG. 34.

That is, the electric potential of the bit line BL connected to the memory cell MC to be selected is set to, for example, 0 V. Further, the electric potentials of the bit lines BL other than the selected bit line BL are, for example, power source voltages of 2.3 V.

The electric potential of the source line SL connected to the memory cell MC to be selected is set to, for example, 5.5 V. On the other hand, the electric potentials of the source lines SL other than the selected source line SL are set to 0 V.

The electric potential of the first word line WL1 connected to the memory cell MC to be selected is set to, for example, 8.5 V. On the other hand, the electric potentials of the first word lines WL1 other than the selected first word line WL1 are set to 0 V.

The electric potential of the second word line WL2 connected to the memory cell MC to be selected is set to, for example, a power source voltage of 2.3 V. On the other hand, the electric potentials of the second word lines WL2 other than the selected second word line WL2 are set to 0 V.

When the electric potentials of the respective sections are set as described above, as illustrated in FIG. 33, an electron-hole pair ($e^-$, $h^+$) is generated near the source diffusion layer 212a of the memory cell transistor MT in the selected memory cell MC. The electrons are accelerated by an electric field so as to become hot electrons, some of which are implanted into the floating gate 206a. As a result, charges are accumulated on the floating gate 206a of the memory cell transistor MT. In such a manner, information is written into the memory cell transistor MT of the selected memory cell MC.

In the proposed semiconductor device, a high voltage is applied to the source line SL connected to the selected memory cell MC, and some of the hot electrons are implanted into the floating gate of the memory cell transistor MT from the source side, so that the information is written.

The source line SL commonly connects the sources of the memory cell transistors MT in the plurality of memory cells MC present on the same row. For this reason, when information is written, a high voltage is applied also to the sources of the memory cell transistors MT in the non-selected memory cells MC connected to the source line SL that is connected to the selected memory cell MC.

Since the high voltage is applied also to the sources of the memory cell transistors MT in the non-selected memory cells MC, in some cases, the information is written accidentally into the non-selected memory cells MC connected to the source line SL connected to the selected memory cell MC, namely, erroneous writing occurs. It has been found that the erroneous writing of information does not occur uniformly on all the non-selected memory cells MC connected to the source line SL connected to the selected memory cell MC, but occurs randomly. It is considered that defective crystals of a silicon substrate formed with a source diffusion layer contributes to the erroneous writing which occurs randomly.

The inventors of this application carried out keen examination in order to reduce the erroneous writing of information, and thus devised the following semiconductor device and fabricating method thereof.

First Embodiment

Figure 1:
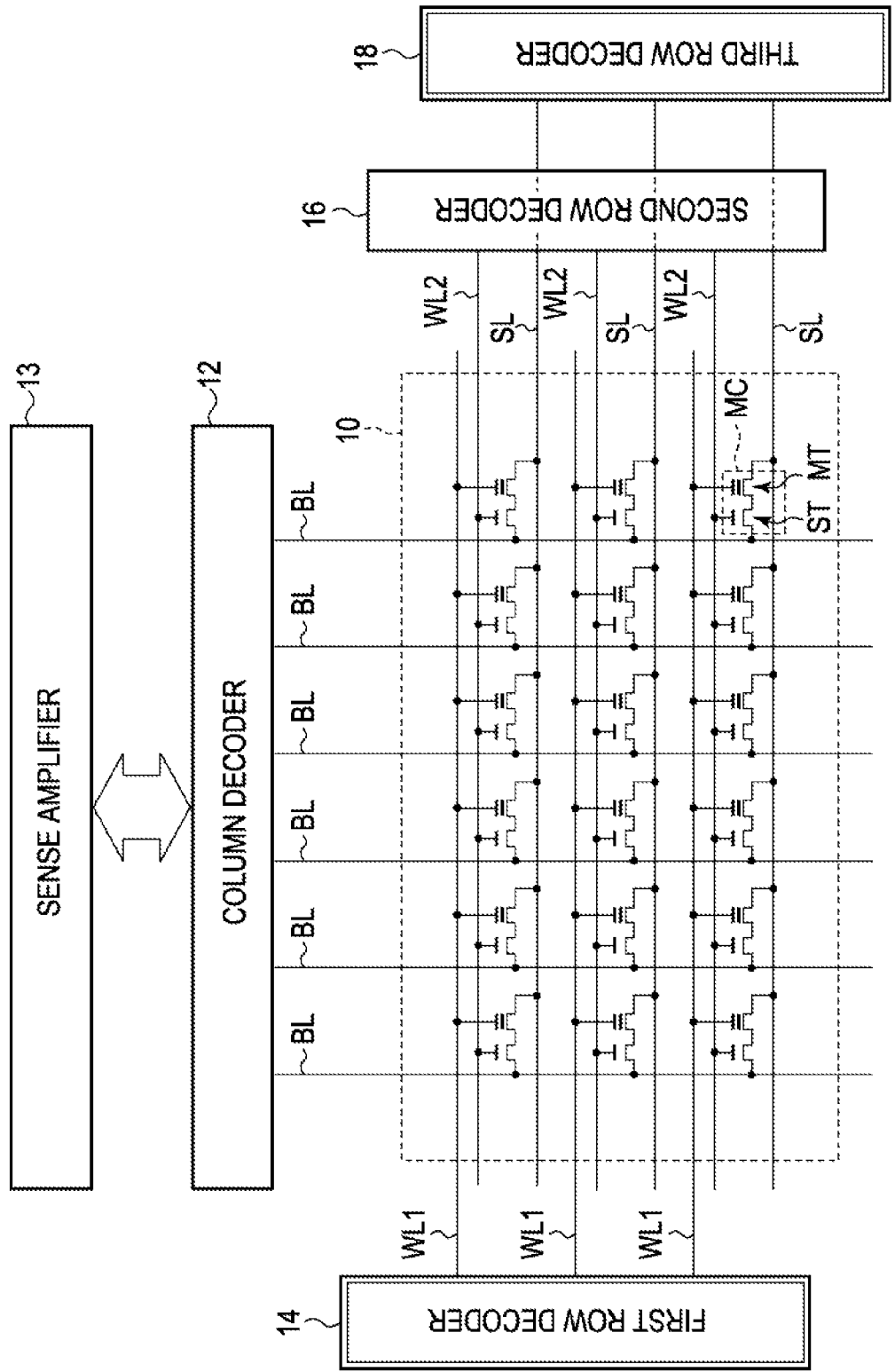
FIG. 1 is a circuit diagram illustrating a semiconductor device according to a first embodiment.

The semiconductor device and the fabricating method thereof according to the first embodiment will be described with reference to FIGS. 1 to 27.
(Semiconductor Device)
The semiconductor device according to the embodiment will be described with reference to FIGS. 1 to 6. FIG. 1 is a circuit diagram illustrating the semiconductor device according to the first embodiment.

As illustrated in FIG. 1, in the semiconductor device according to the first embodiment, the memory cell MC has the selecting transistor ST, and the memory cell transistor MT which is connected in series to the selecting transistor ST. The source of the selecting transistor ST is connected to the drain of the memory cell transistor MT. More concretely, the source of the selecting transistor ST and the drain of the memory cell transistor MT are formed integrally by one impurity diffusion layer.

The plurality of memory cells MC are arranged in the matrix pattern. The plurality of matrix-patterned memory cells MC form a memory cell array 10.

The drains of the plurality of selecting transistors ST present on the same column are connected commonly by the bit line BL.

The control gates of the plurality of memory cell transistors MT present on the same row are connected commonly by the first word line WL1.

The select gates of the plurality of selecting transistors ST present on the same row are connected commonly by the second word line WL2.

The sources of the plurality of memory cell transistors MT present on the same row are connected commonly by the source line SL.

The plurality of bit lines BL which commonly connect the drains of the selecting transistors ST are connected to a column decoder 12. The column decoder 12 controls the electric potentials of the plurality of bit lines BL commonly connecting the drains of the selecting transistors ST. The column decoder 12 is connected to a sense amplifier 13 which detects electric currents flowing in the bit lines BL. The column decoder 12 may be a low-voltage circuit which is operated by a comparatively low voltage. The low-voltage circuit has a comparatively low withstand voltage, and may operate at a high speed. A gate insulating film (not depicted) of a transistor (not depicted) composed of the low-voltage circuit is formed so as to have a comparatively small thickness. For this reason, the transistor composed of the low-voltage circuit used in the column decoder 12 may operate at a comparatively high speed. The low-voltage circuit is used as the column decoder 12 in the first embodiment because a high voltage does not have to be applied to the drain of the selecting transistor ST, and when information written into the memory cell transistor MT is read, the selecting transistor ST needs to be operated at a high speed. In the first embodiment, since the low-voltage circuit is used as the column decoder 12, the selecting transistor ST may be operated at a comparatively high speed. Thus, a nonvolatile semiconductor storage device whose reading speed is high may be provided.

The plurality of first word lines WL1 which commonly connect the control gates of the memory cell transistors MT are connected to a first row decoder 14. The first row decoder 14 is for controlling the electric potentials of the plurality of first word lines WL1 commonly connecting the control gates of the memory cell transistors MT. The first row decoder 14 may be a high-voltage circuit (high-withstand voltage circuit). An operating speed of the high-voltage circuit is comparatively low, and the high-voltage circuit has a comparatively high withstand voltage. A gate insulating film (not depicted) of a transistor (not depicted) of the high-voltage circuit is formed so as to have a comparatively large sickness in order to ensure sufficient withstand voltage. For this reason, an operating speed of the transistor composed of the high-voltage circuit is lower than that of the transistor of the low-voltage circuit. In the first embodiment, the high-voltage circuit is used as the first row decoder 14 because, when information is written into the memory cell transistor MT or information written thereinto is erased, a high-voltage needs to be applied to the first word line WL1. When information written into the memory cell transistor MT is read, a power source voltage $V_{CC}$ is always applied to the first word line WL1. For this reason, even when the operating speed of the high-voltage circuit used in the first row decoder 14 is comparatively low, no problem arises.

The plurality of second word lines WL2 which commonly connect the select gates of the selecting transistors ST are connected to a second row decoder 16. The second row decoder 16 controls the electric potentials of the plurality of second word lines WL2 commonly connecting the select gates of the selecting transistors ST. The second row decoder 16 may be a low-voltage circuit (low-withstand voltage circuit). In the first embodiment, the low-voltage circuit is used as the second row decoder 16 because a high voltage does not have to be applied to the select gate of the selecting transistor ST, and it is preferable to operate the selecting transistor ST at a high speed. In the first embodiment, since the low-voltage circuit is used as the second row decoder 16, the selecting transistor ST may be operated at a comparatively high speed, and thus a nonvolatile semiconductor storage device whose reading speed is high may be provided.

The plurality of source lines SL which commonly connect the sources of the memory cell transistors MT are connected to a third row decoder 18. The third row decoder 18 controls the electric potentials of the plurality of source lines SL commonly connecting the sources of the memory cell transistors MT. The third row decoder 18 may be a high-voltage circuit (high-withstand voltage circuit). In the first embodiment, the high-voltage circuit is used as the third row decoder 18 because when information is written into the memory cell transistor MT, a high voltage may be applied to the source line SL. When information written into the memory cell transistor MT is read, as described later, the source line SL is always grounded. For this reason, even when the operating speed of the third row decoder 18 is comparatively low, no problem arises.

Figure 2:
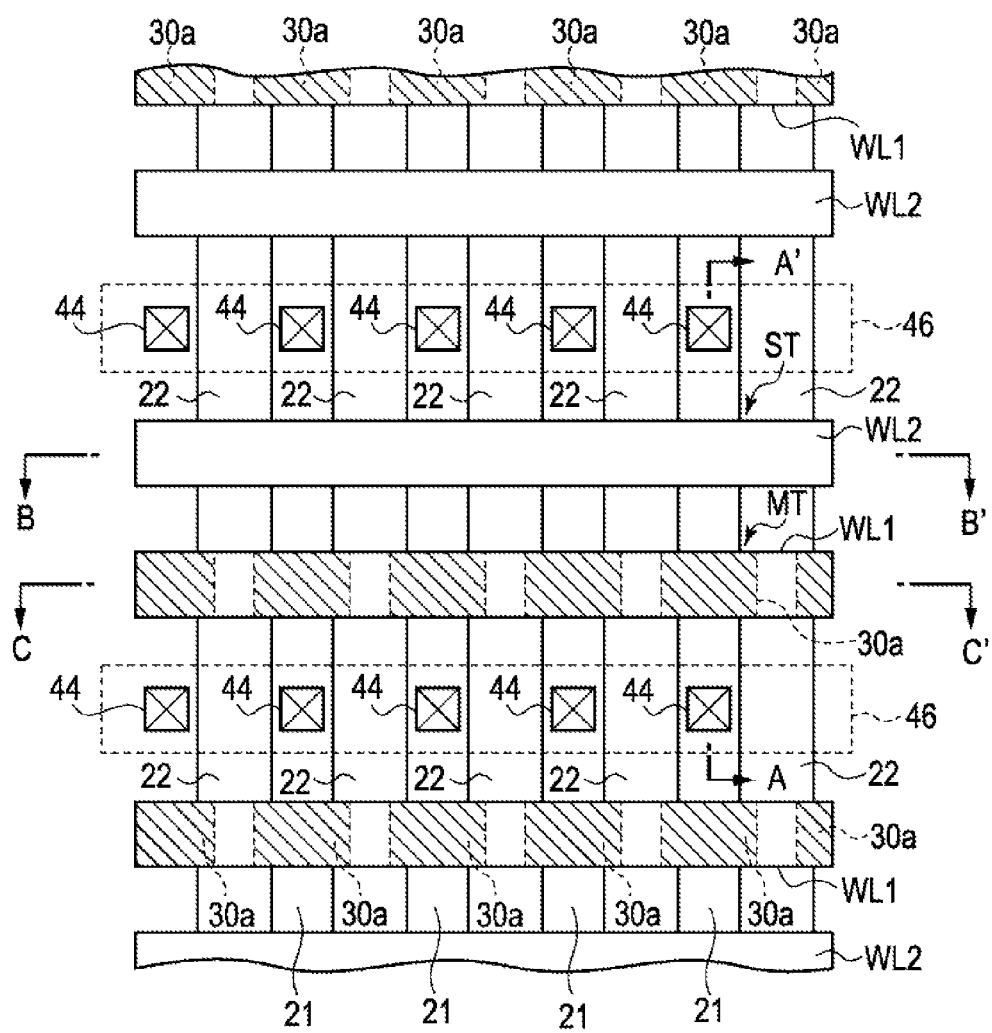
FIG. 2 is a plan view illustrating a memory cell array of the semiconductor device according to the first embodiment.
Figure 3:
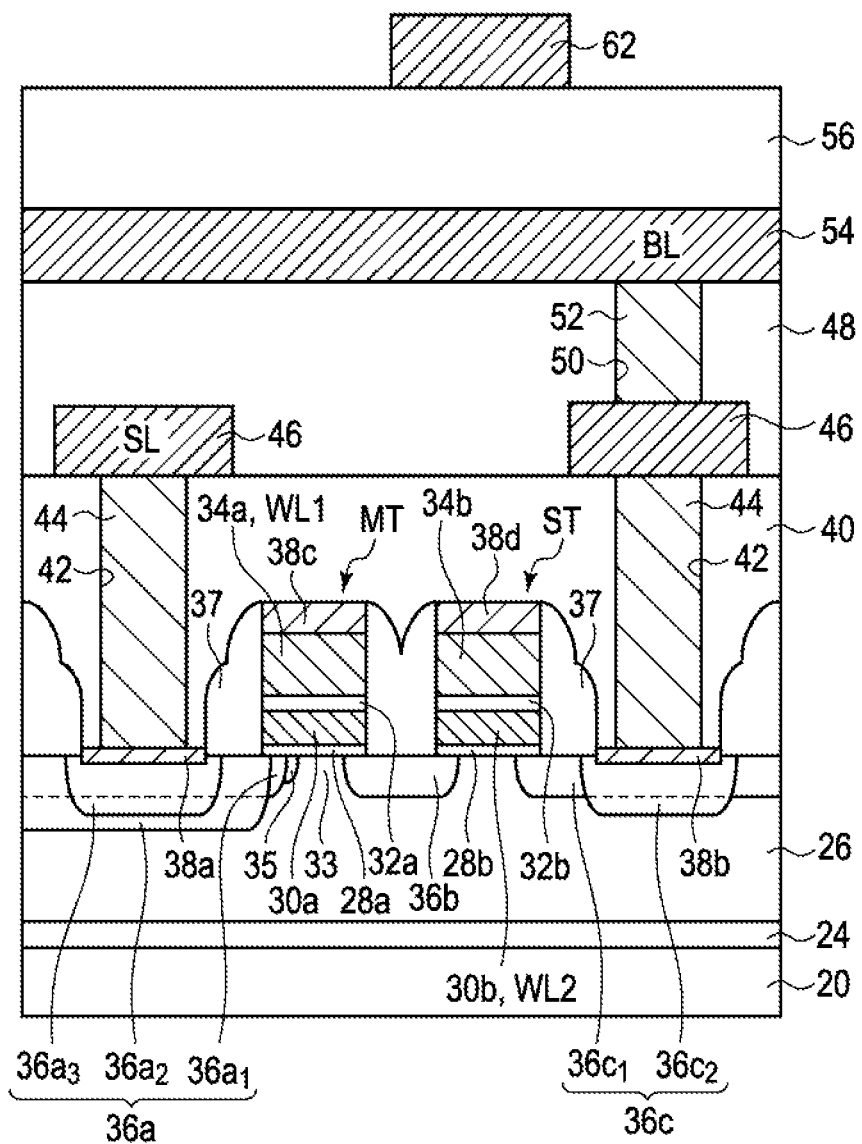
FIG. 3 is a cross-sectional view taken along line A-A' of FIG. 2.
Figure 4:
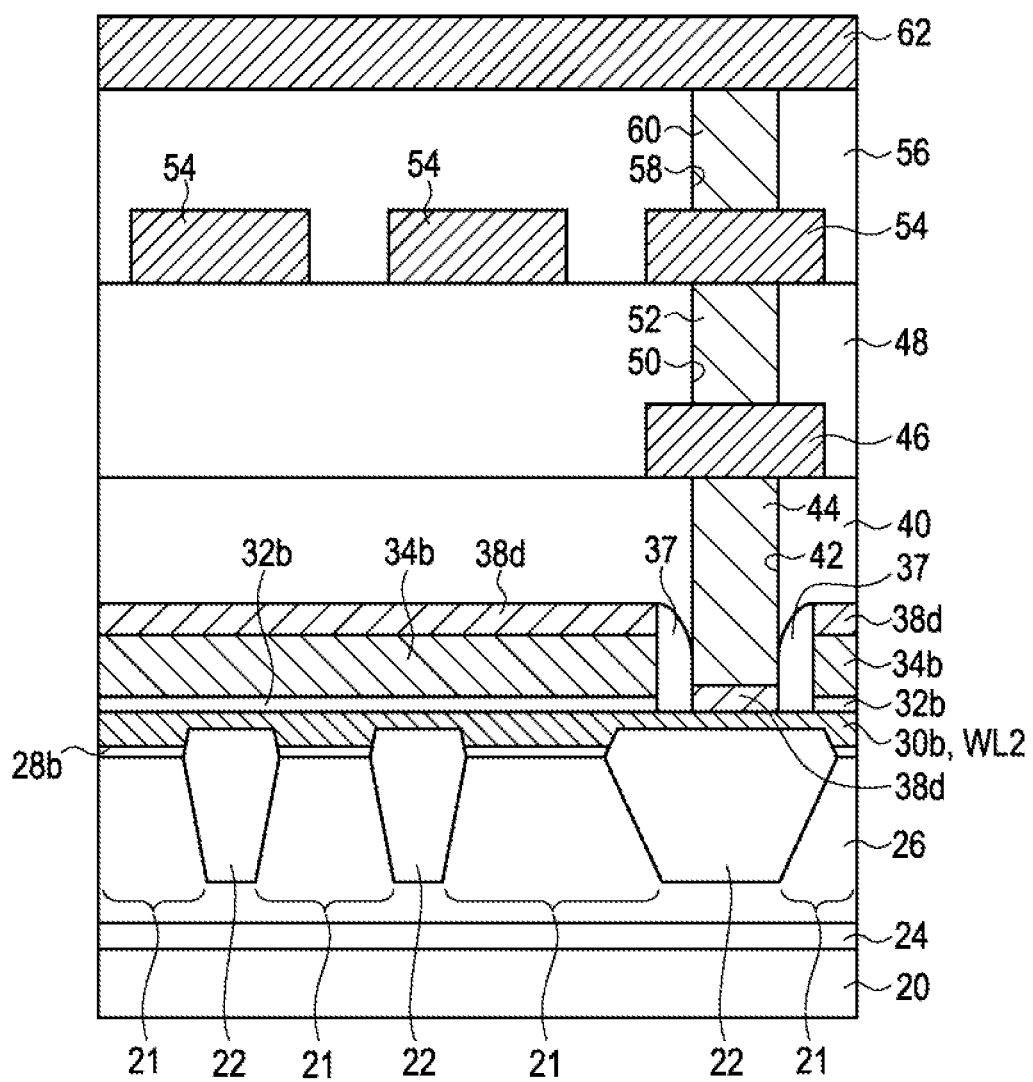
FIG. 4 is a cross-sectional view taken along line B-B' of FIG. 2.
Figure 5:
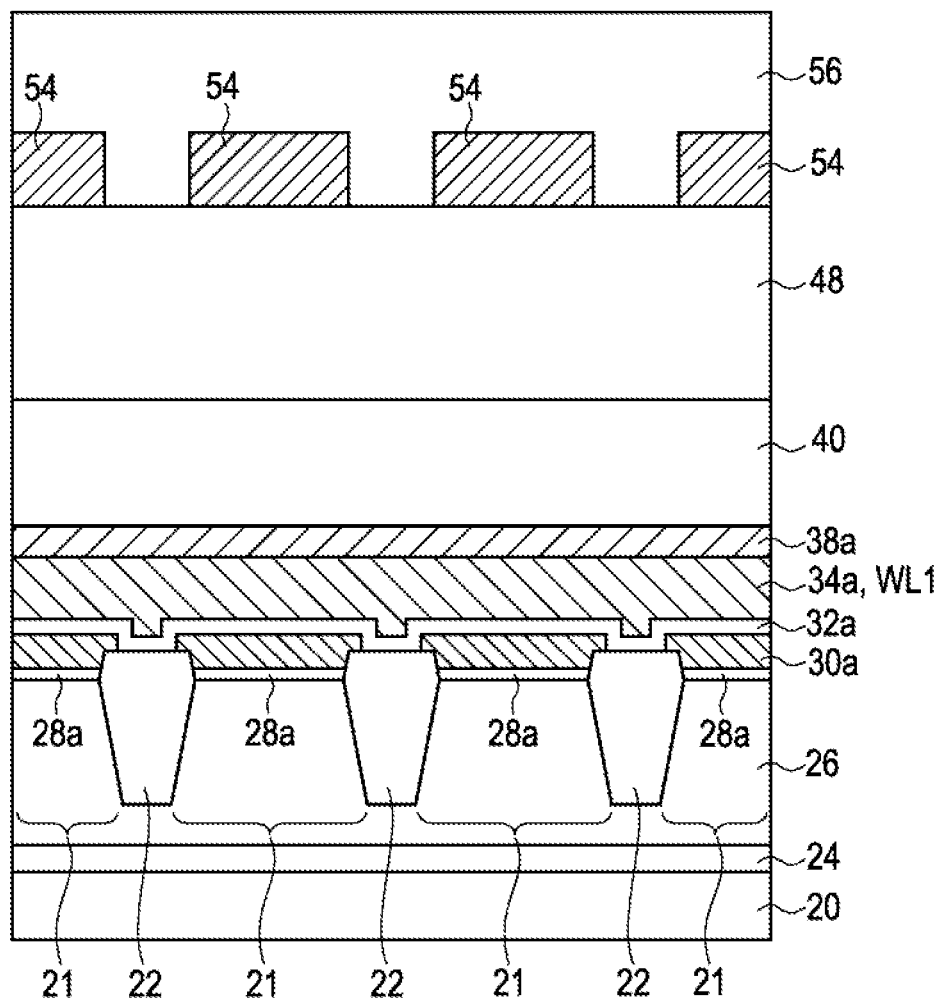
FIG. 5 is a cross-sectional view taken along line C-C' of FIG. 2.
Figure 6:
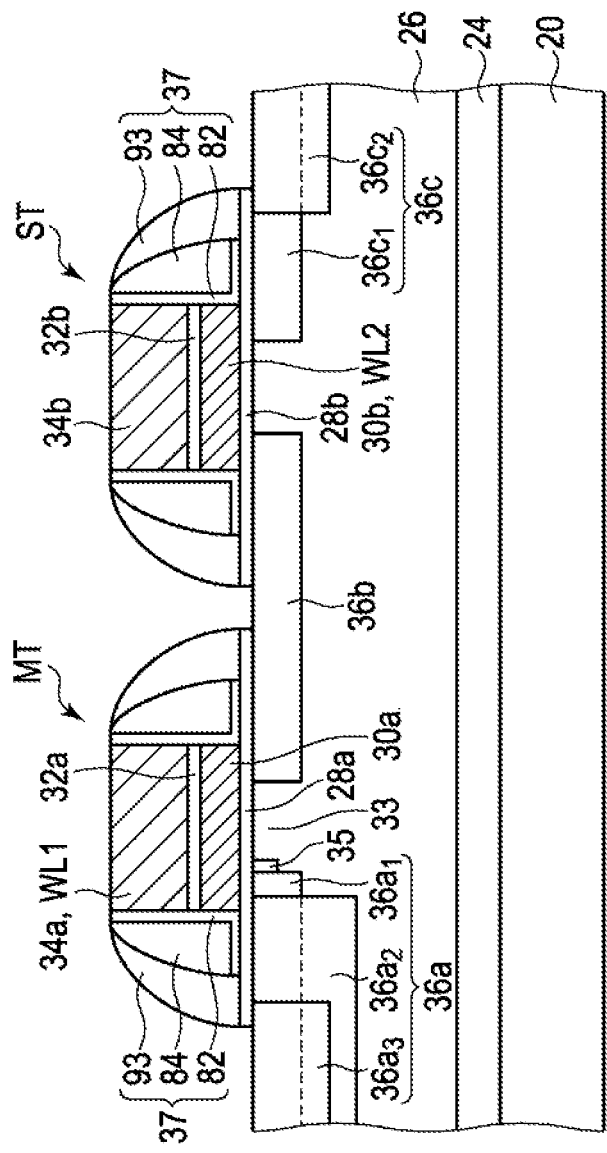
FIG. 6 is an enlarged cross-sectional view illustrating a memory cell transistor and a selecting transistor of the semiconductor device according to the first embodiment.
Figure 8C:
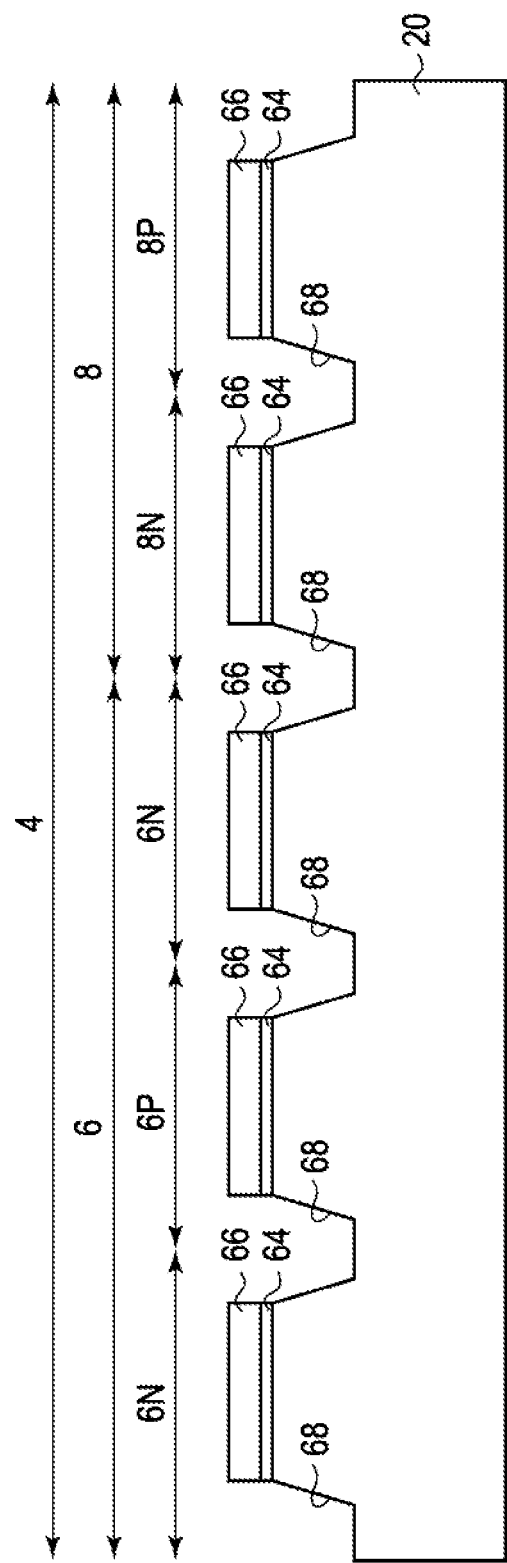

A structure of the memory cell array in the semiconductor device according to the first embodiment will be described with reference to FIGS. 2 to 6. FIG. 2 is a plan view illustrating the memory cell array of the semiconductor device according to the first embodiment. FIG. 3 is a cross-sectional view taken along line A-A' of FIG. 2. FIG. 4 is a cross-sectional view taken along line B-B' of FIG. 2. FIG. 5 is a cross-sectional view taken along line C-C' of FIG. 2. FIG. 6 is an enlarged cross-sectional view illustrating the memory cell transistor and the selecting transistor of the semiconductor device according to the first embodiment.

Element isolation areas 22 which define element areas 21 are formed on the semiconductor substrate 20. A P-type silicon substrate, for example, may be used as the semiconductor substrate 20. The element isolation areas 22 may be formed by, for example, an STI (Shallow Trench Isolation) method.

An N-type embedding diffusion layer 24 is formed in the semiconductor substrate 20 where the element isolation areas 22 are formed. A portion above the N-type embedding diffusion layer 24 is a P-type well 26.

A floating gate 30a is formed on the semiconductor substrate 20 via a tunnel insulating film 28a. Each of the floating gates 30a is electrically separated from each other on each element area 21.

A control gate 34a is formed on the floating gates 30a via an insulating film 32a. The control gates 34a of the memory cell transistors MT present on the same row are connected commonly. In other words, the first word line WL1 which commonly connects the control gates 34a is formed on the floating gates 30a via the insulating films 32a.

Select gates 30b of the selecting transistors ST are formed on the semiconductor substrate 20 in parallel with the floating gates 30a. The select gates 30b of the selecting transistors ST present on the same row are commonly connected. In other words, the second word line WL2 which commonly connects the select gates 30b is formed on the semiconductor substrate 20 via a gate insulating film 28b. The film thickness of the gate insulating film 28b of the selecting transistor ST is equal to the film thickness of the tunnel insulating film 28a of the memory cell transistor MT.

A polysilicon layer 34b is formed on the select gate 30b via an insulating film 32b.

N-type impurity diffusion layers 36a, 36b, and 36c are formed in the semiconductor substrate 20 on both sides of the floating gate 30a and in the semiconductor substrate 20 on both sides of the select gate 30b. The source of the memory cell transistor MT is formed by the impurity diffusion layer 36a. The drain of the memory cell transistor MT and the source of the selecting transistor ST are formed by one impurity diffusion layer 36b. The drain of the selecting transistor ST is formed by the impurity diffusion layer 36c.

The impurity diffusion layer 36a, namely, the source diffusion layer 36a of the memory cell transistor MT is formed by an N-type first impurity diffusion layer $36a_1$, an N-type second impurity diffusion layer $36a_2$, and an N-type third impurity diffusion layer $36a_3$. The source diffusion layer 36a, and the impurity diffusion layer 36b, namely, the drain diffusion layer 36b of the memory cell transistor MT, are arranged in the semiconductor substrate 20 via a P-type channel area 33. A pocket area 35 is formed on the source diffusion layer 36a on the channel area 33 side by the P-type impurity diffusion layer. Details of the first to third impurity diffusion layers $36a_1$, $36a_2$, and $36a_3$ which form the source diffusion layer 36a, and the pocket area 35 will be described later.

The impurity diffusion layer 36c, namely, the drain diffusion layer 36c of the selecting transistor ST is formed by N-type impurity diffusion layers $36c_1$ and $36c_2$.

A side wall insulating film 37 is formed on a side wall portion of a laminated body having the floating gate 30a and the control gate 34a.

The side wall insulating film 37 is formed on a side wall portion of a laminated body having the select gate 30b and the polysilicon layer 34b.

Silicide layers 38a to 38d made of, for example, cobalt silicide are formed on the source diffusion layer 36a of the memory cell transistor MT, on the drain diffusion layer 36c of the selecting transistor ST, on the control gate 34a, and on the polysilicon layer 34b, respectively. The silicide layer 38a on the source diffusion layer 36a functions as a source electrode.

The silicide layer 38c on the drain diffusion layer 36c functions as a drain electrode.

The N-type memory cell transistor MT, which includes the floating gate 30a, the control gate 34a, and the source/drain diffusion layers 36a and 36b are formed on the semiconductor substrate 20 in such a manner.

The selecting transistor ST having the select gate 30b and the source/drain diffusion layers 36b and 36c is formed on the semiconductor substrate 20. The selecting transistor ST is an NMOS transistor. In the first embodiment, since the NMOS transistor whose operating speed is higher than that of a PMOS transistor is used as the selecting transistor, this may contribute to improvement in the operating speed.

An interlayer insulating film 40 composed of a silicon nitride film (not depicted) and a silicon oxide film (not depicted) is formed on the semiconductor substrate 20 on which the memory cell transistor MT and the selecting transistor ST are formed.

Contact holes 42, which reach the source electrode 38a and the drain electrode 38b, are formed on the interlayer insulating film 40.

A conductor plug 44 made of, for example, tungsten is embedded into the contact holes 42.

A wiring (first metal wiring layer) 46 is formed on the interlayer insulating film 40 into which the conductor plug 44 is embedded.

An interlayer insulating film 48 is formed on the interlayer insulating film 40 on which the wiring 46 is formed.

A contact hole 50, which reaches the wiring 46, is formed on the interlayer insulating film 48.

A conductor plug 52 made of, for example, tungsten is embedded into the contact hole 50.

A wiring (second metal wiring layer) 54 is formed on the interlayer insulating film 48 into which the conductor plug 52 is embedded.

An interlayer insulating film 56 is formed on the interlayer insulating film 48 on which the wiring 54 is formed.

A contact hole 58, which reaches the wiring 54, is formed on the interlayer insulating film 56.

A conductor plug 60 made of, for example, tungsten is embedded into the contact hole 58.

A wiring (third metal wiring layer) 62 is formed on the interlayer insulating film 56 into which the conductor plug 60 is embedded.

In such a manner, the memory cell array 10 (see FIG. 1) of the semiconductor device according to the first embodiment is formed.

The impurity diffusion layers of the memory cell MC in the semiconductor device according to the first embodiment will be described below with reference to FIG. 6. FIG. 6 is an enlarged cross-sectional view illustrating the memory cell transistor MT and the selecting transistor ST of the semiconductor device according to the first embodiment.

The floating gate 30a is formed on the semiconductor substrate 20 via the tunnel insulating film 28a. The control gate 34a is formed on the floating gate 30a via the insulating film 32a. The side wall insulating film 37 is formed on the side wall portion of the laminated body having the floating gate 30a and the control gate 34a. The side wall insulating film 37 is formed by a silicon oxide film 82 formed on the side wall portion of the laminated body, a silicon nitride film 84 formed on a side wall portion of the silicon oxide film 82, and a silicon oxide film 93 formed on a side wall portion of the silicon nitride film 84.

The select gate 30b of the selecting transistor ST is formed on the semiconductor substrate 20 in parallel with the floating gate 30a. The polysilicon layer 34b is formed on the select gate 30b via the insulating film 32b. Further, the side wall insulating film 37 is formed on the side wall portion of the laminated body having the select gate 30b and the polysilicon layer 34b. The side wall insulating film 37 is formed by a silicon oxide film 82 formed on the side wall portion of the laminated body, the silicon nitride film 84 formed on the side wall portion of the silicon oxide film 82, and the silicon oxide film 93 formed on the side wall portion of the silicon nitride film 84.

The source diffusion layer 36a and the drain diffusion layer 36b of the memory cell transistor MT are formed in the semiconductor substrate 20 on both sides of the floating gate 30a. The source diffusion layer 36b and the drain diffusion layer 36c of the selecting transistor ST are formed in the semiconductor substrate 20 on both sides of the select gate 30b.

As described above, the source diffusion layer 36a of the memory cell transistor MT is formed by the N-type first to third impurity diffusion layers $36a_1$, $36a_2$, and $36a_3$. The drain diffusion layer 36b of the memory cell transistor MT and the source diffusion layer 36b of the selecting transistor ST are formed by the same N-type impurity diffusion layer 36b. The drain diffusion layer 36c of the selecting transistor ST is formed by the N-type impurity diffusion layer $36c_1$ and the deeper impurity diffusion layer $36c_2$ whose impurity density is higher than that of the impurity diffusion layer $36c_1$.

An end portion of the floating gate 30a of the first impurity diffusion layer $36a_1$ is positioned below the floating gate 30a. The first impurity diffusion layer $36a_1$ overlaps with the floating gate 30a. A depth of the first impurity diffusion layer $36a_1$ is substantially the same as the depths of the impurity diffusion layers 36b and $36c_1$. The impurity density of the first impurity diffusion layer $36a_1$ on the end portion of the floating gate 30a side is substantially the same as the impurity density of the impurity diffusion layers 36b and $36c_1$.

The second impurity diffusion layer $36a_2$ is formed so as to be deeper than the first impurity diffusion layer $36a_1$. The end portion of the second impurity diffusion layer $36a_2$ on the floating gate 30a side is positioned below the floating gate 30a, and positioned on the portion of the first impurity diffusion layer $36a_1$ closer to a peripheral edge of the floating gate 30a than the end portion on the floating gate 30a side. That is, the end portion of the first impurity diffusion layer $36a_1$ on the floating gate 30a side is positioned between the end portion of the second impurity diffusion layer $36a_2$ on the floating gate 30a side and the channel area 33. In such a manner, the second impurity diffusion layer $36a_2$ overlaps with the floating gate 30a. A square area of the area where the second impurity diffusion layer $36a_2$ overlaps with the floating gate 30a is smaller than a square area of the area where the first impurity diffusion layer $36a_1$ overlaps with the floating gate 30a. The impurity density of the portion of the second impurity diffusion layer $36a_2$ which is deeper than the first impurity diffusion layer $36a_1$ and is not formed with the third impurity diffusion layer $36a_3$ is lower than the impurity density of the end portion of the first impurity diffusion layer $36a_1$ on the floating gate 30a side. That is, the impurity density on the portion of the second impurity diffusion layer $36a_2$ deeper than the third impurity diffusion layer $36a_3$ is lower than the impurity density on the end portion of the first impurity diffusion layer $36a_1$ on the floating gate 30a side.

The third impurity diffusion layer $36a_3$ is formed in the second impurity diffusion layer $36a_2$ whose impurity density is lower than that of the third impurity diffusion layer $36a_3$. The third impurity diffusion layer $36a_3$ is formed so as to be deeper than the first impurity diffusion layer $36a_1$ and shallower than the second impurity diffusion layer $36a_2$. The end portion of the third impurity diffusion layer $36a_3$ on the floating gate side 30a is positioned below the silicon oxide film 93 of the side wall insulating film 37. The impurity density of the third impurity diffusion layer $36a_3$ is higher than the impurity density on the end portion of the first impurity diffusion layer $36a_1$ on the floating gate 30a side. Further, the impurity density of the third impurity diffusion layer $36a_3$ is higher than the impurity density on the portion of the second impurity diffusion layer $36a_2$, which is deeper than the first impurity diffusion layer $36a_1$, and is not formed with the third impurity diffusion layer $36a_3$. That is, the impurity density of the third impurity diffusion layer $36a_3$ is higher than the impurity density on the portion of the second impurity diffusion layer $36a_2$ which is deeper than the third impurity diffusion layer $36a_3$. Further, the third impurity diffusion layer $36a_3$ is formed so as to have substantially the same impurity density and depth as the impurity density and depth of the impurity diffusion layer $36c_2$.

The third impurity diffusion layer $36a_3$ may be formed so as to be shallower than not only the second impurity diffusion layer $36a_2$ but also the first impurity diffusion layer $36a_1$.

In such a manner, the source diffusion layer 36a of the memory cell transistor MT is formed by the first to third impurity diffusion layers $36a_1$, $36a_2$, and $36a_3$ whose depth and impurity density vary. In the memory cell transistor MT, the source diffusion layer 36a and the drain diffusion layer 36b are formed asymmetrically on the semiconductor substrate 20 via the P-type channel area 33.

The P-type pocket area 35 is formed on the side of the first impurity diffusion layer $36a_1$ on the channel area 33 side on the source diffusion layer 36a by a P-type impurity diffusion layer. The pocket area 35 is formed so as to be shallower than the first impurity diffusion layer $36a_1$.

In the semiconductor device according to the first embodiment, the source diffusion layer 36a of the memory cell transistor MT has the second impurity diffusion layer $36a_2$ which is deeper than the first and third impurity diffusion layers $36a_1$ and $36a_3$. The impurity density on the portion of the second impurity diffusion layer $36a_2$ deeper than the third impurity diffusion layer $36a_3$ is lower than the impurity densities on the end portion of the first impurity diffusion layer $36a_1$ on the floating gate 30a side and on the third impurity diffusion layer $36a_3$.

In the semiconductor device according to the first embodiment, the second impurity diffusion layer $36a_2$ which is deeper than the first and third impurity diffusion layers $36a_1$ and $36a_3$ and whose impurity density is comparatively low is formed on the source diffusion layer 36a. For this reason, an electric field on the lower end portion of the source diffusion layer 36a may be alleviated. As a result, when information is written into the selected memory cell transistor MT, generation of carriers (electrons) may be reduced near the source diffusion layers 36a of the non-selected memory cell transistors MT connected to the same source line SL. Therefore, implantation of electrons into the floating gates 30a of the non-selected memory cell transistors MT may be suppressed. As a result, according to the first embodiment, erroneous writing of information into the non-selected memory cell transistors MT may be reduced.

In the semiconductor device according to the first embodiment, the P-type pocket area 35, which is shallower than the first impurity diffusion layer $36a_1$, is formed on the first impurity diffusion layer $36a_1$ on the channel area 33 side. Since the P-type pocket area 35 is formed, dispersion of a depletion layer from the N-type source diffusion layer 36a is suppressed. When the dispersion of the depletion layer from the N-type source diffusion layer 36a is suppressed, field strength becomes strong near the N-type source diffusion layer 36a, and a carrier may be accelerated abruptly on the N-type source diffusion layer 36a on the channel area 33 side. In the first embodiment, since the carrier may be accelerated abruptly, the writing speed of information into the selected memory cell transistor MT may be increased.

Furthermore, since the P-type pocket area 35 is formed so as to be shallower than the first impurity diffusion layer $36a_1$, the field strength on the lower end portion of the source diffusion layer 36a is not strengthened by the pocket area 35. Therefore, according to the first embodiment, the erroneous writing of information into the non-selected memory cell transistors MT is reduced, and also the writing speed of information into the selected memory cell transistor MT may be improved.

(Operation of the Semiconductor Device)

A method for operating the semiconductor device according to the first embodiment will be described below with reference to FIG. 7. FIG. 7 is a diagram illustrating a reading method, a writing method, and an erasing method of the semiconductor device according to the first embodiment. The electric potentials of non-selected lines are depicted in parenthesis in FIG. 7. In FIG. 7, F indicates floating.

(Reading Method)

The reading method of the semiconductor device according to the first embodiment will be described with reference to FIG. 7.

When information written into the memory cell transistor MT is read, the electric potentials of the respective sections are set as follows. That is, the electric potential of the bit line BL connected to the memory cell MC to be selected is set to $V_{CC}$. On the other hand, the electric potentials of the bit lines BL other than the selected bit line are set to 0 V. All the electric potentials of the source lines SL are set to 0 V. All the electric potentials of the first word lines WL1 are always set to $V_{CC}$ at reading standby time. The electric potential of the second word line WL2 connected to the memory cell MC to be selected is set to $V_{CC}$. On the other hand, the electric potentials of the second word lines WL2 other than the selected second word line WL2 are set to 0 V. The electric potentials of the wells 26 are set to 0 V. In the first embodiment, the electric potentials of the source lines SL are set to 0 V at reading standby time, and the electric potentials of the first word lines WL1 are always set to $V_{CC}$ at the reading standby time. For this reason, the information written into the memory cell transistor MT may be read only by controlling the electric potentials of the bit lines BL and the electric potentials of the second word lines WL2. In the first embodiment, when the column decoder 12 which controls the electric potentials of the bit lines BL is the low-voltage circuit as described above, the bit lines BL are controlled at a high speed. When the second row decoder 16, which controls the electric potentials of the second word lines WL2, is the low-voltage circuit, the second word lines WL2 are controlled at a high speed. For this reason, according to the first embodiment, information written into the memory cell transistor MT may be read at a high speed.

When information is written into the memory cell transistor MT, namely, when information of the memory cell transistor MT is "1", charges are accumulated on the floating gate 30a of the memory cell transistor MT. In this case, an electric current is not applied between the source diffusion layer 36a of the memory cell transistor MT and the drain diffusion layer 36c of the selecting transistor ST, and an electric current is not applied to the one selected bit line BL. In this case, the information of the memory cell transistor MT is determined as "1".

On the other hand, when information written into the memory cell transistor MT is erased, namely, the information of the memory cell is "0", charges are not accumulated on the floating gate 30a of the memory cell transistor MT. In this case, an electric current is applied between the source diffusion layer 36a of the memory cell transistor MT and the drain diffusion layer 36c of the selecting transistor ST, and an electric current is applied to the one selected bit line BL. The electric current applied to the one selected bit line BL is detected by the sense amplifier 13. In this case, the information of the memory cell transistor MT is determined as "0".

(Writing Method)

The writing method of the semiconductor device according to the first embodiment will be described below with reference to FIG. 7.

When information is written into the memory cell transistor MT, the electric potentials of the respective sections are set as follows. That is, the electric potential of the bit line BL connected to the memory cell MC to be selected is set to 0 V. On the other hand, the electric potentials of the bit lines BL other than the selected bit line BL are set to be floating. The electric potential of the source line SL connected to the memory cell MC to be selected is set to, for example, 5 V (second potential). On the other hand, the electric potentials of the source lines SL other than the selected source line SL are set to 0 V or to be floating. The electric potential of the first word line WL1 connected to the memory cell MC to be selected is set to, for example, 9 V (third potential). On the other hand, the electric potentials of the first word lines WL1 other than the selected first word line WL1 are set to 0 V or to be floating. The electric potential of the second word line WL2 connected to the memory cell MC to be selected is set to $V_{CC}$ (first potential). On the other hand, the electric potentials of the second word lines WL2 other than the selected second word line WL2 are set to be floating. The electric potentials of the wells are set to 0 V.

When the electric potentials of the respective sections are set as described above, an electric current is applied between the source diffusion layer 36a of the memory cell transistor MT and the drain diffusion layer 36c of the selecting transistor ST, and electrons are implanted from the source side into the floating gate 30a of the memory cell transistor MT. As a result, charges are accumulated on the floating gate 30a of the memory cell transistor MT so that information is written into the memory cell transistor MT.

In the first embodiment, the second impurity diffusion layer $36a_2$ which is deeper than the first and third impurity diffusion layers $36a_1$ and $36a_3$ and whose impurity density is comparatively low is formed on the source diffusion layer 36a of the memory cell transistor MT. For this reason, an electric field on the lower end portion of the source diffusion layer 36a may be alleviated. As a result, when information is written into the selected memory cell transistor MT, generation of carriers (electrons) may be reduced near the source diffusion layers 36a of the other memory cell transistors MT into which information is not written and which are connected to the same source line SL. Therefore, the implantation of electrons into the floating gates 30a of the other memory cell transistors MT may be suppressed. As a result, according to the first embodiment, erroneous writing of information into the other memory cell transistors MT into which information is not written may be reduced.

In the first embodiment, the P-type pocket area 35, which is shallower than the first impurity diffusion layer $36a_1$, is formed on the first impurity diffusion layer $36a_1$ on the channel area 33 side. Since the P-type pocket area 35 is formed, dispersion of a depletion layer from the N-type source diffusion layer 36a is suppressed. When the dispersion of the depletion layer from the N-type source diffusion layer 36a is suppressed, the field strength becomes strong near the N-type source diffusion layer 36a, and carriers may be accelerated abruptly on the N-type source diffusion layer 36a on the channel area 33 side. In the first embodiment, since the carrier may be accelerated abruptly, the writing speed of information into the memory cell transistor MT may be increased.

Furthermore, since the P-type pocket area 35 is formed so as to be shallower than the first impurity diffusion layer $36a_1$, the field strength on the lower end portion of the source diffusion layer 36a is not strengthened. Therefore, according to the first embodiment, the erroneous writing of information is reduced, and also the writing speed of information into the memory cell transistor MT may be improved.

(Erasing Method)

The erasing method of the semiconductor device according to the first embodiment will be described below with reference to FIG. 7.

When information written into the memory cell array 10 is erased, the electric potentials of the respective sections are set as follows. That is, all the electric potentials of the bit lines BL are set to be floating. All the electric potentials of the source lines SL are set to be floating. All the electric potentials of the first word lines WL are set to, for example, −9 V. All the electric potentials of the second word lines WL2 are set to be floating. All the electric potentials of the wells 26 are set to, for example, +9 V.

When the electric potentials of the respective sections are set as described above, charges are drawn out of the floating gate 30a of the memory cell transistor MT. As a result, the charges are not accumulated on the floating gate 30a of the memory cell transistor MT, so that information in the memory cell transistor MT is erased.

(Method for Fabricating the Semiconductor Device)

The method for fabricating the semiconductor device according to the first embodiment will be described below with reference to FIGS. 8 to 29. FIGS. 8 to 29 are cross-sectional views illustrating processes of the method for fabricating the nonvolatile semiconductor storage device according to the first embodiment.

FIGS. 8A to 8C, FIGS. 9A to 9C, FIGS. 10A to 10C, FIGS. 11A to 11C, FIGS. 12A to 12C, FIGS. 13A to 13C, FIGS. 14A to 14C, FIGS. 15A to 15C, FIGS. 16A to 16C, FIGS. 17A to 17C, FIGS. 18A to 18C, FIGS. 19A to 19C, FIGS. 20A to 20C, FIGS. 21A to 21C, FIGS. 22A to 22C, FIGS. 23A to 23C, FIGS. 24A to 24C, FIGS. 25A to 25C, and FIGS. 26A to 26C depict a memory cell array area (core area) 2.

FIGS. 8A, 9A, 10A, 11A, 12A, 13A, 14A, 15A, 16A, 17A, 18A, 19A, 20A, 21A, 22A, 23A, 24A, 25A and 26A correspond to the cross-sectional view taken along line C-C' in FIG. 2.

FIGS. 8B, 9B, 10B, 11B, 12B, 13B, 14B, 15B, 16B, 17B, 18B, 19B, 20B, 21B, 22B, 23B, 24B, 25B and 26B correspond to the cross-sectional view taken along line A-A' in FIG. 2.

FIGS. 8C, 9C, 10C, 11C, 12C, 13C, 14C, 15C, 16C, 17C, 18C, 19C, 20C, 21C, 22C, 23C, 24C, 25C and 26C depict a peripheral circuit area 4.

Left sides in FIGS. 8C, 9C, 10C, 11C, 12C, 13C, 14C, 15C, 16C, 17C, 18C, 19C, 20C, 21C, 22C, 23C, 24C, 25C and 26C depict an area 6 where a high-withstand voltage transistor is formed. Left sides of the figures depicting the area 6 where the high-withstand voltage transistor is formed depicts an area 6N where a high-withstand voltage N channel transistor is formed. The right side of the figures depicting the area 6 where the high-withstand voltage transistor is formed depicts an area 6P where a high-withstand voltage P-channel transistor is formed.

Right sides of the FIGS. 8C, 9C, 10C, 11C, 12C, 13C, 14C, 15C, 16C, 17C, 18C, 19C, 20C, 21C, 22C, 23C, 24C, 25C and 26C show an area 8 where a low-voltage transistor is formed. The left sides of the figures depicting the area 8 where the low-voltage transistor is formed depict an area 8N where a low-voltage N-channel transistor is formed. The right sides of the figures in the area 8 where the low-voltage transistor is formed depict an area 8P where a low-voltage P-channel transistor is formed.

The semiconductor substrate 20 is prepared. For example, a P-type silicon substrate is prepared as the semiconductor substrate 20.

A thermally-oxidized film 64 with a film thickness of 15 nm is formed on the entire surface by, for example, a thermal oxidation method.

A silicon nitride film 66 with a film thickness of 150 nm is then formed on the entire surface by, for example, a CVD method.

A photoresist film (not depicted) is then formed on the entire surface by, for example, a spin-coating method.

An opening portion (not depicted) is formed on the photoresist film by using a photolithography technique. The opening portion is for patterning the silicon nitride film 66.

The silicon nitride film 66 is patterned by using the photoresist film as a mask. As a result, a hard mask 66 composed of the silicon nitride film is formed.

The semiconductor substrate 20 is etched by dry etching using the hard mask 66 as a mask. As a result, a groove 68 is formed on the semiconductor substrate 20 (see FIG. 8). A depth of the groove 68 to be formed on the semiconductor substrate 20 is, for example, 400 nm from the surface of the semiconductor substrate 20.

An exposed portion of the semiconductor substrate 20 is oxidized by the thermal oxidation method. As a result, a silicon oxide film (not depicted) is formed on the exposed portion of the semiconductor substrate 20.

As illustrated in FIGS. 9A to 9C, the silicon oxide film 22 with a film thickness of 700 nm is formed on the entire surface by a high-density plasma CVD method.

Figure 10C:
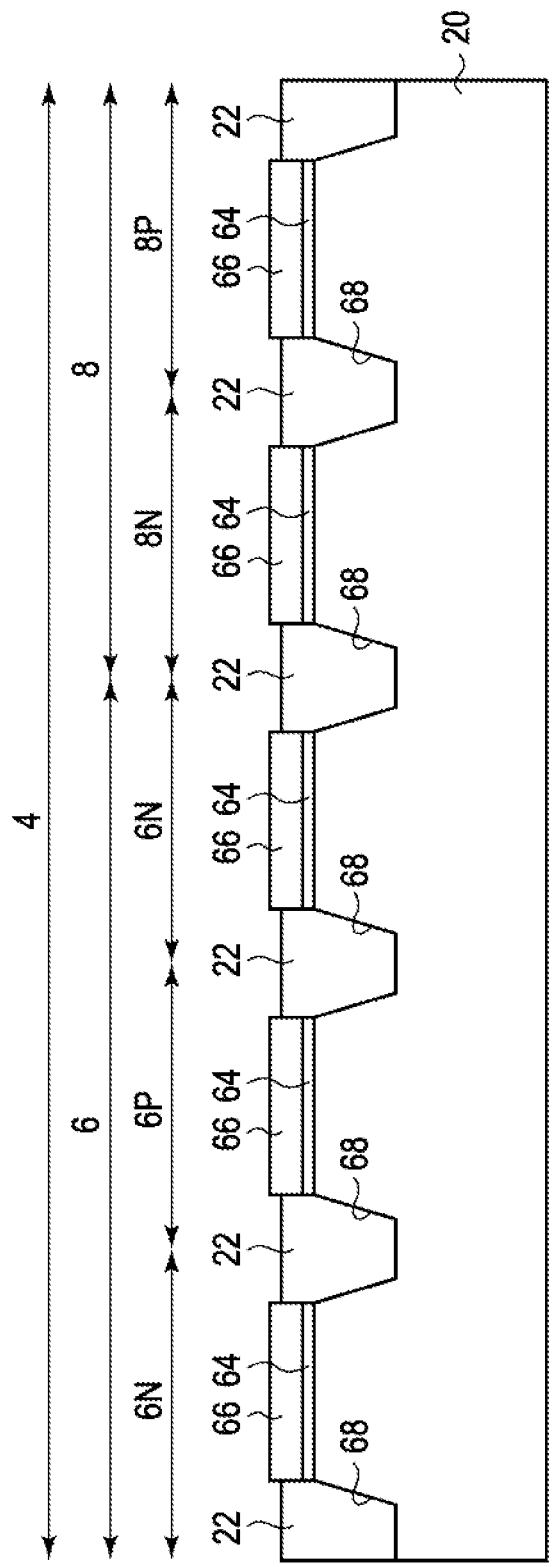

As illustrated in FIGS. 10A to 10C, the silicon oxide film 22 is polished by a CMP (Chemical Mechanical Polishing) method until the surface of the silicon nitride film 66 is exposed. As a result, the element isolation area 22 is formed by the silicon oxide film.

Heat treatment is performed in order to harden the element isolation area 22. The heat treatment conditions are, for example, 900° C. and 30 minutes in nitrogen atmosphere.

The memory cell array area 2 is channel-doped (not depicted).

The silicon nitride film 66 is removed by wet etching using thermal phosphoric acid, for example.

As illustrated in FIGS. 11A to 11C, a sacrificial oxide film 69 is grown on the surface of the semiconductor substrate 20 by the thermal oxidation method.

Figure 12C:
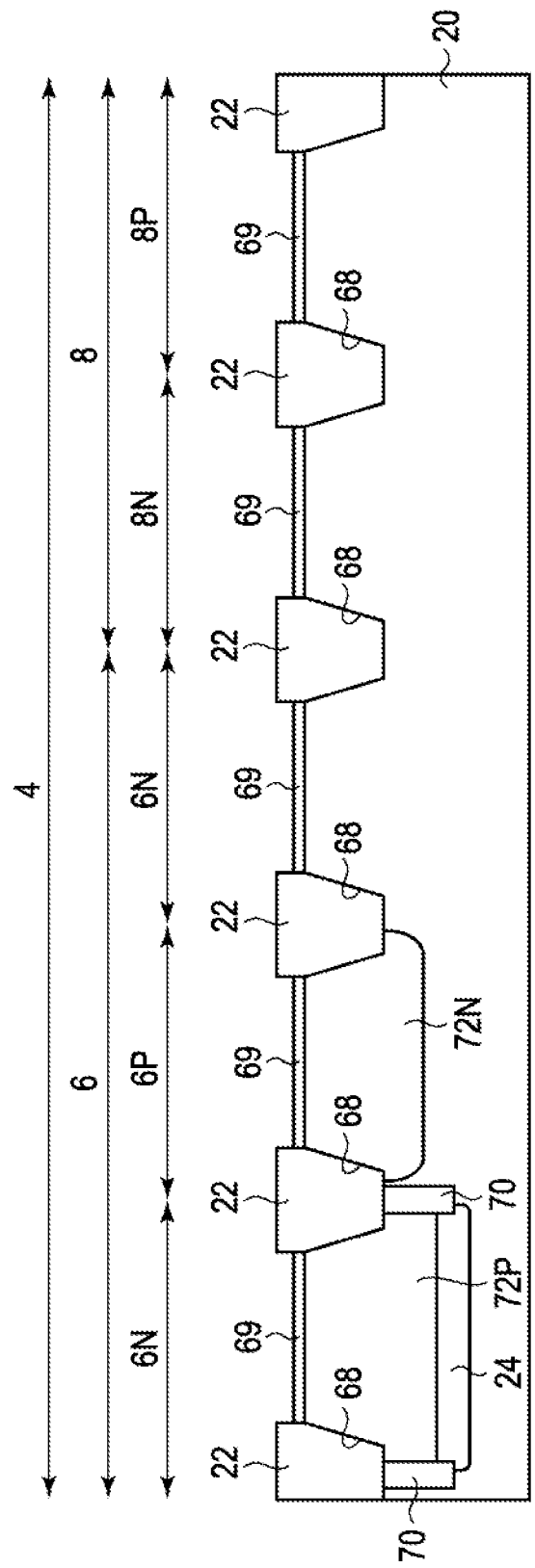
Figure 13C:
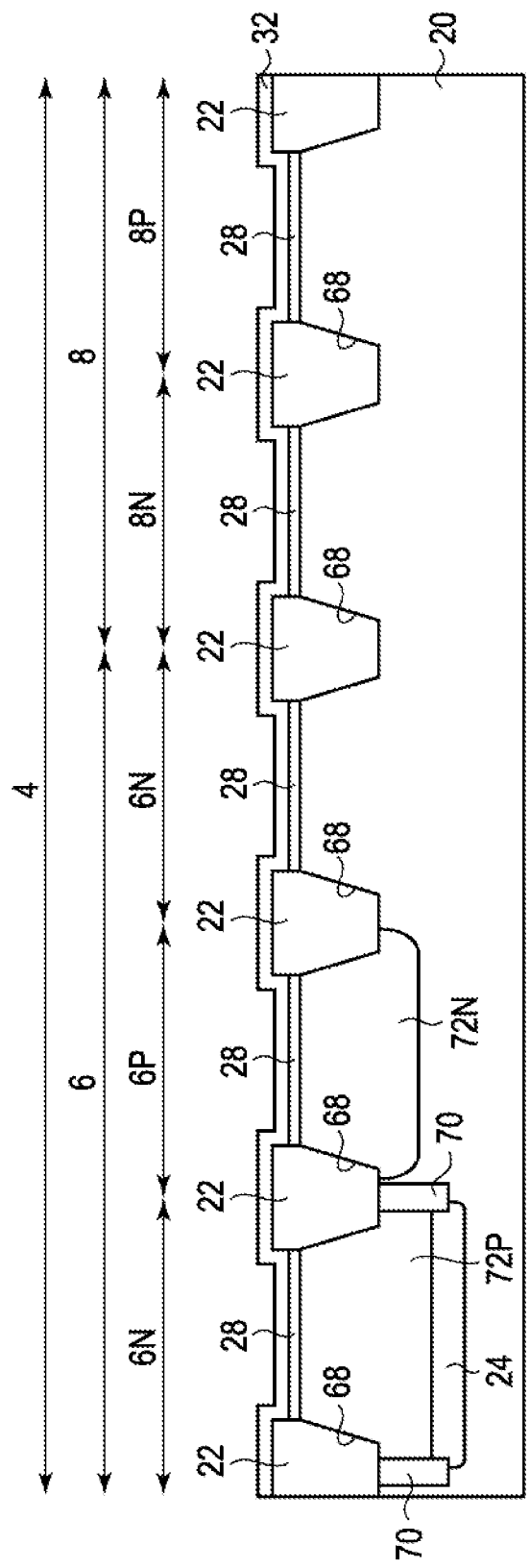

As illustrated in FIGS. 12A to 12C, an N-type dopant impurity is implanted deeply into the memory cell array area 2, so that the N-type embedding diffusion layer 24 is formed. An upper portion of the embedding diffusion layer 24 becomes the P-type well 26. At this time, N-type dopant impurity is implanted deeply also into the area 6N where the high-withstand voltage N-channel transistor is formed, so that the N-type embedding diffusion layer 24 is formed.

An N-type embedding diffusion layer 70 is then formed into a frame shape on the area 6N where the high-withstand voltage N-channel transistor is formed. The frame-shaped embedding diffusion layer 70 is formed so as to cover the surface of the semiconductor substrate 20 to the peripheral edge of the embedding diffusion layer 24. The area surrounded by the embedding diffusion layer 24 and the embedding diffusion layer 70 becomes a P-type well 72P.

An N-type dopant impurity is introduced into the area 6P where the high-withstand voltage P-channel transistor is formed, so that an N-type well 72N is formed.

Channel doping is performed on the area 6N where the high-withstand voltage N-channel transistor is formed and the area 6P where the high-withstand voltage P-channel transistor is formed (not depicted).

The sacrificial oxide film 69 present on the surface of the semiconductor substrate 20 is etched off.

A tunnel insulating film 28 with a film thickness of 10 nm is then formed on the entire surface by the thermal oxidation method.

A polysilicon film 30 with a film thickness of 90 nm is formed on the entire surface by the CVD method. A polysilicon film into which impurity is doped is formed as the polysilicon film 30.

The polysilicon film 30 present on the peripheral circuit area 4 is etched off.

An insulating film (ONO film) 32 composed by sequentially laminating a silicon oxide film, a silicon nitride film, and a silicon oxide film is formed on the entire surface. The insulating film 32 is for insulating the floating gate 30a and the control gate 34a (see FIGS. 13A to 13C).

Figure 14C:
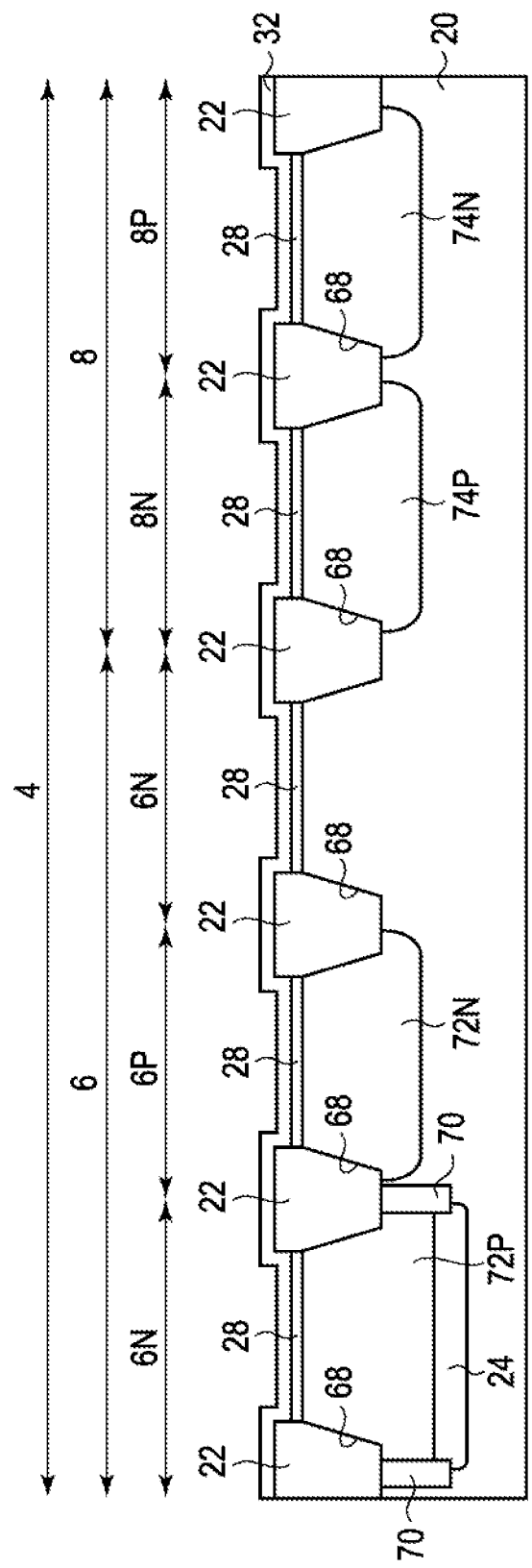

As illustrated in FIGS. 14A to 14C, a P-type dopant impurity is introduced into the area 8N where the low-voltage N-channel transistor is formed, so that a P-type well 74P is formed.

An N-type dopant impurity is introduced into the area 8P where the low-voltage P-channel transistor is formed so that an N-type well 74N is formed.

Channel doping is performed on the area 8N where the low-voltage N-channel transistor is formed and the area 8P where the low-voltage P-channel transistor is formed (not depicted).

The insulating film (ONO film) 32 present on the peripheral circuit area 4 is etched off.

A gate insulating film 76 with a film thickness of 15 nm is formed on the entire surface by the thermal oxidation method.

The gate insulating film 76 present on the area 8 where the low-voltage transistor is formed is removed by wet etching.

A gate insulating film 78 with a film thickness of 3 nm is then formed on the entire surface by the thermal oxidation method. As a result, the gate insulating film with the film thickness of 3 nm is formed on the area 8 where the low-voltage transistor is formed. On the other hand, the film thickness of the gate insulating film 76 on the area 6 where the high-withstand voltage transistor is formed becomes about 16 nm, for example.

A polysilicon film 34 with a film thickness of 180 nm is then formed on the entire surface by the CVD method.

Figure 15C:
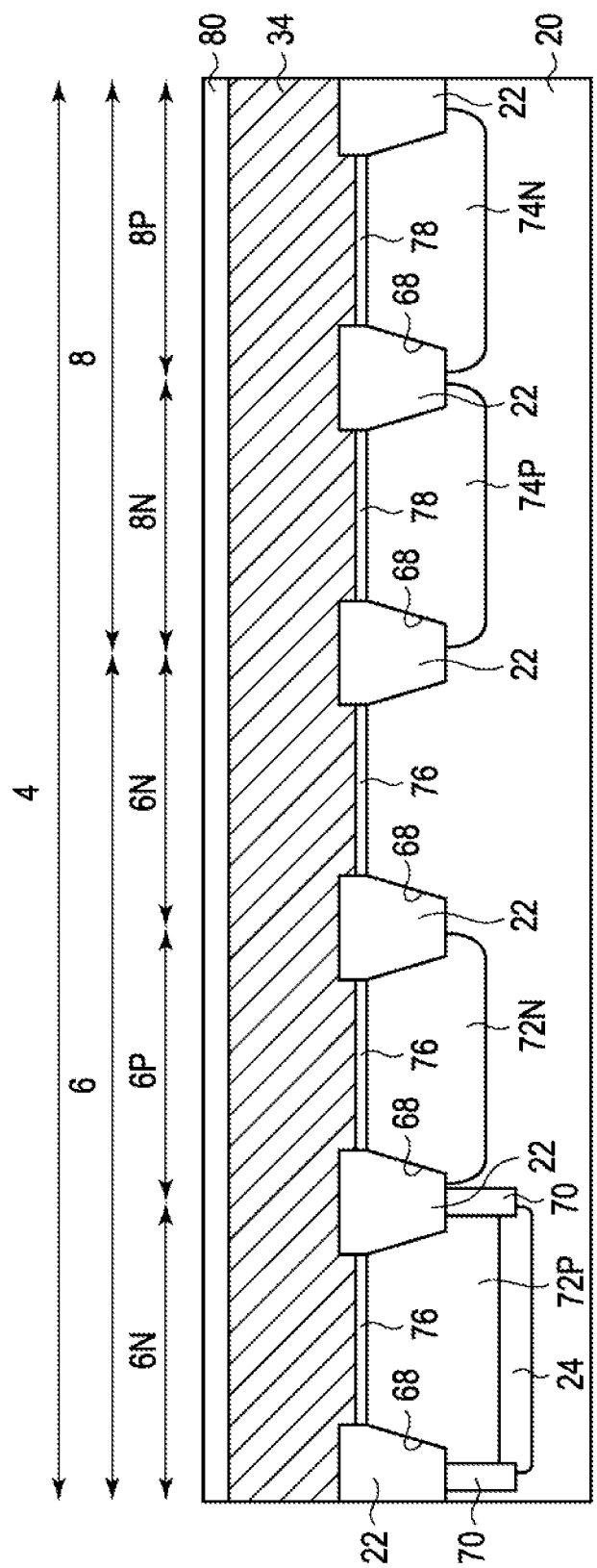

An antireflection film 80 is formed on the entire surface (see FIGS. 15A to 15C).

Figure 16B:
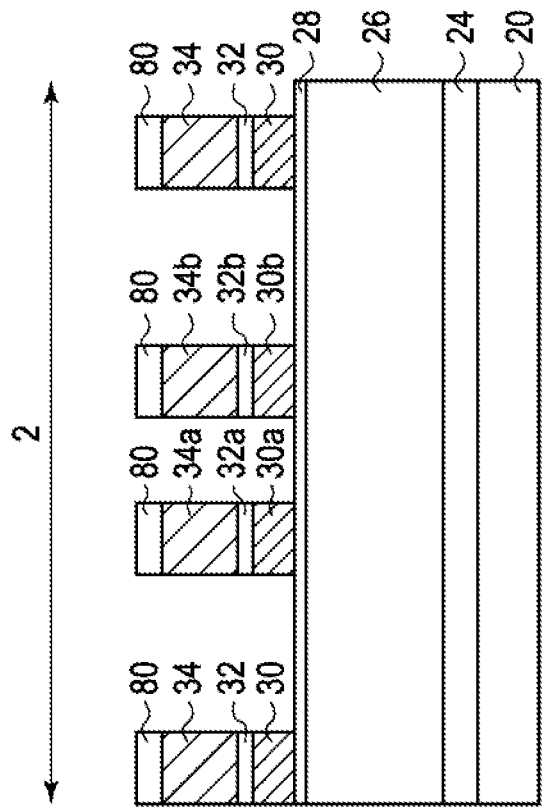
Figure 16A:
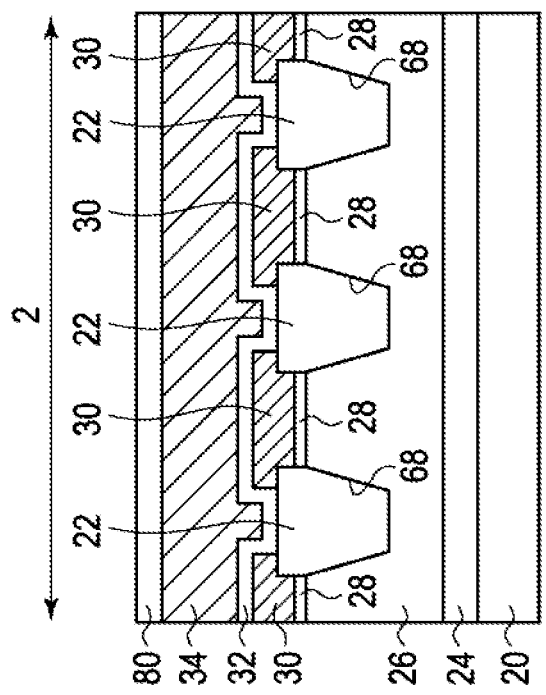
Figure 19C:
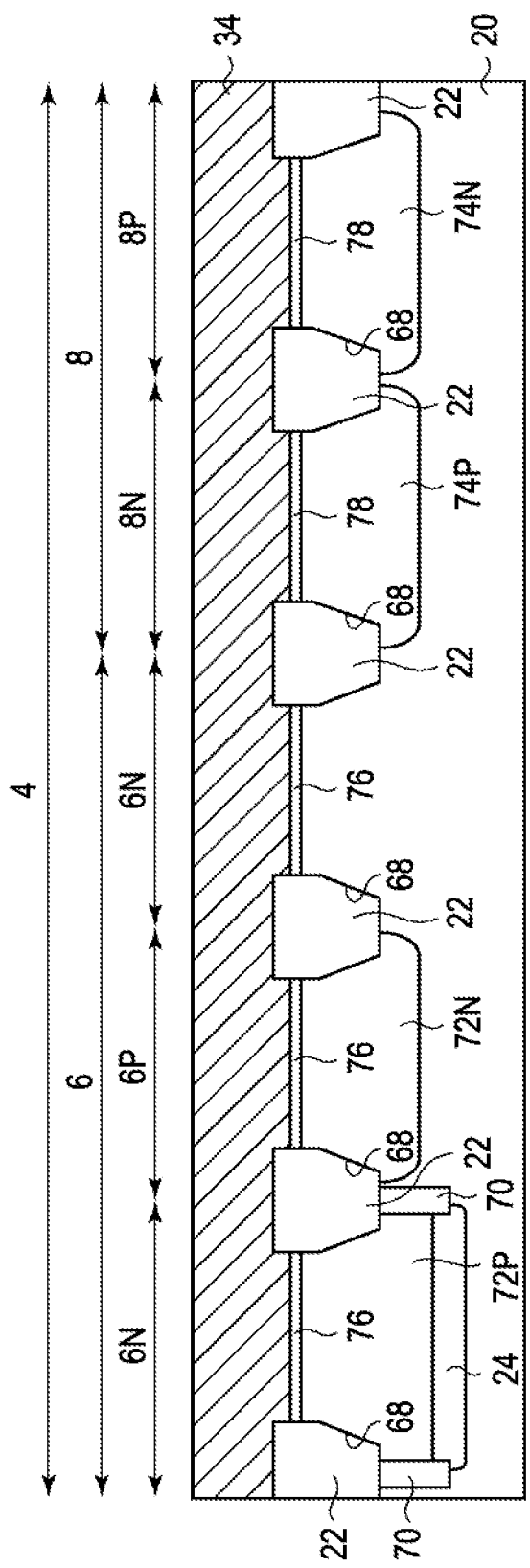

As illustrated in FIGS. 16A to 16C, the antireflection film 80, the polysilicon film 34, the insulating film 32, and the polysilicon film 30 are dry-etched by using photolithography technique. As a result, the laminated body having the floating gate 30a made of polysilicon and the control gate 34a made of polysilicon is formed within the memory cell array area 2.

Further, the laminated body having the select gate 30b made of polysilicon and the polysilicon film 34b is formed within the memory cell array area 2.

The polysilicon film 34b is etched off from an area where the wiring (first metal wiring) 46 and the select gate 30b may be connected to each other (not depicted).

A photoresist film (not depicted) is then formed on the entire surface by the spin-coating method.

An opening portion (not depicted), which exposes the area where the source diffusion layer of the memory cell transistor MT is formed, is formed on the photoresist film by using the photolithography technique.

As illustrated in FIGS. 17A to 17C, a P-type dopant impurity is introduced into the semiconductor substrate 20 by using the photoresist film as a mask. As a result, a P-type diffusion layer 35 to be the pocket area is formed above the area, where the source diffusion layer of the memory cell transistor MT is formed, so as to extend into a lower area of the floating gate 30a. The impurity diffusion layer 35 is formed by ion implantation of $BF_2^+$ as the dopant impurity under the conditions that a tilt angle with respect to a normal line of the substrate is 0°, a twist angle is 0/180°, an acceleration energy is 30 keV, and a dose volume is $1.2 \times 10^{14}$ cm$^{-2}$. When BF2+ is used as the dopant impurity, the P-type impurity diffusion layer 35 may be formed to be shallower than a case of using $B^+$ as the dopant impurity. Thereafter, the photoresist film is peeled off.

An opening portion (not depicted) which exposes the memory cell array area 2 is formed on the photoresist film by using the photolithography technique.

As illustrated in FIGS. 18A to 18C, an N-type dopant impurity is introduced into the semiconductor substrate 20 by using the photoresist film as a mask. As a result, the N-type first impurity diffusion layer $36a_1$ and the N-type impurity diffusion layers $36b$ and $36c_1$ are formed in the semiconductor substrate 20 on both sides of the floating gate 30a and in the semiconductor substrate 20 on both sides of the select gate 30b. The first impurity diffusion layer $36a_1$ and the impurity diffusion layers $36b$ and $36c_1$ are formed by ion implantation of $As^+$ as the dopant impurity under the conditions that a tilt angle with respect to the normal line of the substrate is 0°, a twist angle is 0/180°, an acceleration energy is 20 keV, and a dose volume is $6.0 \times 10^{12}$ cm$^{-2}$. Thereafter, the photoresist film is peeled off.

A silicon oxide film 82 is formed on a side wall portion of the floating gate 30a, a side wall portion of the control gate 34a, a side wall portion of the select gate 30b and a side wall portion of the polysilicon film 34b by the thermal oxidation method.

A silicon nitride film 84 with a film thickness of 50 nm is formed by the CVD method.

A side wall insulating film 84 made of the silicon nitride film is formed by anisotropically etching the silicon nitride film 84 according to the dry etching. At this time, the antireflection film 80 is etched off (see FIGS. 19A to 19C).

A photoresist film (not depicted) is then formed on the entire surface by the spin-coating method.

An opening portion (not depicted), which exposes the area where the source diffusion layer of the memory cell transistor MT is formed, is formed on the photoresist film by using the photolithography technique.

Figure 20B:
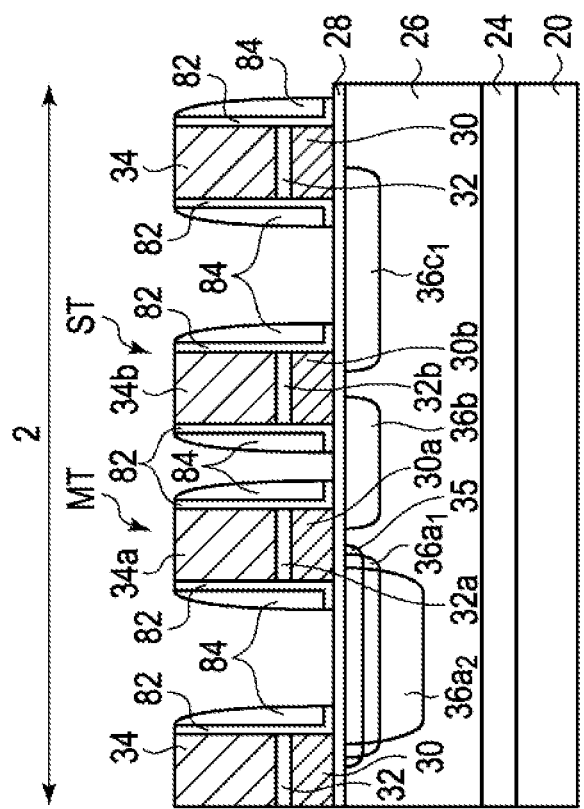
Figure 20A:
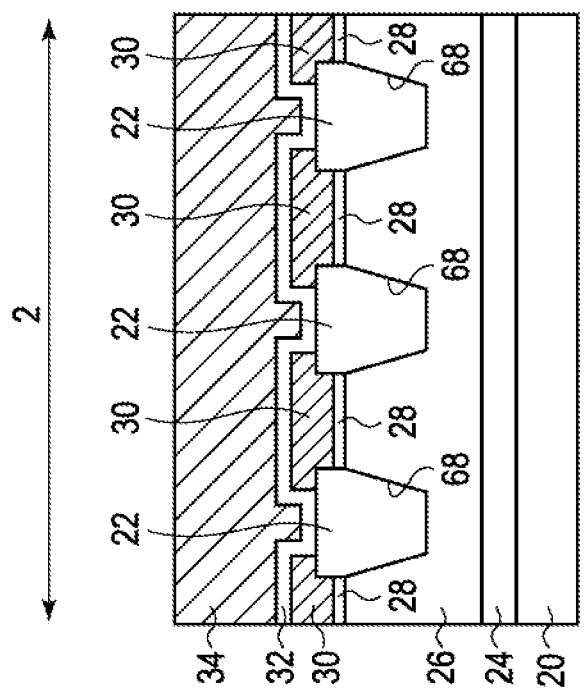

As illustrated in FIGS. 20A to 20C, an N-type dopant impurity is introduced into the semiconductor substrate 20 by using the photoresist film as a mask. As a result, the N-type second impurity diffusion layer $36a_2$ is formed on the area where the source diffusion layer of the memory cell transistor MT is formed. The second impurity diffusion layer $36a_2$ is formed by ion implantation of P+ as the dopant impurity from four directions under the conditions that a tilt angle with respect to the normal line of the substrate is 7°, an acceleration energy is 20 keV, and a dose volume is $7.0\times10^{13}$ cm$^{-2}$. Thereafter, the photoresist film is peeled off.

The polysilicon film 34 on the area 6 where the high-withstand voltage transistor is formed and the area 8 where the low-voltage transistor is formed are patterned by using the photolithography technique. As a result, gate electrodes 34c of the high-withstand voltage transistors made of the polysilicon film 34 are formed. Further, gate electrodes 34d of the low-voltage transistors made of the polysilicon 34 are formed.

A photoresist film (not depicted) is formed on the entire surface by the spin-coating method.

An opening portion (not depicted), which exposes the area 6N where the high-withstand voltage transistor is formed, is formed on the photoresist film by the photolithography technique.

An N-type dopant impurity is introduced into the semiconductor substrate 20 by using the photoresist film as a mask. As a result, an N-type low-density diffusion layer 86 is formed in the semiconductor substrate 20 on both sides of the gate electrode 34c of the high-withstand voltage N-channel transistor. Thereafter, the photoresist film is peeled off.

A photoresist film (not depicted) is formed on the entire surface by the spin-coating method.

An opening portion (not depicted), which exposes the area 6P where the high-withstand voltage P-channel transistor is formed, is formed on the photoresist film by using the lithography technique.

A P-type dopant impurity is introduced into the semiconductor substrate 20 by using the photoresist film as a mask. As a result, a P-type low-density diffusion layer 88 is formed into the semiconductor substrate 20 on both sides of the gate electrode 34c of the high-withstand voltage P-channel transistor. Thereafter, the photoresist film is peeled off.

A photoresist film (not depicted) is formed on the entire surface by the spin-coating method.

An opening portion (not depicted), which exposes the area 8N where the low-voltage N-channel transistor is formed, is formed on the photoresist film by using the photolithography technique.

An N-type dopant impurity is introduced into the semiconductor substrate 20 by using the photoresist film as a mask. As a result, an N-type low-density diffusion layer 90 is formed into the semiconductor substrate 20 on both the sides of the gate electrode 34d of the low-voltage N-channel transistor. Thereafter, the photoresist film is peeled off.

A photoresist film (not depicted) is then formed on the entire surface by the spin-coating method.

An opening portion (not depicted), which exposes the area 8P where the low-voltage P-channel transistor is formed, is formed on the photoresist film by using the photolithography technique.

A P-type dopant impurity is introduced into the semiconductor substrate 20 by using the photoresist film as a mask. As a result, a P-type low-density diffusion layer 92 is formed into the semiconductor substrate 20 on both the sides of the gate electrode 34d of the low-voltage P-channel transistor. Thereafter, the photoresist film is peeled off.

Figure 21C:
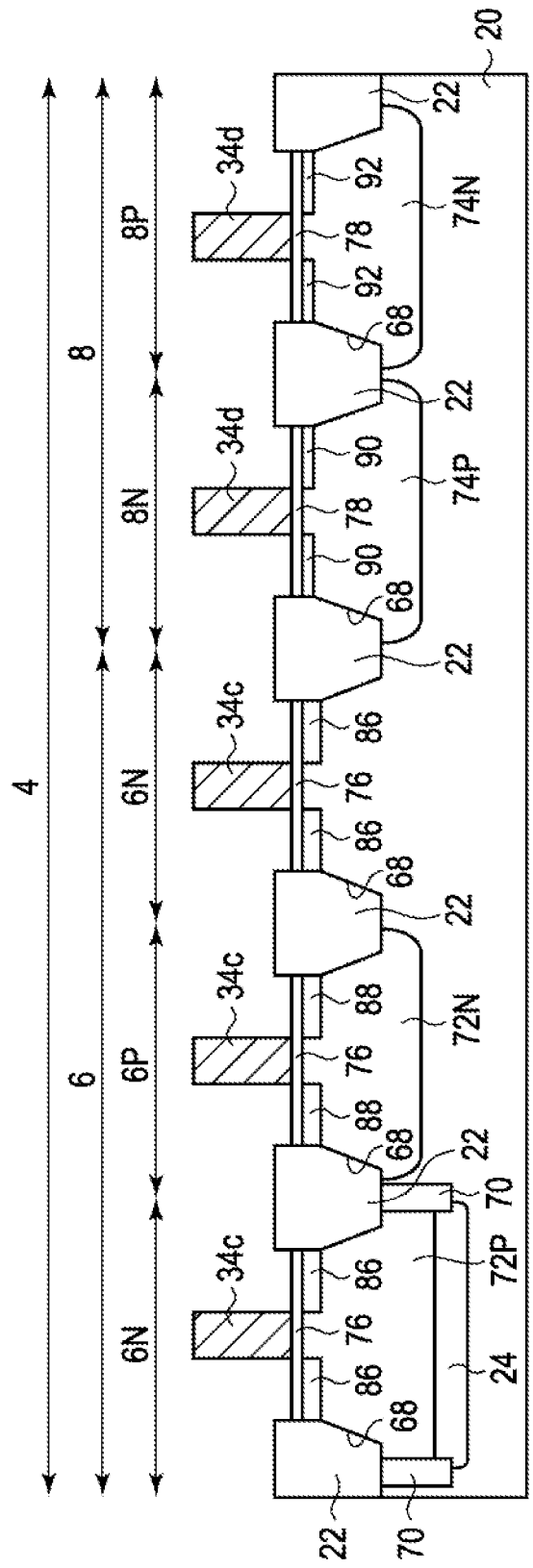

As illustrated in FIGS. 21A to 21C, the gate electrodes 34c and 34d and the low-density diffusion layers 86, 88, 90, and 92 are formed on the peripheral circuit area 4.

The silicon oxide film 93 with a film thickness of 100 nm is then formed by the CVD method.

The silicon oxide film 93 is anisotropically etched by dry etching. As a result, a side wall insulating film 93 made of the silicon oxide film is formed on the side wall portion of the laminated body having the floating gate 30a and the control gate 34a. The side wall insulating film 93 made of the silicon oxide film is formed on the side wall portion of the laminated body having the select gate 30b and the polysilicon film 34b. Further, the side wall insulating film 93 made of the silicon oxide film is formed on the side wall portion of the gate electrode 34c. The side wall insulating film 93 made of the silicon oxide film is formed on the side wall portion of the gate electrode 34d.

A photoresist film (not depicted) is formed on the entire surface by the spin-coating method.

An opening portion (not depicted) which exposes the memory cell array area 2, an opening portion (not depicted) which exposes the area 6N where the high-withstand voltage N-channel transistor is formed, and an opening portion (not depicted) which exposes the area 8N where the low-voltage N-channel transistor is formed, are formed on the photoresist film by using the photolithography technique.

Figure 22B:
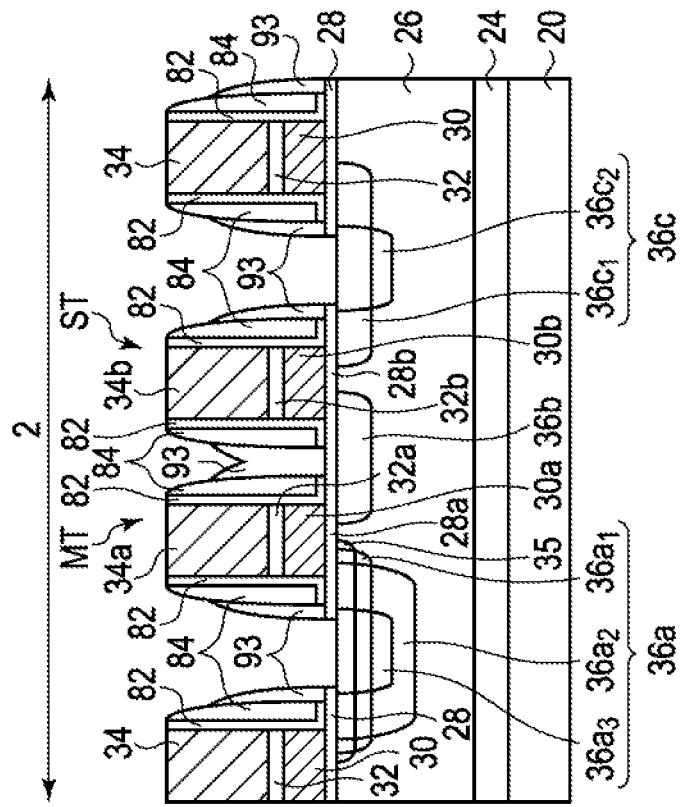
Figure 22A:
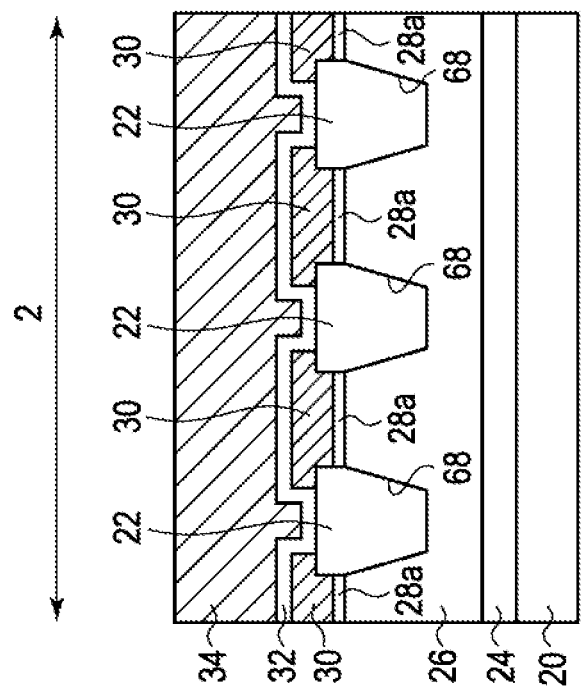
Figure 23B:
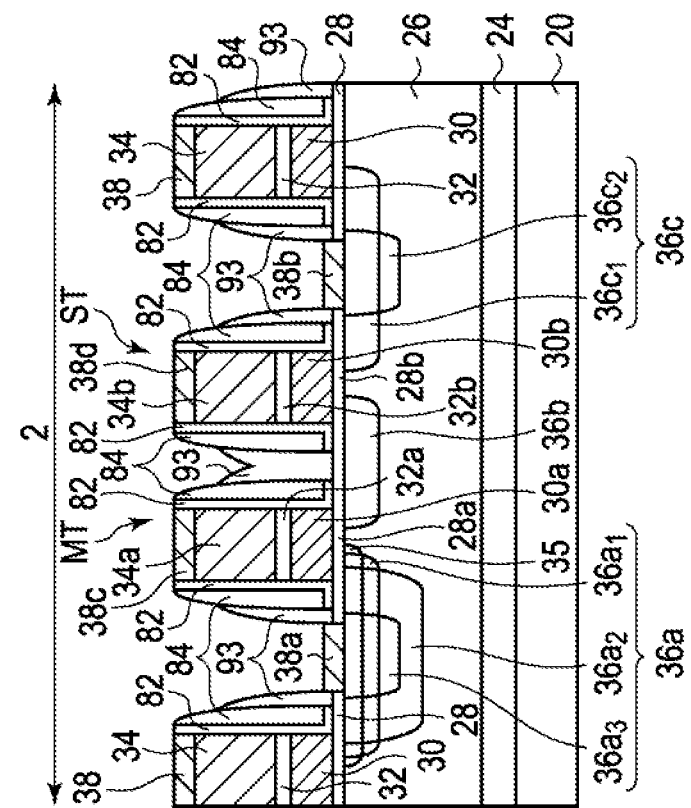
Figure 23A:
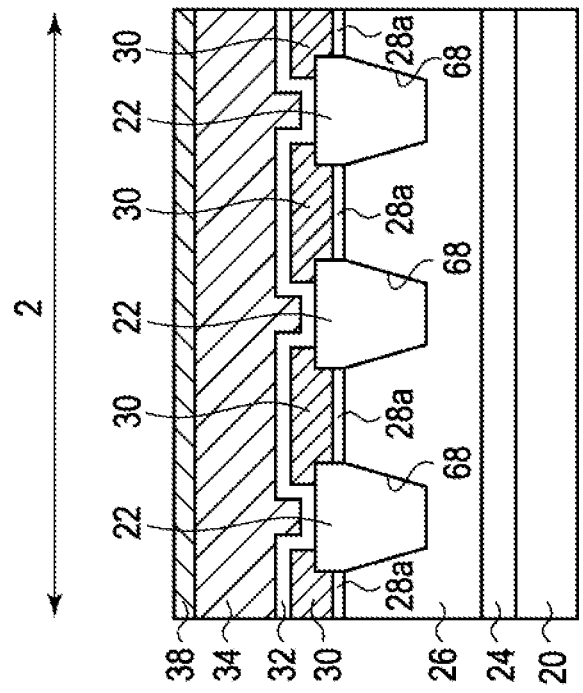
Figure 23C:
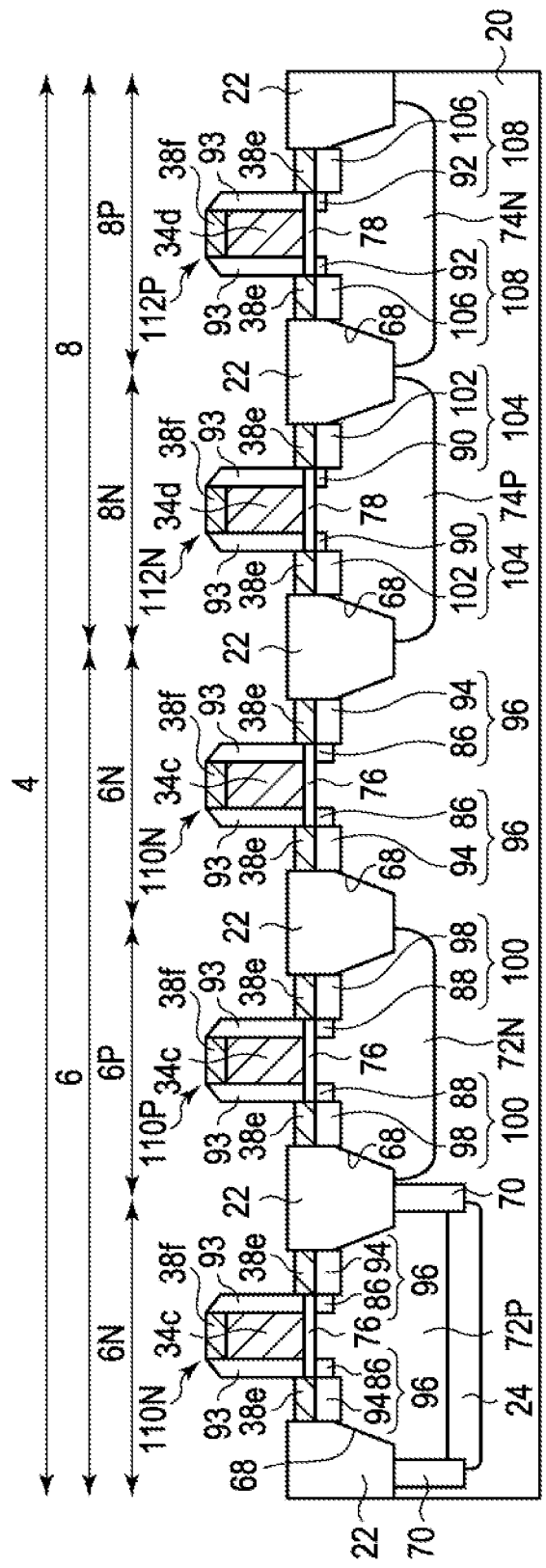

As illustrated in FIGS. 22A to 22C, an N-type dopant impurity is introduced into the semiconductor substrate 20 by using the photoresist film as a mask. As a result, the N-type third impurity diffusion layer $36a_3$ is formed on the area where the source diffusion layer of the memory cell transistor MT is formed. Further, the N-type impurity diffusion layer $36c_2$ is formed on the area where the drain diffusion layer of the selecting transistor ST is formed. An N-type high-density diffusion layer 94 is formed into the semiconductor substrate 20 on both sides of the gate electrode 34c of the high-withstand voltage N-channel transistor. An N-type high-density diffusion layer 102 is formed into the semiconductor substrate 20 on both sides of the gate electrode 34d of the low-voltage N-channel transistor. The third impurity diffusion layer $36a_3$, the impurity diffusion layer $36c_2$, and the high-density diffusion layers 94 and 102 are formed by ion implantation of P+ as the dopant impurity from four directions under the conditions that a tilt angle with respect to the normal line of the substrate is 7°, an acceleration energy is 15 keV, and a dose volume is $2.0\times10^{15}$ cm$^{-2}$. Thereafter, the photoresist film is peeled off.

The memory cell transistor MT, which has the floating gate 30a, the control gate 34a, and the source/drain diffusion layers 36a and 36b, is formed. The source diffusion layer 36a is formed by the first to third impurity diffusion layers $36a_1$, $36a_2$, $36a_3$. The selecting transistor ST, which has the select gate 30b and the source/drain diffusion layers 36b and 36c, is formed. The drain diffusion layer 36c is formed by the impurity diffusion layers $36c_1$ and $36c_2$.

The N-type source/drain diffusion layer 96 having an LDD structure is formed by the N-type low-density diffusion layer 86 and the N-type high-density diffusion layer 94. A high-withstand voltage N-channel transistor 110N, which has the gate electrode 34c and the source/drain diffusion layer 96, is formed. The high-withstand voltage N-channel transistor 110N is used in the high-voltage circuit (high-withstand voltage circuit).

An N-type source/drain diffusion layer 104 having an LDD structure is formed by the N-type low-density diffusion layer 90 and the N-type high-density diffusion layer 102. A low-voltage N-channel transistor 112N, which has the gate electrode 34d and the source/drain diffusion layer 104, is formed. The low-voltage N-channel transistor 112N is used in the low-voltage circuit.

A photoresist film (not depicted) is then formed on the entire surface by the spin-coating method.

An opening portion (not depicted), which exposes the area 6P where the high-withstand voltage P-channel transistor is formed, is formed on the photoresist film by using the photolithography technique.

A P-type dopant impurity is introduced into the semiconductor substrate 20 by using the photoresist film as a mask. As a result, a P-type low-density diffusion layer 98 is formed into the semiconductor substrate 20 on both sides of the gate electrode 34c of the high-withstand voltage P-channel transistor. A P-type source/drain diffusion layer 100 having an LDD structure is formed by the P-type low-density diffusion layer 88 and the P-type high-density diffusion layer 98. A high-withstand voltage P-channel transistor 110P, which has the gate electrode 34c and the source/drain diffusion layer 100, is formed. The high-withstand voltage P-channel transistor 110P is used in the high-voltage circuit (high-withstand voltage circuit). Thereafter, the photoresist film is peeled off.

A photoresist film (not depicted) is formed on the entire surface by the spin-coating method.

An opening portion (not depicted), which exposes the area 8P where the low-voltage P-channel transistor is formed, is formed on the photoresist film by using the photolithography technique.

A P-type dopant impurity is introduced into the semiconductor substrate 20 by using the photoresist film as a mask. As a result, a P-type high-density diffusion layer 106 is formed into the semiconductor substrate 20 on both sides of the gate electrode 34d of the low voltage P-channel transistor. A P-type source/drain diffusion layer 108 having an LDD structure is formed by the P-type low-density diffusion layer 92 and the P-type high-density diffusion layer 106. A low-voltage P-channel transistor 112P, which has the gate electrode 34d and the source/drain diffusion layer 108, is formed. The low-voltage P-channel transistor 112P is used in the low-voltage circuit. Thereafter, the photoresist film is peeled off.

A cobalt film with a film thickness of 10 nm is formed on the entire surface by the sputtering method.

Silicon atoms on the surface of the semiconductor substrate 20 react with cobalt atoms in the cobalt film by heat treatment. Silicon atoms on the surface of the control gate 34c react with the cobalt atoms in the cobalt film. Silicon atoms on the surface of the polysilicon film 34d react with the cobalt atoms in the cobalt film. Silicon atoms on the surfaces of the gate electrodes 34c and 34d react with the cobalt atoms in the cobalt film. Cobalt silicide films 38a and 38b are formed on the source-drain diffusion layers 36a and 36c, respectively (see FIGS. 23A to 23C). A cobalt-silicide film 38c is formed on the control gate 34a. A cobalt-silicide film 38d is formed on the polysilicon film 34b. A cobalt-silicide film 38e is formed on the source/drain diffusion layers 96, 100, 104, and 108. A cobalt-silicide film 38f is formed on the gate electrodes 34c and 34d.

The unreacted cobalt film is etched off.

The cobalt-silicide film 38b formed on the drain diffusion layer 36c of the selecting transistor ST functions as a drain electrode.

The cobalt-silicide film 38a formed on the source diffusion layer 36a of the memory cell transistor MT functions as a source electrode.

The cobalt-silicide film 38e formed on the source/drain diffusion layers 96 and 100 of the high-withstand voltage transistors 110N and 110P functions as a source/drain electrode.

The cobalt-silicide film 38e formed on the source/drain diffusion layers 104 and 108 of the low-voltage transistors 112N and 112P functions as a source/drain electrode.

Figure 24B:
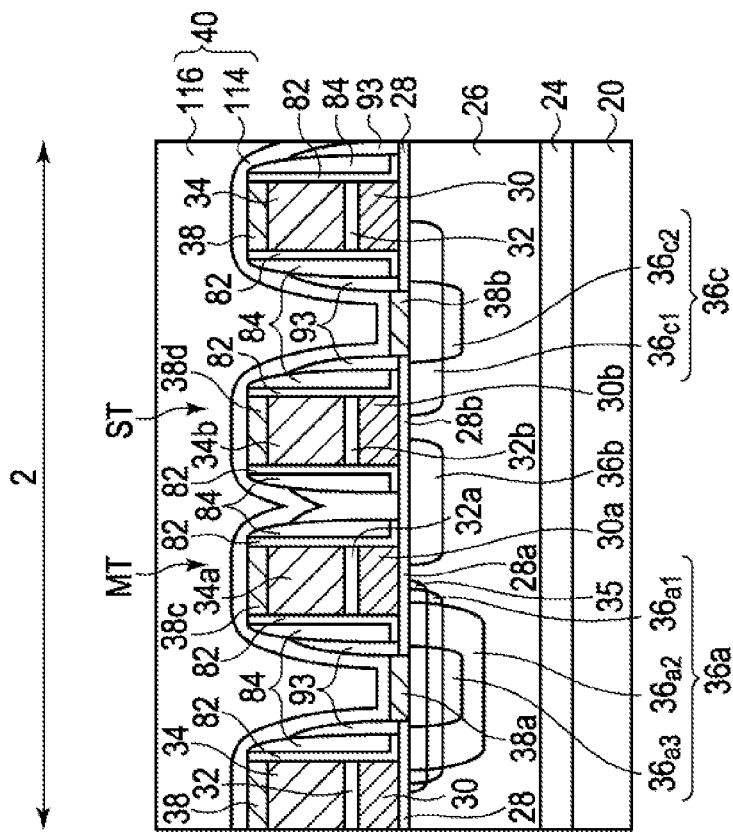
Figure 24A:
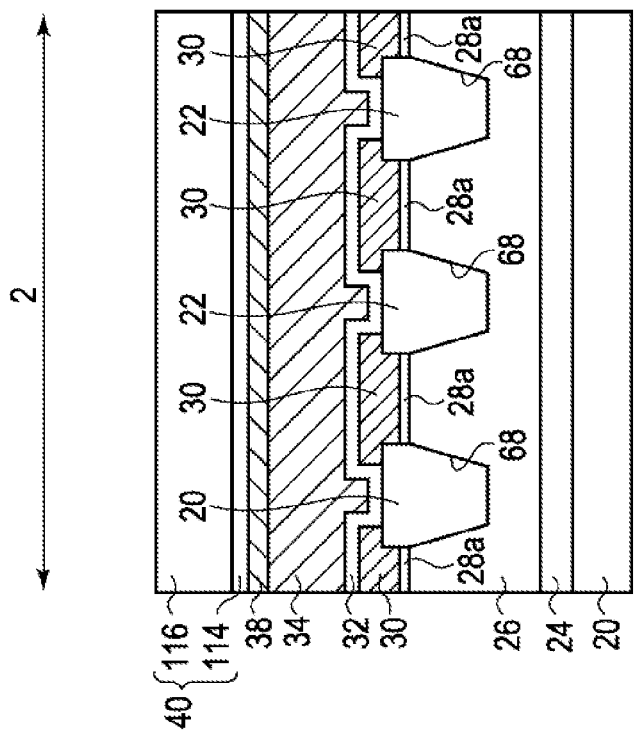
Figure 24C:
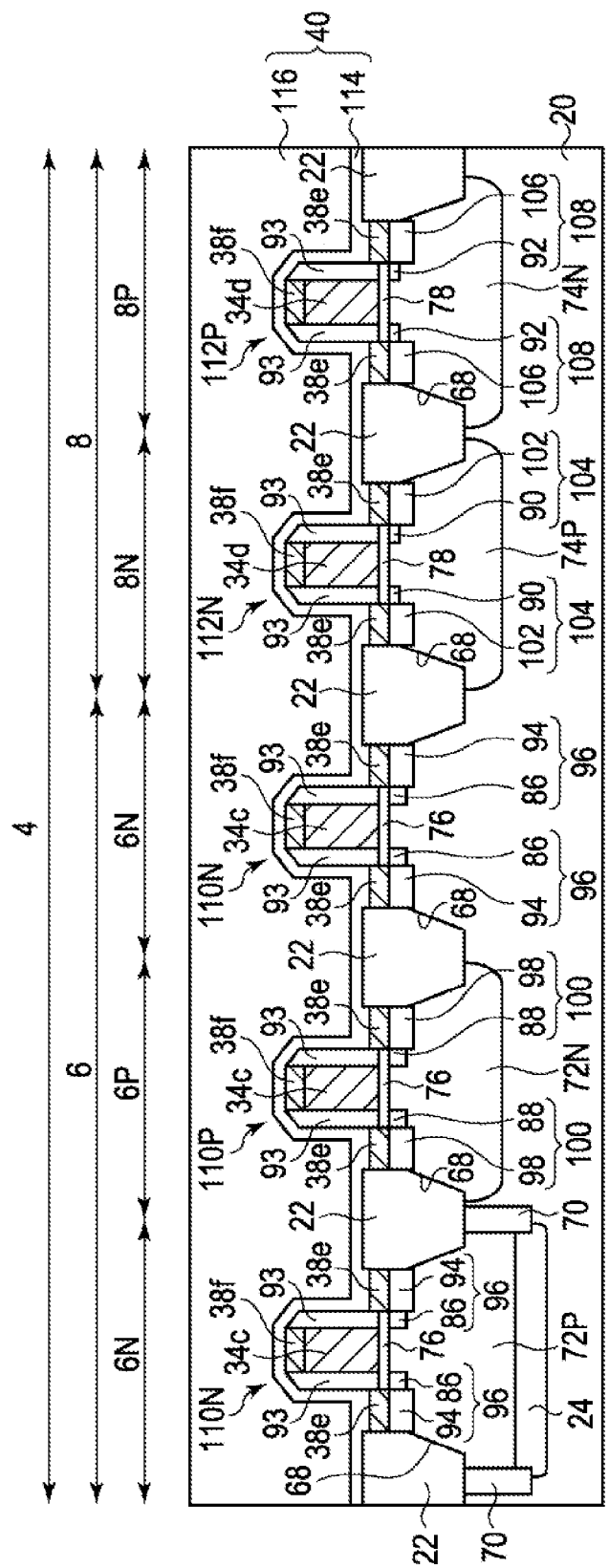

As illustrated in FIGS. 24A to 24C, a silicon nitride film 114 with a film thickness of 20 nm is formed on the entire surface by the CVD method. The silicon nitride film 114 functions as an etching stopper.

A silicon oxide film (BPSG film) 116 with a film thickness of 1600 nm is formed on the entire surface by the CVD method. The interlayer insulating film 40 having the silicon nitride film 114 and the silicon oxide film 116 is formed.

The surface of the interlayer insulating film 40 is flattened by a CMP method.

Figure 25A:
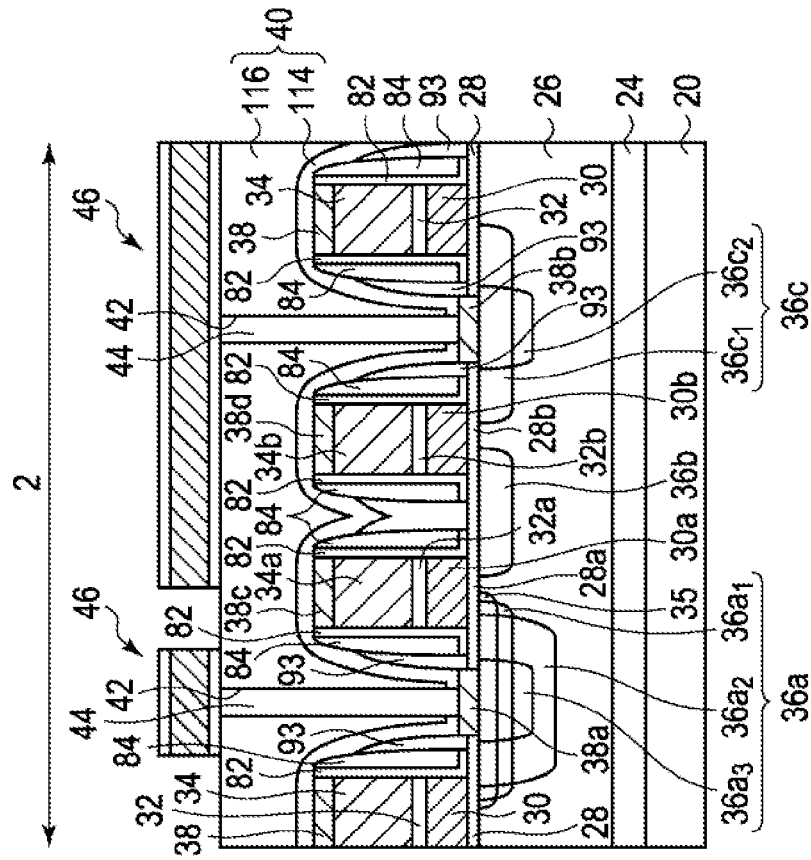
Figure 25B:
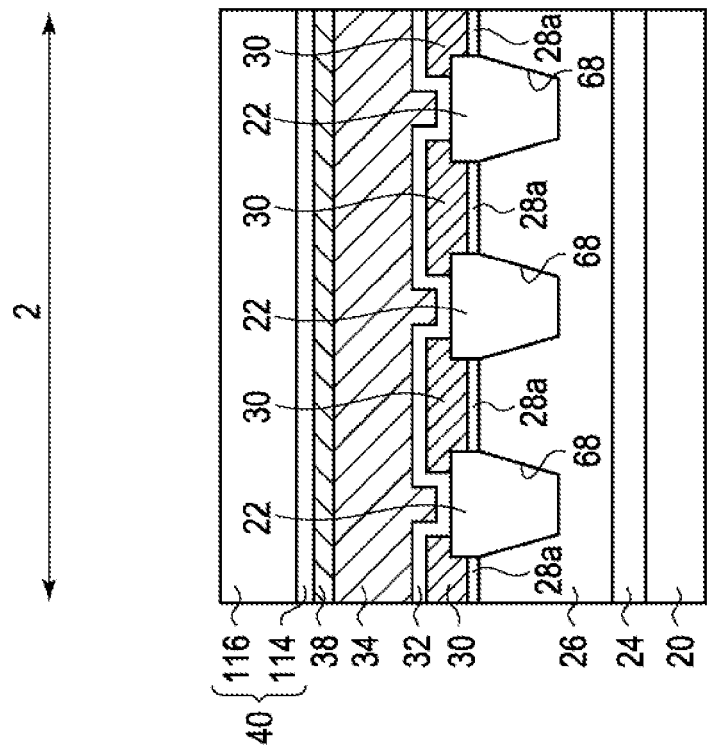
Figure 25C:
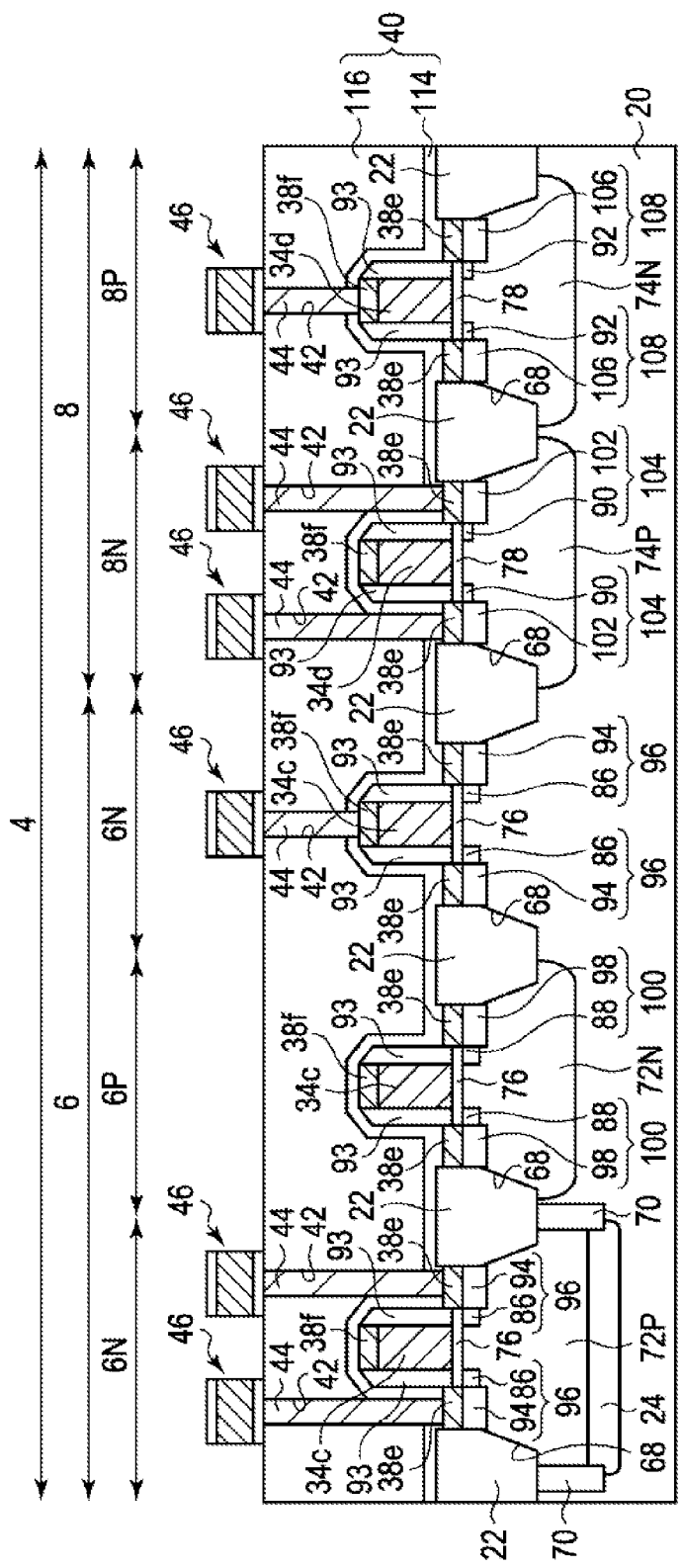

The contact holes 42 which reach the source/drain electrodes 38a and 38b, the contact holes 42 which reach the source/drain diffusion layer 38e, and the contact holes 42 which reach the cobalt-silicide film 38f are formed by using the photolithography method (see FIGS. 25A to 25C).

A Ti film with a film thickness of 30 nm and a TiN film with a film thickness of 20 nm are sequentially laminated on the entire surface by the sputtering method, and the laminated film forms a barrier layer (not depicted).

A tungsten film 44 with a film thickness of 300 nm is formed on the entire surface by the CVD method.

The tungsten film 44 and the barrier layer are polished by the CMP method until the surface of the interlayer insulating film 40 is exposed. In such a manner, the conductor plug 44 made of tungsten is embedded into the contact holes 42.

A Ti film with a film thickness of 60 nm, a TiN film with a film thickness of 30 nm, an Al film with a film thickness of 360 nm, a Ti film with a film thickness of 5 nm, and a TiN film with a film thickness of 70 nm are sequentially laminated on the interlayer insulating film 40 into which the conductor plug 44 is embedded by the sputtering method. The laminated film 46 is formed in this manner.

The laminated film 46 is patterned by the photolithography technique. In such a manner, the wiring (first metal wiring layer) 46 is formed by the laminated film.

Figure 26C:
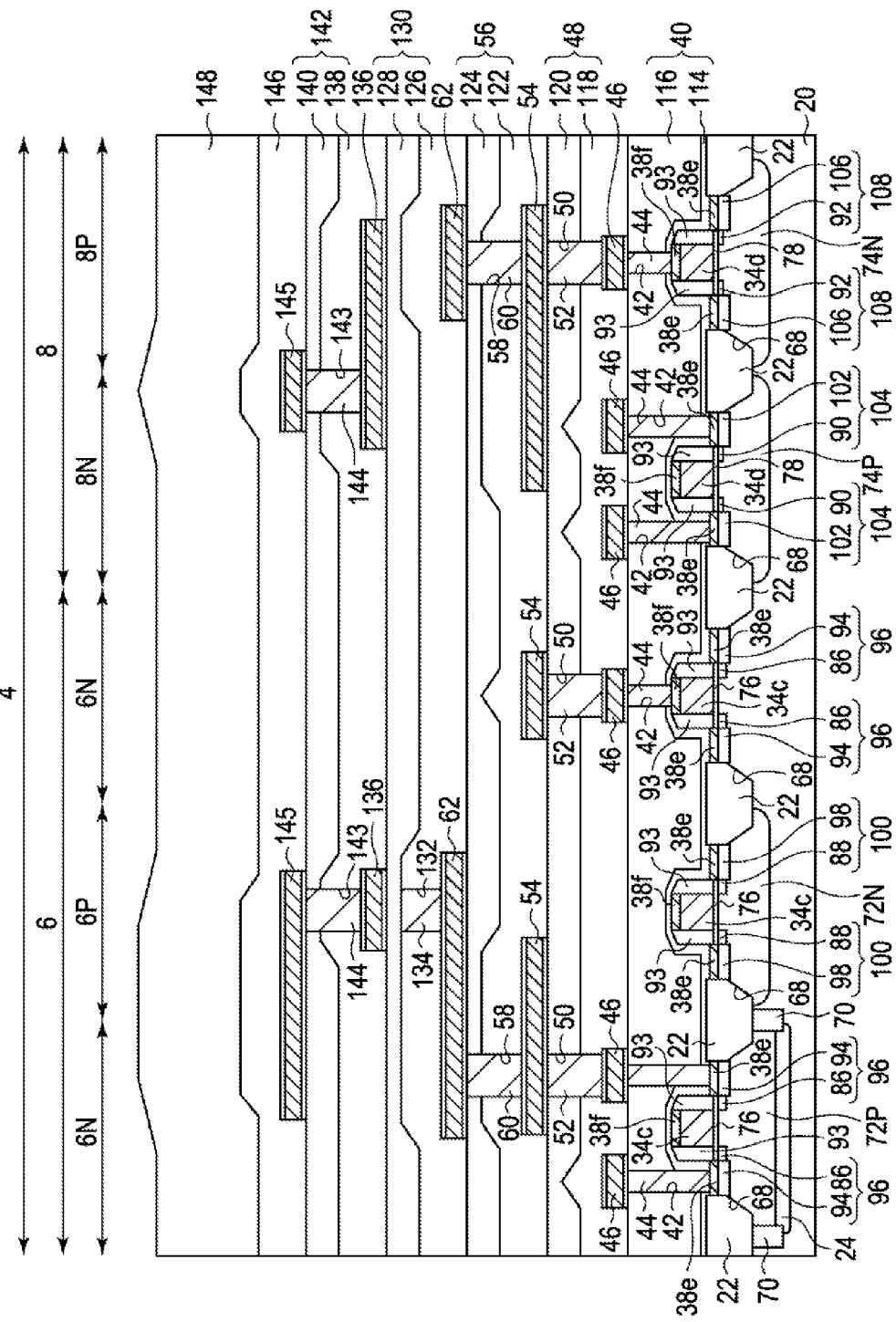

As illustrated in FIGS. 26A to 26C, a silicon oxide film 118 with a film thickness of 700 nm is formed by a high-density plasma CVD method.

A silicon oxide film 120 is formed by a TEOSCVD method. The interlayer insulating film 48 is formed by the silicon oxide film 118 and the silicon oxide film 120.

A contact hole 50, which reaches the wiring 46, is formed on the interlayer insulating film 48 by using the photolithography technique.

A Ti film and a TiN film are sequentially laminated on the entire surface by the sputtering method, so as to form a barrier layer (not depicted).

A tungsten film 52 with a film thickness of 300 nm is formed on the entire surface by the CVD method.

The tungsten film 52 and the barrier film are polished by the CMP method until the surface of the interlayer insulating film 48 is exposed. In such a manner, the conductor plug 52 made of tungsten is embedded into the contact hole 50.

A Ti film, a TiN film, an Al film, a Ti film, and a TiN film are sequentially laminated on the interlayer insulating film 48 into which the conductor plug 52 is embedded by the sputtering method. In such a manner, a laminated film 54 is formed.

The laminated film 54 is patterned by using the photolithography technique. The wiring (second metal wiring layer) 54 is formed by the laminated film.

A silicon oxide film 122 is formed by the high-density plasma CVD method.

A silicon oxide film 124 is formed by the TEOSCVD method. The silicon oxide films 122 and 124 form the interlayer insulating film 56.

The contact hole 58, which reaches the wiring 54, is formed on the interlayer insulating film 56 by the photolithography technique.

A Ti film and a TiN film are sequentially laminated on the entire surface by the sputtering method, so as to form a barrier layer (not depicted).

A tungsten film 60 with a film thickness of 300 nm is formed on the entire surface by the CVD method.

The tungsten film 60 and the barrier layer are polished by the CMP method until the surface of the interlayer insulating film 56 is exposed. In such a manner, the conductor plug 60 (see FIG. 26C) made of tungsten is embedded into the contact hole 58.

A laminated film 62 is formed on the interlayer insulating film 56 into which the conductor plug 60 is embedded by the sputtering method.

The laminated film 62 is patterned by using the photolithography technique. The wiring (third metal wiring layer) 62 is formed by the laminated film.

A silicon oxide film 126 is formed by the high-density plasma CVD method.

A silicon oxide film 128 is formed by the TEOSCVD method. The silicon oxide films 126 and 128 form an interlayer insulating film 130.

A contact hole 132, which reaches the wiring 62, is formed on the interlayer insulating film 130 by the photolithography technique.

A Ti film and a TiN film are sequentially laminated on the entire surface by the sputtering method, so as to form a barrier layer (not depicted).

A tungsten film 134 with a film thickness of 300 nm is formed on the entire surface by the CVD method.

The tungsten film 134 and the barrier layer are polished by the CMP method until the surface of the interlayer insulating film 130 is exposed. In such a manner, a conductor plug (not depicted) 134 made of tungsten is embedded into the contact hole 132.

A laminated film 136 is formed on the interlayer insulating film 130 into which the conductor plug 134 is embedded by the sputtering method.

The laminated film 136 is patterned by using the photolithography technique. In such a manner, a wiring (fourth metal wiring layer) 136 is formed by the laminated film.

A silicon oxide film 138 is formed by the high-density plasma CVD method.

A silicon oxide film 140 is formed by the TEOSCVD method. The silicon oxide films 138 and 140 form an interlayer insulating film 142.

A contact hole 143, which reaches the wiring 136, is formed on the interlayer insulating film 142 by using the photolithography technique.

A Ti film and a TiN film are sequentially laminated on the entire surface by the sputtering method, so as to form a barrier layer (not depicted).

A tungsten film 144 with a film thickness of 300 nm is formed on the entire surface by the CVD method.

The tungsten film 144 and the barrier layer are polished by the CMP method until the surface of the interlayer insulating film 142 is exposed. In such a manner, a conductor plug 144 made of tungsten is embedded into the contact hole 143.

A laminated film 145 is formed on the interlayer insulating film 142 into which the conductor plug 144 is embedded by the sputtering method.

The laminated film 145 is patterned by using the photolithography technique. In such a manner, a wiring (fifth metal wiring layer) 145 is formed by the laminated film.

A silicon oxide film 146 is formed by the high-density plasma CVD method.

A silicon nitride film 148 with a film thickness of 1 μm is formed by the plasma CVD method.

In such a manner, the semiconductor device according to the first embodiment is fabricated.

(Evaluation Results)

Evaluation results of the semiconductor device according to the first embodiment will be described below with reference to FIG. 27. FIG. 27 is a graph illustrating results of counting the number of writing defects in the semiconductor device according to Examples 1 and 2 and a comparative example. A scale of an ordinate axis in the graph showing the number of defects is a logarithmic scale. The number of defects occurring in the semiconductor device according to Comparative Example is 1, and the number of defects occurring in the semiconductor devices according to Examples 1 and 2 is standardized.

The semiconductor device according to Example 1 is fabricated by the method for fabricating the semiconductor device according to the first embodiment.

The ion implanting conditions in the semiconductor device of the Comparative Example, which are used for forming the P-type impurity diffusion layer 35, are different from the ion implanting conditions in the semiconductor device of Example 1. Concretely, in the semiconductor device of the Comparative Example, the P-type impurity diffusion layer 35 is formed by ion implantation of $B^+$ as the dopant impurity under the conditions that the tilt angle with respect to the normal line of the substrate is 0°, the twist angle is 0/180°, the acceleration energy is 20 keV, and the dose volume is $6.3 \times 10^{13}$ cm$^{-2}$. The semiconductor device of the Comparative Example is different from the semiconductor device of Example 1 in that the ion implantation for forming the second impurity diffusion layer $36a_2$ is not performed. Except for these points, the semiconductor device of the Comparative Example is fabricated similarly to the semiconductor device of Example 1.

The semiconductor device of Example 2 is fabricated by a method for fabricating the semiconductor device according to a second embodiment, described later, in which the timing of forming the second impurity diffusion layer $36a_2$ is different from that in the first embodiment.

As is clear from the graph illustrated in FIG. 27, the number of defects in Example 1 is reduced to 1/10 of the number of defects in the Comparative Example. As a result, according to the first embodiment, erroneous writing may be reduced.

Second Embodiment

The semiconductor device and the fabricating method thereof according to the second embodiment will be described with reference to FIGS. 28A to 31C and FIG. 27. FIGS. 28A to 31C are cross-sectional views illustrating processes of the method for fabricating the semiconductor device according to the second embodiment. Similar components to those in the semiconductor device and the fabricating method thereof according to the first embodiment illustrated in FIGS. 1 to 26C are denoted by similar symbols, and the description thereof is omitted or simplified.

The semiconductor device according to the second embodiment is approximately similar to the semiconductor device according to the first embodiment.

The timing of forming the second impurity diffusion layer $36a_2$ in the method for fabricating the semiconductor device according to the second embodiment is different from that of the first embodiment. The method for fabricating the semiconductor device according to the second embodiment will be described below with reference to FIGS. 28A to 31C.

Similar to the method for fabricating the semiconductor device according to the first embodiment illustrated in FIGS. 8 to 19, the processes up to forming the side wall insulating film 84 of the silicon nitride film are executed (see FIGS. 28A to 28C).

In the second embodiment, the side wall insulating film 84 is formed more thickly than that in the first embodiment. That is, in the second embodiment, the silicon nitride film 84 with a film thickness of 70 nm, which is 20 nm thicker than the thickness in the first embodiment, is formed by the CVD method. The silicon nitride film 84, which is formed more thickly than the silicon nitride film 84 in the first embodiment, is anisotropically etched by the dry etching. As a result, the side wall insulating film 84 made of the silicon nitride film, which is thicker than the side wall insulating film 84 in the first embodiment, is formed.

The polysilicon film 34 on the area 6 formed with the high-withstand voltage transistor and on the area 8 formed with the low-voltage transistor is patterned by using the photolithography technique. As a result, the gate electrode 34c of the high-withstand voltage transistor composed of the polysilicon film 34 is formed. Further, the gate electrode 34d of the low-voltage transistor made of the polysilicon 34 is formed.

A photoresist film (not depicted) is formed on the entire surface by the spin-coating method.

An opening portion (not depicted), which exposes the area 6N where the high-withstand voltage N-channel transistor is formed, and an opening portion (not depicted), which exposes the area where the source diffusion layer of the memory cell transistor MT is formed, is formed on the photoresist film by the photolithography technique.

Figure 29C:
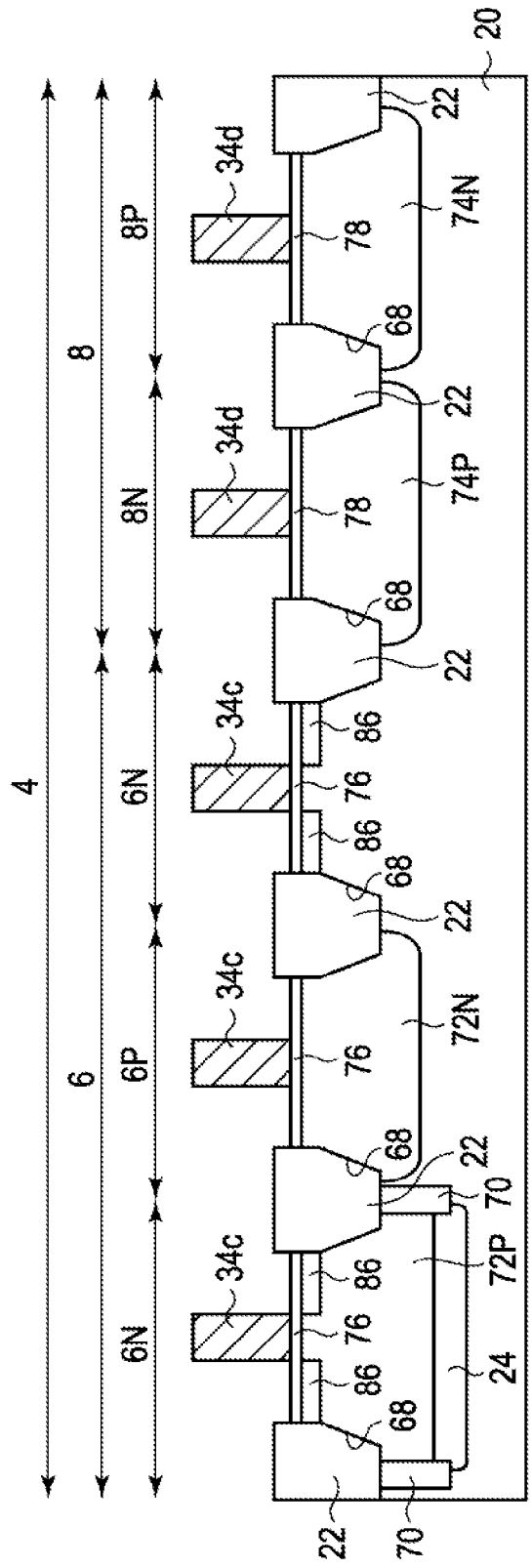

As illustrated in FIGS. 29A to 29C, an N-type dopant impurity is introduced into the semiconductor substrate 20 by using the photoresist film as a mask. As a result, the N-type low-density diffusion layer 86 is formed into the semiconductor substrate 20 on both sides of the gate electrode 34c of the high-withstand voltage N-channel transistor. Further, the N-type second impurity diffusion layer $36a_2$ is formed on the area where the source diffusion layer of the memory cell transistor MT is formed. The low-density diffusion layer 86 and the second impurity diffusion layer $36a_2$ are formed by ion implantation of P+ as the dopant impurity under the conditions that the tilt angle with respect to the normal line of the substrate is 0°, the acceleration energy is 35 key, and the dose volume is $4.0 \times 10^{13}$ cm$^{-2}$. Thereafter, the photoresist film is peeled off.

A photoresist film (not depicted) is formed on the entire surface by the spin-coating method.

An opening portion (not depicted), which exposes the area 6P where the high-withstand voltage P-channel transistor is formed, is formed on the photoresist film by the photolithography technique.

A P-type dopant impurity is introduced into the semiconductor substrate 20 by using the photoresist film as a mask. As a result, a P-type low-density diffusion layer 88 is formed in the semiconductor substrate 20 on both sides of the gate electrode 34c of the high-withstand voltage P-channel transistor. Thereafter, the photoresist film is peeled off.

A photoresist film (not depicted) is formed on the entire surface by the spin-coating method.

An opening portion (not depicted), which exposes the area 8N where the low-voltage N-channel transistor is formed, is formed on the photoresist film by the photolithography technique.

An N-type dopant impurity is introduced into the semiconductor substrate 20 by using the photoresist film as a mask. As a result, an N-type low-density diffusion layer 90 is formed in the semiconductor substrate 20 on both sides of the gate electrode 34d of the low-voltage N-channel transistor. Thereafter, the photoresist film is peeled off.

A photoresist film (not depicted) is formed on the entire surface by the spin-coating method.

An opening portion (not depicted), which exposes the area 8P where the low-voltage P-channel transistor is formed, is formed on the photoresist film by the photolithography technique.

A P-type dopant impurity is introduced into the semiconductor substrate 20 by using the photoresist film as a mask. As a result, a P-type low-density diffusion layer 92 is formed in the semiconductor substrate 20 on both sides of the gate electrode 34d of the low-voltage P-channel transistor. Thereafter, the photoresist film is peeled off.

Figure 30B:
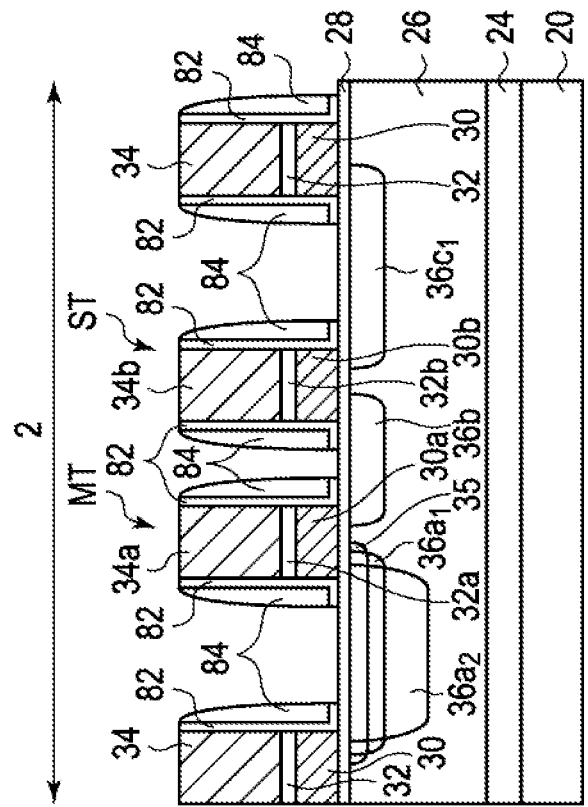
Figure 30A:
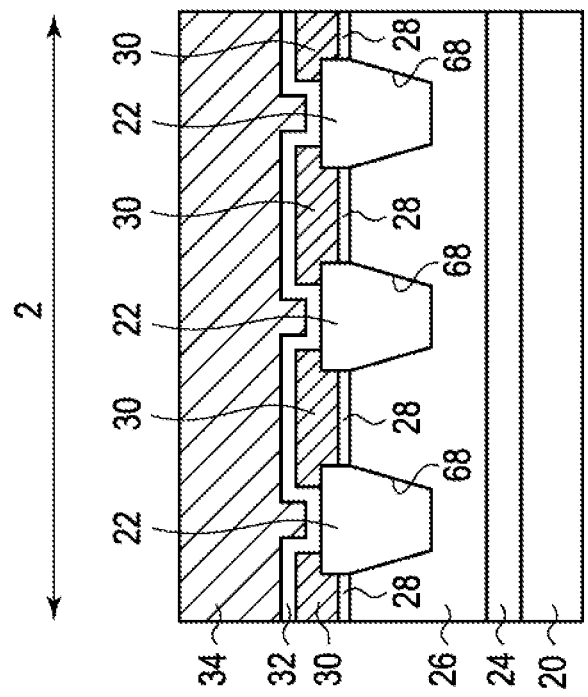
Figure 30C:
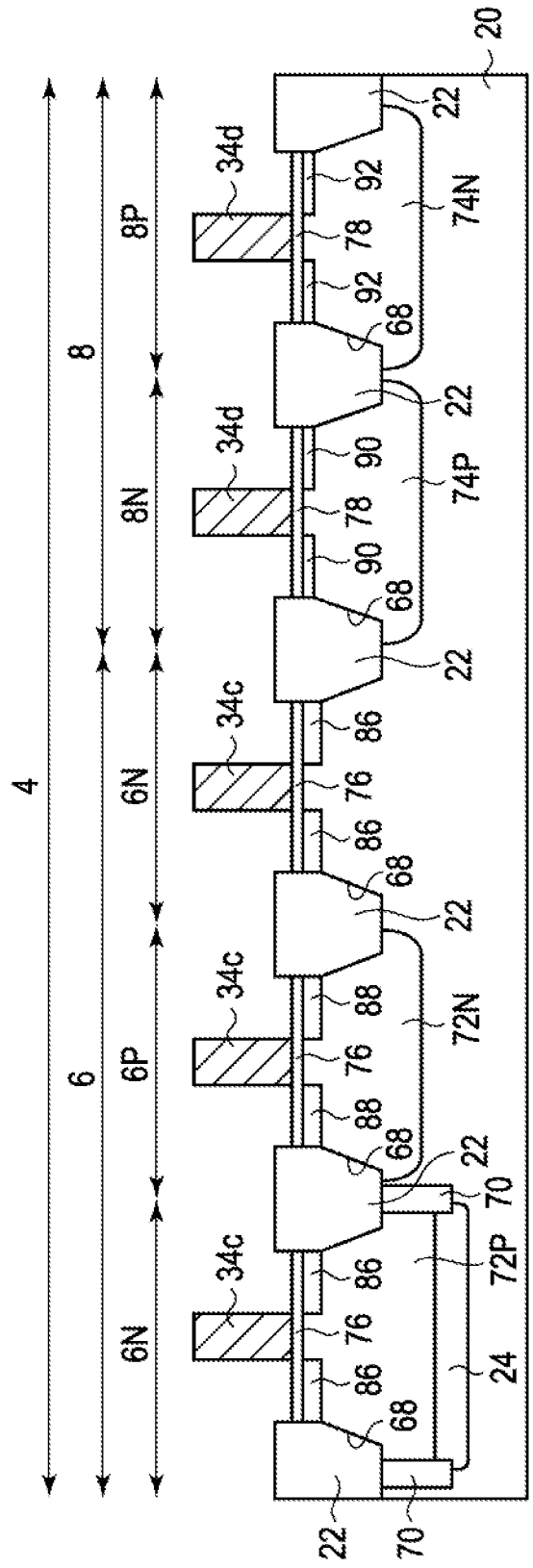

As illustrated in FIGS. 30A to 30C, the gate electrodes 34c and 34d and the low-density diffusion layers 86, 88, 90, and 92 are formed on the peripheral circuit area 4.

The silicon oxide film 93 with a film thickness of 100 nm is formed by the CVD method.

The silicon oxide film 93 is anisotropically etched by the dry etching. As a result, the side wall insulating film 93 made of the silicon oxide film is formed on the side wall portion of the laminated body having the floating gate 30a and the control gate 34a. The side wall insulating film 93 made of the silicon oxide film is formed on the side wall portion of the laminated body having the select gate 30b and the polysilicon film 34b. The side wall insulating film 93 made of the silicon oxide film is formed on the side wall portion of the gate electrode 34c. Further, the side wall insulating film 93 made of the silicon oxide film is formed on the side wall portion of the gate electrode 34d.

A photoresist film (not depicted) is formed on the entire surface by the spin-coating method.

An opening portion (not depicted) which exposes the memory cell array area 2, an opening portion (not depicted) which exposes the area 6N formed with the high-withstand voltage N-channel transistor, and an opening portion (not depicted) which exposes the area 8N formed with the low-voltage N-channel transistor are formed on the photoresist film by the photolithography technique.

Figure 31C:
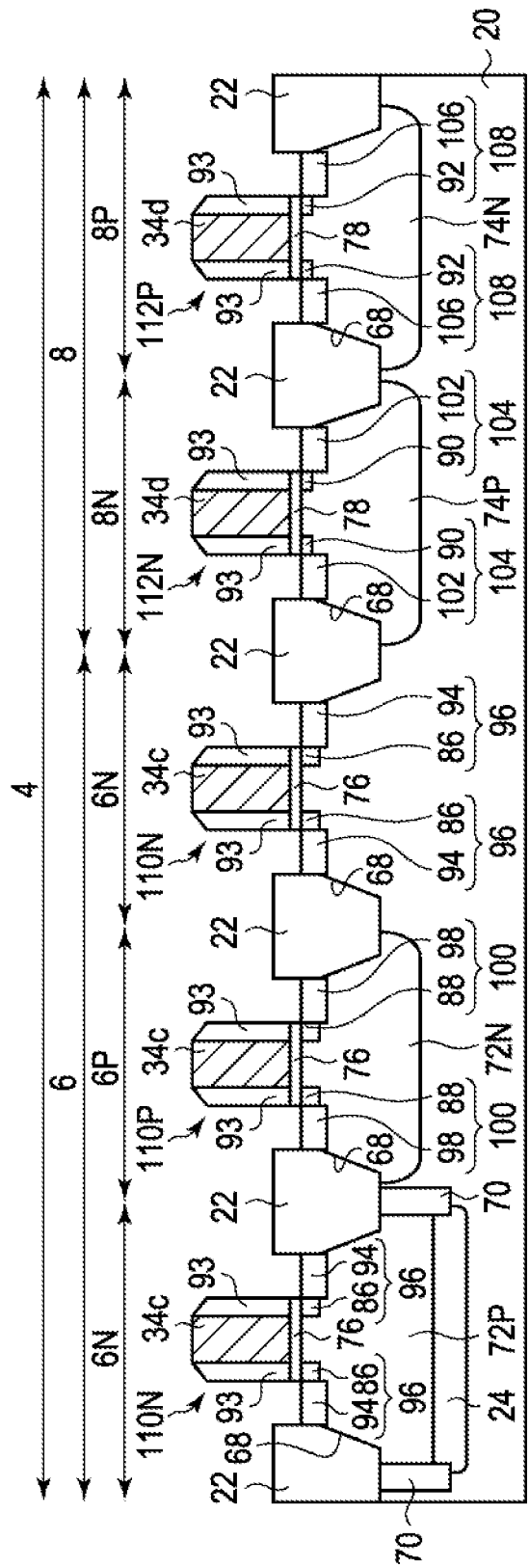

As illustrated in FIGS. 31A to 31C, an N-type dopant impurity is introduced into the semiconductor substrate 20 by using the photoresist film as a mask. As a result, the N-type third impurity diffusion layer $36a_3$ is formed on the area where the source diffusion layer of the memory cell transistor MT is formed. The N-type impurity diffusion layer $36c_2$ is formed on the area where the drain diffusion layer of the selecting transistor ST is formed. The N-type high-density diffusion layer 94 is formed in the semiconductor substrate 20 on both the sides of the gate electrode 34c of the high-withstand voltage N-channel transistor. Further, the N-type high-density diffusion layer 102 is formed in the semiconductor substrate 20 on both sides of the gate electrode 34d of the low-voltage N-channel transistor. The third impurity diffusion layer $36a_3$, the impurity diffusion layer $36c_2$, and the high-density diffusion layers 94 and 102 are formed by ion implantation of P+ as the dopant impurity from four directions under the conditions that the tilt angle with respect to the normal line of the substrate is 7°, the acceleration energy is 15 keV, and the dose volume is $2.0 \times 10^{15}$ cm$^{-2}$. Thereafter, the photoresist film is peeled off.

In such a manner, the memory cell transistor MT, which has the floating gate 30a, the control gate 34a, and the source/ drain diffusion layers 36a and 36b, is formed. The source diffusion layer 36a is formed by the first through third impurity diffusion layers $36a_1$, $36a_2$, and $36a_3$. Further, the selecting transistor ST which has the select gate 30b and the source/drain diffusion layers 36b and 36c is formed. The drain diffusion layer 36c is formed by the impurity diffusion layers $36c_1$ and $36c_2$.

Similar to the method for fabricating the semiconductor device according to the first embodiment, the P-type high-density diffusion layer 98 and the P-type high-density diffusion layer 106 are sequentially formed on the peripheral circuit area 4.

Since the processes thereafter are similar to those in the method for fabricating the semiconductor device according to the first embodiment illustrated in FIGS. 23A to 26C, the description thereof is omitted.

Like the second embodiment, the low-density diffusion layer 86 of the high-withstand voltage N-channel transistor and the second impurity diffusion layer $36a_2$ of the memory cell transistor MT may be formed simultaneously by one-time ion implantation. When the low-density diffusion layer 86 and the second impurity diffusion layer $36a_2$ are formed simultaneously, the number of processes may be reduced and the semiconductor device may be fabricated at low cost.

Evaluation results of the semiconductor device according to the second embodiment will be described below with reference to FIG. 27.

The semiconductor device of Example 2 is fabricated by the method for fabricating the semiconductor device according to the second embodiment.

As is clear from the graph illustrated in FIG. 27, the number of defects in Example 2 is reduced to 1/30 of the number of defects in Example 1. As a result, it is found that according to the second embodiment, the erroneous writing may be further reduced.

It is confirmed that writing characteristics of the semiconductor device in Example 2 are similar to those of the semiconductor device in Example 1.

Modified Embodiment

The present invention is not limited to the above embodiments, and thus may be modified variously.

In the above embodiments, for example, the concrete values are described as the conditions of the ion implantation for forming the first to third impurity diffusion layers $36a_1$, $36a_2$, and $36a_3$, the impurity diffusion layers as the pocket area 35 and the like, but the ion implanting conditions are not limited to the above-mentioned values. Further, the dopant impurities used for the ion implantation are not limited concretely to the above impurities, and various dopant impurities may be used.

In the above embodiments, the concrete values have been described as the voltages of the respective sections at the time of reading, writing and erasing information, but the voltages are not limited to the above-mentioned values. It is desirable that the voltages of the respective sections at the time of reading, writing, and erasing information are suitably set according to the structures and generations of the semiconductor device.

The semiconductor devices described in the above embodiments may be suitably used in various electric devices, transport equipment, and the like.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

The invention claimed is:

1. A method for fabricating a semiconductor device, comprising:
    forming a first conductive film over a semiconductor substrate via a first insulating film;
    forming a second conductive film over the first conductive film via a second insulating film;
    patterning the first conductive film, the second insulating film, and the second conductive film so as to form a laminated body having a floating gate of the first conductive film and a control gate of the second conductive film formed over the floating gate via the second insulating film, and to form a select gate of the first conductive film in parallel with the floating gate;
    forming a first P-type impurity diffusion layer in the semiconductor substrate on an area to be a source of a memory cell transistor having the floating gate and the control gate, so as to extend into an area below the floating gate;
    forming a first N-type impurity diffusion layer which is deeper than the first P-type impurity diffusion layer, in the semiconductor substrate on the area to be the source of the memory cell;
    forming a first side wall insulating film on a side wall portion of the laminated body and a side wall portion of the select gate;
    patterning the first conductive film over a peripheral circuit area of the semiconductor substrate to form a gate electrode of a high-withstand voltage transistor;
    forming a second N-type impurity diffusion layer in the semiconductor substrate on the area to be the source of the memory cell transistor and an N-type low-density diffusion layer in the semiconductor substrate on both sides of the gate electrode of a high-withstand voltage transistor, the second N-type impurity diffusion layer is deeper than the first N-type impurity diffusion layer, a width of the second N-type impurity diffusion layer is narrower than a width of the first N-type impurity diffusion layer;
    forming a second side wall insulating film on the side wall portion of the laminated body and the side wall portion of the select gate which are formed with the first side wall insulating film; and
    forming a third N-type impurity diffusion layer in the second N-type impurity diffusion layer, which is shallower than the second N-type impurity diffusion layer, a width of the third N-type impurity diffusion layer is narrower than the width of the second N-type impurity diffusion layer, and an impurity concentration of the third N-type impurity diffusion layer is higher than an impurity concentration of the second N-type impurity diffusion layer.

2. The method according to claim 1, wherein
    the end portion of the first N-type impurity diffusion layer on the floating gate side is positioned within an area below the floating gate.

3. The method according to claim 1, wherein
    the impurity concentration in a portion of the second N-type impurity diffusion layer deeper than the third N-type impurity diffusion layer is lower than a impurity concentration in the end portion of the first N-type impurity diffusion layer on the floating gate side.

4. The method according to claim 1, wherein when forming the first N-type impurity diffusion layer, a fifth N-type impurity diffusion layer is formed in the semiconductor substrate on an area to be a drain of the memory cell transistor and a source of the selecting transistor having the select gate, and a sixth N-type impurity diffusion layer is formed in the semiconductor substrate on an area to be a drain of the selecting transistor together with the first N-type impurity diffusion layer.

\* \* \* \* \*